(12) United States Patent
Tanaka et al.

(10) Patent No.: US 8,932,432 B2
(45) Date of Patent: Jan. 13, 2015

(54) SUBSTRATE SEPARATING APPARATUS, LOAD LOCK APPARATUS, SUBSTRATE BONDING APPARATUS, SUBSTRATE SEPARATING METHOD, AND MANUFACTURING METHOD OF A SEMICONDUCTOR APPARATUS

(75) Inventors: Keiichi Tanaka, Saitama (JP); Masahiro Yoshihashi, Abiko (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/594,151

(22) Filed: Aug. 24, 2012

(65) Prior Publication Data
US 2013/0048222 A1 Feb. 28, 2013

Related U.S. Application Data

(63) Continuation of application No. PCT/JP2011/001097, filed on Feb. 25, 2011.

(30) Foreign Application Priority Data

Feb. 25, 2010 (JP) ................................. 2010-040104

(51) Int. Cl.
  *B32B 38/10* (2006.01)
  *H01L 21/67* (2006.01)
(52) U.S. Cl.
  CPC ....... *H01L 21/67092* (2013.01); *Y10S 156/932* (2013.01); *Y10S 156/943* (2013.01)
  USPC ........... 156/707; 156/714; 156/716; 156/758; 156/765; 156/932; 156/943; 156/718; 156/763; 438/458

(58) Field of Classification Search
  USPC ......... 156/706, 707, 714, 716, 755, 758, 765, 156/930, 932, 941, 943, 718, 763; 438/458
  See application file for complete search history.

(56) References Cited

U.S. PATENT DOCUMENTS 5,240,546 A * 8/1993 Shiga ............................ 156/378
5,447,596 A * 9/1995 Hayase ......................... 156/750
(Continued)

FOREIGN PATENT DOCUMENTS

JP 2002-353081 A 12/2002
JP 2003-17669 A 1/2003
(Continued)

OTHER PUBLICATIONS

PCT/JP2011/001097—Notification of Transmittal of Trasnslation of the International Preliminary Report on Patentability (Chapter I or Chapter II).

(Continued)

*Primary Examiner* — Mark A Osele
(74) *Attorney, Agent, or Firm* — Finnegan, Henderson, Farabow, Garrett & Dunner, LLP

(57) ABSTRACT

A substrate separating method includes: holding, in a predetermined position, a substrate sandwiched between a first holder and a second holder opposed to each other; and relatively moving the first holder and the second holder while the substrate is held in the predetermined position. In holding the substrate, the substrate may be held in the predetermined position by effecting a pressurizing force or a suction force onto the substrate. Also in holding the substrate, the substrate may be held in contact with one of the first holder and the second holder.

37 Claims, 56 Drawing Sheets

(56) References Cited

U.S. PATENT DOCUMENTS

| | | | |
|---|---|---|---|
| 6,092,578 A * | 7/2000 | Machida et al. | 156/358 |
| 6,682,990 B1 * | 1/2004 | Iwane et al. | 438/458 |
| 6,833,312 B2 | 12/2004 | Yanagita et al. | |
| 7,014,415 B2 * | 3/2006 | Yoshizawa | 414/797.5 |
| 8,245,754 B2 * | 8/2012 | Fujita et al. | 156/764 |
| 8,334,191 B2 * | 12/2012 | Zuniga et al. | 438/455 |
| 8,360,129 B2 * | 1/2013 | Ebata et al. | 156/764 |
| 2005/0205205 A1 * | 9/2005 | Kratzer et al. | 156/344 |
| 2009/0114348 A1 * | 5/2009 | Hwang | 156/536 |
| 2009/0314430 A1 * | 12/2009 | Nakamura | 156/344 |
| 2009/0314438 A1 * | 12/2009 | Iwata et al. | 156/584 |
| 2010/0139836 A1 | 6/2010 | Horikoshi | |
| 2012/0216961 A1 * | 8/2012 | Tsai et al. | 156/707 |

FOREIGN PATENT DOCUMENTS

| | | | |
|---|---|---|---|
| JP | 2005-251972 A | | 9/2005 |
| JP | 2007158114 A | * | 6/2007 |
| JP | 2009-267043 A | | 11/2009 |
| WO | WO 2009-022457 A1 | | 2/2009 |

OTHER PUBLICATIONS

PCT/JP2011/001097—Written Opinion of the International Searching Authority.

* cited by examiner

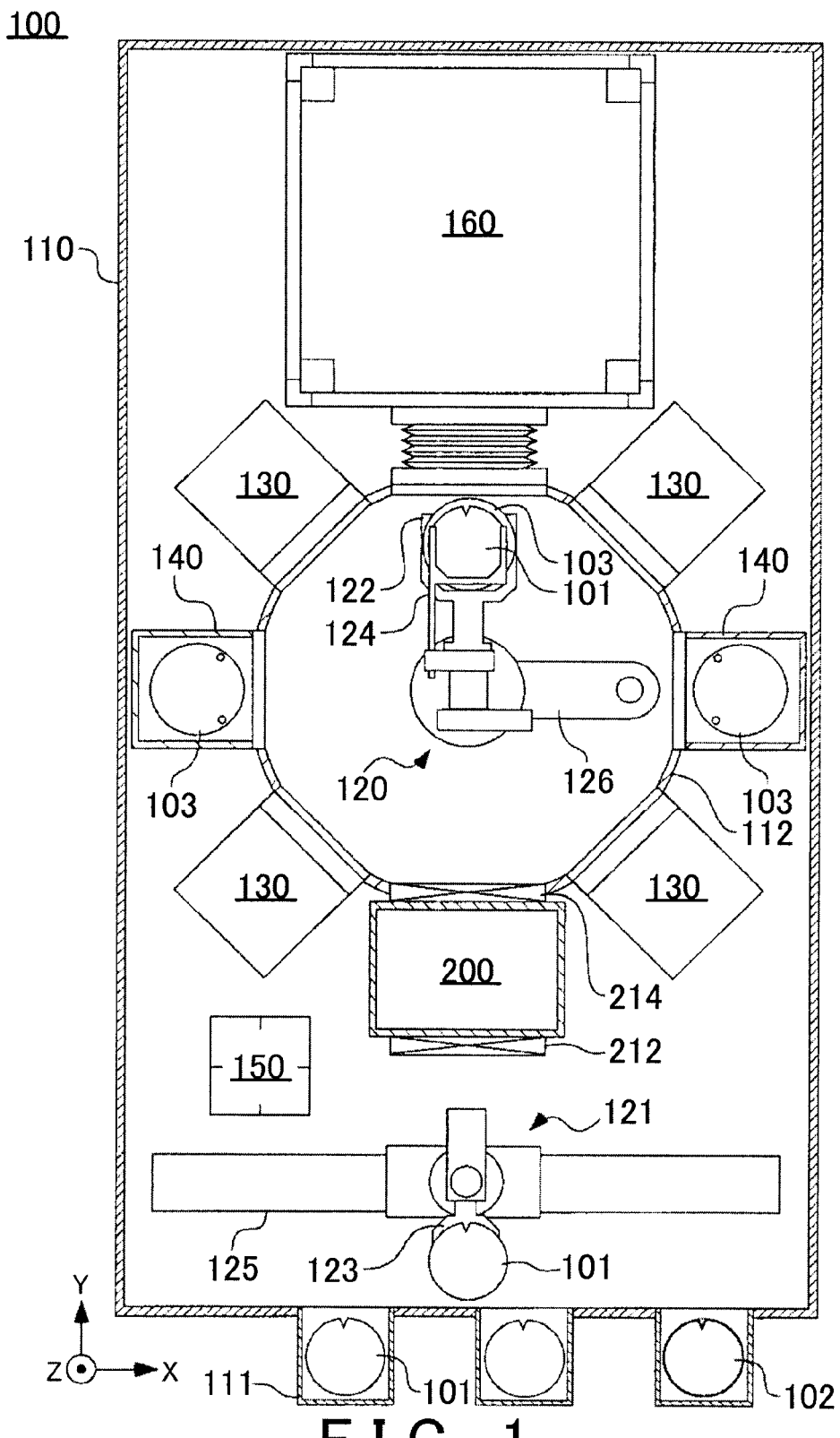
F I G. 1

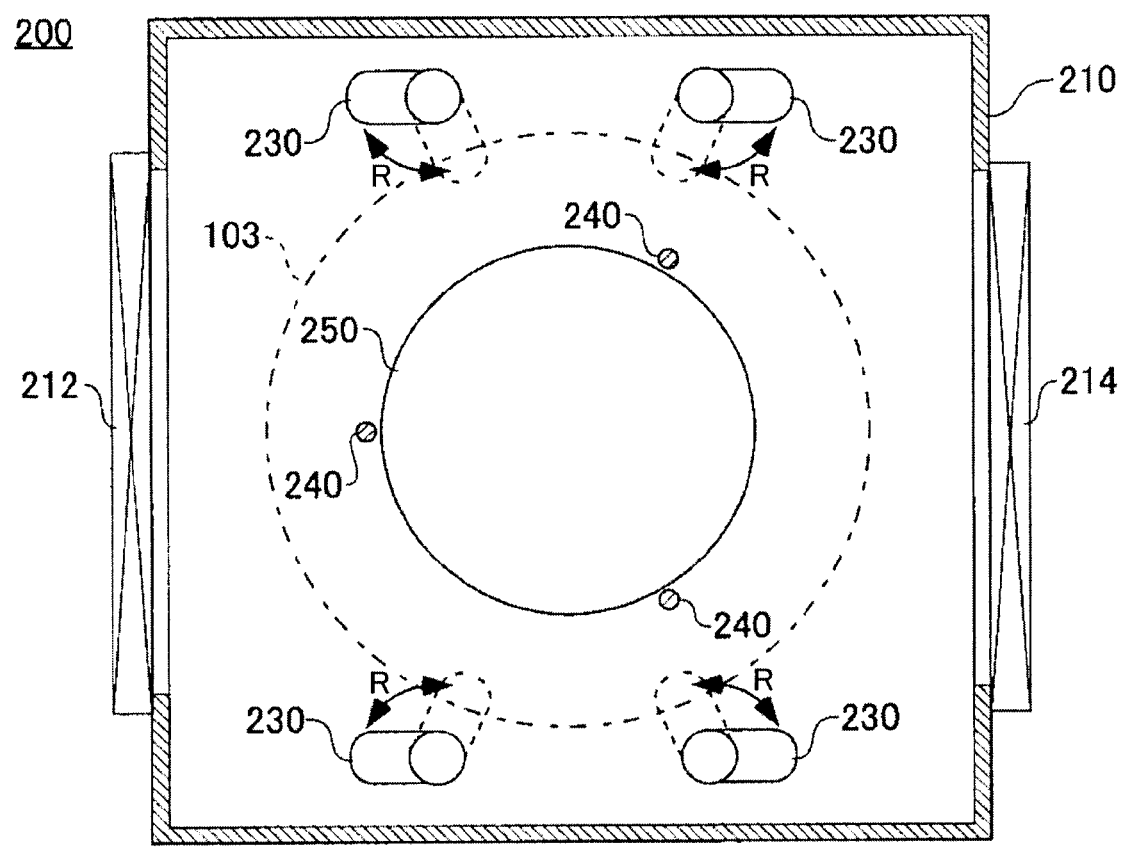
F I G. 12

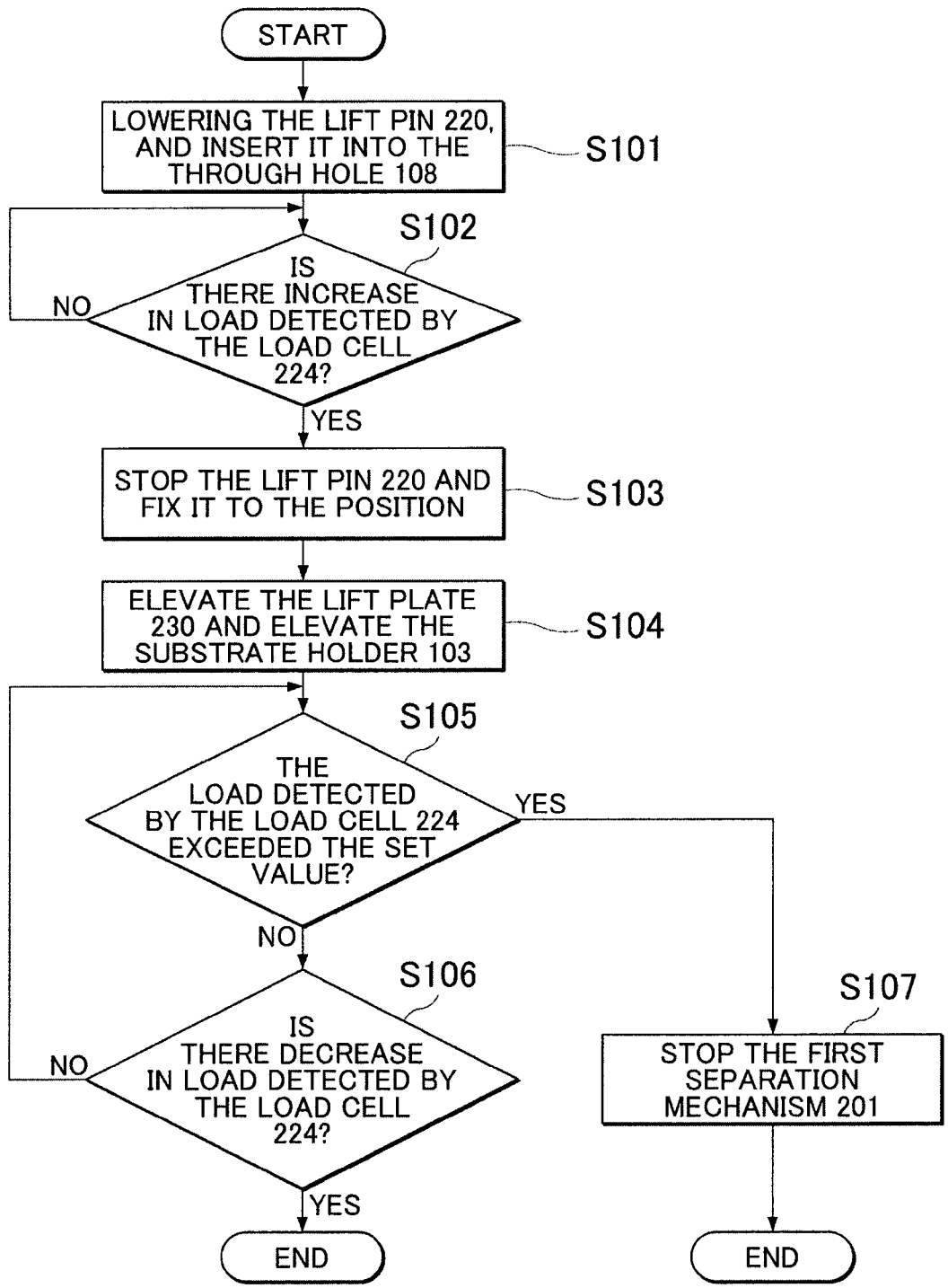
F I G . 13

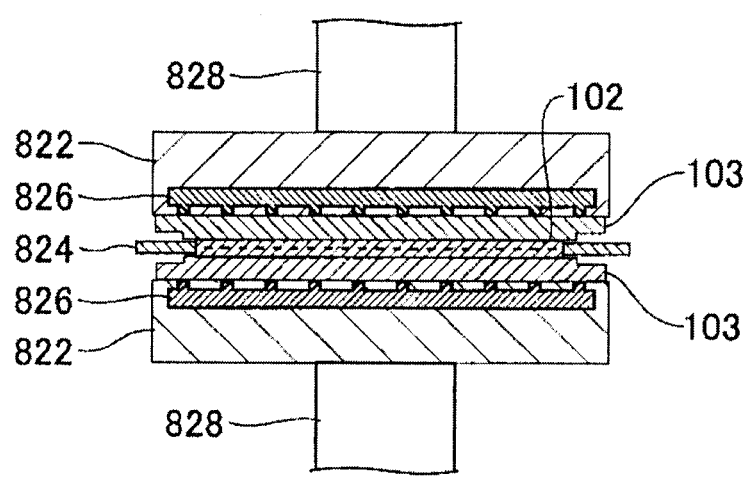
F I G . 51

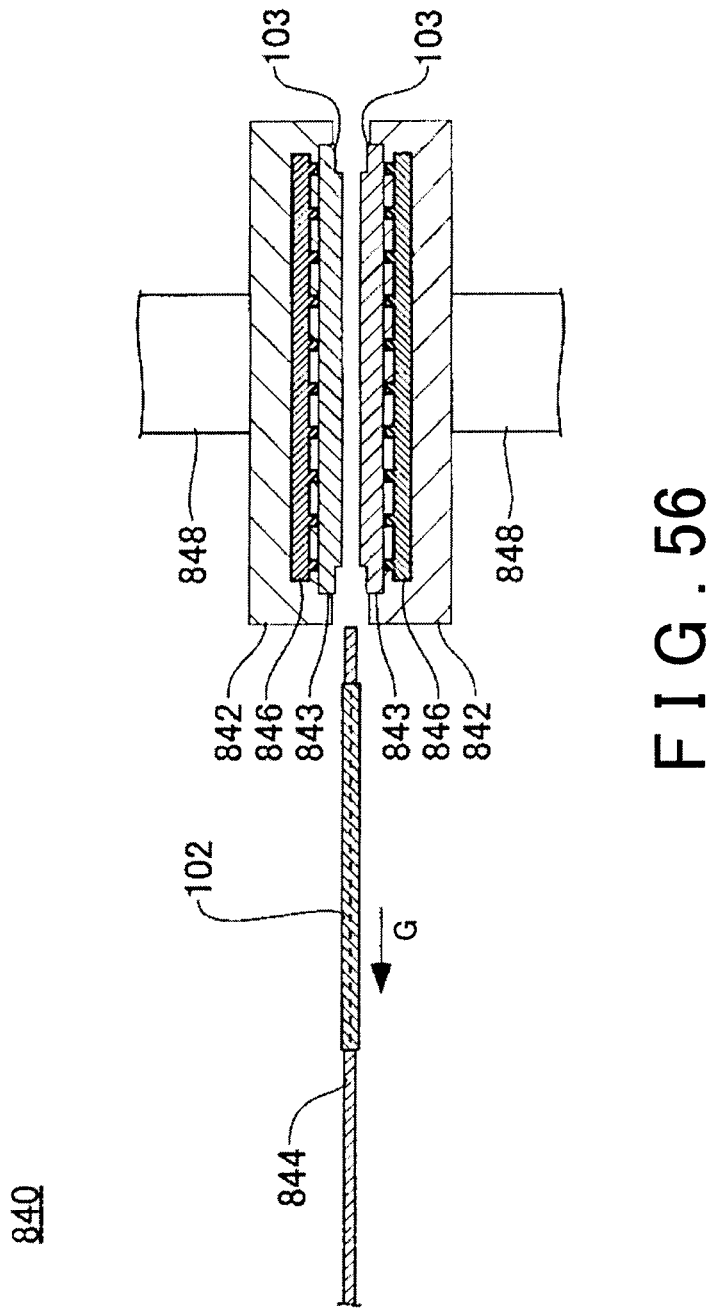

SUBSTRATE SEPARATING APPARATUS, LOAD LOCK APPARATUS, SUBSTRATE BONDING APPARATUS, SUBSTRATE SEPARATING METHOD, AND MANUFACTURING METHOD OF A SEMICONDUCTOR APPARATUS

TECHNICAL FIELD

The contents of the following Japanese and International patent applications are incorporated herein by reference:
No. 2010-040104 filed in JP on Feb. 25, 2010, and
No. PCT/JP2011/001097 on Feb. 25, 2011.

The present invention relates to a substrate separating apparatus, a load lock apparatus, a substrate bonding apparatus, and a substrate separating method.

BACKGROUND ART

Because of its fragility, a substrate such as a semiconductor wafer should be treated in the state held by a protective substrate holder.

Patent Document 1: Japanese Patent Application Publication No. 2005-251972

DISCLOSURE OF THE INVENTION

Problems to be Solved by the Invention

However, when pressuring a pair of substrate holders sandwiching substrates therebetween during the manufacturing process of a laminated substrate, the substrates often stick to one of the pair of substrate holders, and cannot be taken out even by opening the pair of substrate holders.

Means for Solving the Problems

Therefore, it is the first object of an aspect of the innovations herein to provide a substrate separating method including: holding, in a predetermined position, a substrate sandwiched between a first holder and a second holder opposed to each other; and relatively moving the first holder and the second holder while the substrate is held in the predetermined position.

Therefore, it is the second object of an aspect of the innovations herein to provide a substrate separating apparatus including: a substrate holding section that holds, in a predetermined position, a substrate sandwiched between a first holder and a second holder opposed to each other; and a holder moving section that relatively moves the first holder and the second holder while the substrate is held in the predetermined position by the substrate holding section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 1 is a plan view of a substrate bonding apparatus 100.
FIG. 12 is a horizontal sectional view of a load lock 200.
FIG. 13 is a flow showing an overview showing the operation of a first separating mechanism 201.

FIG. 51 is a sectional view schematically showing the structure of a separating apparatus 820.

FIG. 56 shows a separated laminating substrate 102.

BEST MODE FOR CARRYING OUT THE INVENTION

Figure 2:
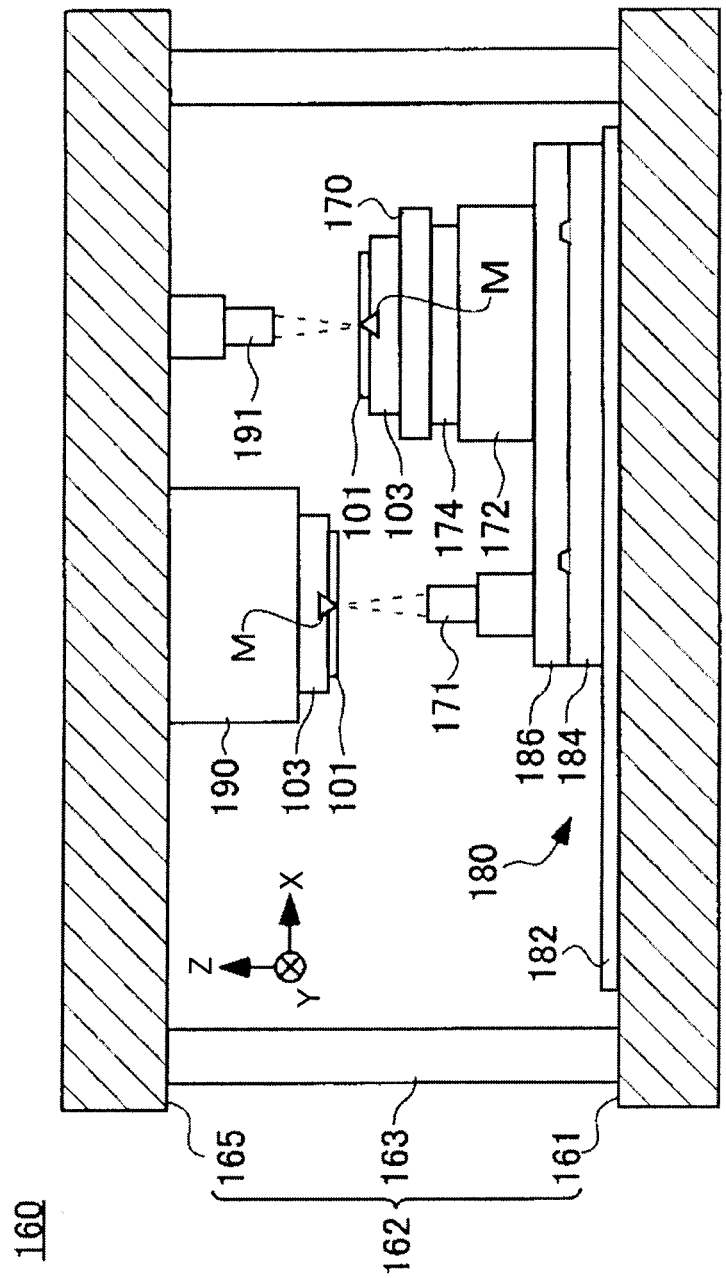
FIG. 2 is a longitudinal sectional view of an aligner 160.

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

FIG. 1 is a plan view schematically showing the overall structure of a substrate bonding apparatus 100. The substrate bonding apparatus 100 includes a casing 110, an environment loader 120 contained in the casing 110, an atmospheric loader 121, a pressurizing apparatus 130, a holder stocker 140, a pre-aligner 150, an aligner 160, and a load lock 200. Furthermore, a plurality of front opening unified pods (FOUP) 111 are mounted on the exterior of the casing 110.

The FOUPs 111 can be removed from the casing 110 independently from each other, and each FOUP 111 contains a plurality of substrates 101. The FOUP 111 enables a plurality of substrates 101 to be collectively loaded to the substrate bonding apparatus 100. In addition, the laminated substrate 102 produced by laminating substrates 101 can be collected by the FOUP 111 to enable collective transportation.

Note that the substrate 101 can be a semiconductor substrate such as a silicon single crystal substrate and a compound semiconductor substrate, as well as a glass substrate and so on. When the substrate 101 to be bonded contains a plurality of elements, the substrate 101 itself can be a laminated substrate 102 in which a plurality of substrates have already been bonded.

The casing 110 contains therein the environment loader 120, the pressurizing apparatus 130, the holder stocker 140, the pre-aligner 150, and the aligner 160. The inside of the casing 110 communicates with the atmosphere and is situated in the atmospheric environment.

The atmosphere loader 121 is provided to oppose the FOUP 111 inside the casing 110. The atmosphere loader 121 includes a folk 123 for mounting a substrate 101, and moves along the guide rail 125 provided along the FOUP 111 by carrying the substrate 101.

The pre-aligner 150 is provided in the vicinity of the atmosphere loader 121, and includes an alignment mechanism that puts more emphasis on the processing speed than on the alignment accuracy. The pre-aligner 150 makes adjustment so that the variation in mounting position of the substrate 101 with respect to the atmosphere loader 121 should fall within a predetermined range. This helps shorten the alignment time of the aligner 160 detailed later.

The load lock 200 is positioned between the atmosphere environment including the atmosphere loader 121 and the environment loader 120 positioned in the vacuum environment, and includes gate valves 212, 214 respectively facing the atmosphere environment and the vacuum environment. This facilitates exchange of the substrate 101 between the atmosphere environment and the vacuum environment without breaking the vacuum of the vacuum environment.

The load lock 200 is also positioned in the vicinity of the atmosphere loader 121. The atmosphere loader 121 carries the substrate 101 whose mounting position has been adjusted by the pre-aligner 150, into the load lock 200. In addition, the atmosphere loader 121 carries the laminated substrate 102 produced by the aligner 160 and the pressurizing apparatus 130 detailed later, out of the load lock 200.

The environment loader 120 transports any of the substrate 101, the laminated substrate 102, and the substrate holders 103, which are provided for the load lock 200 in the opposite side of the atmosphere loader 121. The environment loader 120 includes a folk 122, a falling prevention claw 124, and a folding arm 126.

The folding arm 126 supports the folk 122 and the falling prevention claw 124 at one end. The other end of the folding arm 126 is supported by the casing 110 to be rotatable. By combining the flexure and the rotation of it, the folding arm 126 moves the folk 122 in an arbitrary position.

The folk 122 maintains the substrate 101 or the substrate holder 103 mounted thereon, by suction. Accordingly, even when the folk 122 and the falling prevention claw 124 are reversed in the vertical direction, the environment loader 120 is able to maintain the substrate 101 or the substrate holders 103 below the folk 122.

The falling prevention claw 124 is held out below the substrate 101 or the substrate holder 103 maintained by the folk 122, when the folk 122 is reversed in the vertical direction. This arrangement prevents the substrate 101 or the substrate holder 103 from falling down. When the folk 122 does not reverse, the falling prevention claw 124 retreats to the position at which it does not obstruct the substrate 101 or the substrate holder 103 on the folk 122.

A plurality of pressurizing apparatuses 130, holder stockers 140, and an aligner 160 are provided around the environment loader 120. An air-tight wall 112 is used to seal between the pressurizing apparatuses 130, the holder stockers 140, the aligner 160, and the load lock 200. By exhausting the air-tight wall 112, the pressurizing apparatuses 130 and the aligner 160 can work under a vacuum environment.

The pressurizing apparatuses 130, the holder stockers 140, and the aligner 160 are placed to face against the environment loader 120. Accordingly, the environment loader 120 can carry the substrate 101, having been taken out from the load lock 200, into any of the pressurizing apparatuses 130, the holder stockers 140, and the aligner 160. The environment loader 120 can also carry the substrate 101 and the substrate holders 103, having been taken out from the pressurizing apparatuses 130, holder stockers 140, and the aligner 160, to the load lock 200.

The holder stocker 140 contains therein a plurality of substrate holders 103 for holding the substrate 101, and keeps them wait. The substrate holders 103 are taken out by the environment loader 120 one by one, with each substrate holder holding one substrate 101. Inside the substrate bonding apparatus 100, a substrate holder 103 is treated integrally with a substrate 101 it holds. This arrangement helps protects a thin and fragile substrate 101 as well as making it easy to deal with the substrate 101 inside the substrate bonding apparatus 100.

When the laminated substrate 102 is carried out from the vacuum environment, the substrate holder 103 is separated from the laminated substrate 102 and returned to the holder stocker 140. Therefore, the substrate holder 103 is retained in the vacuum environment at least while the substrate bonding apparatus 100 is in operation.

The aligner 160 is overlapped after aligning, to each other, a pair of substrates 101, both retained by the substrate holder 103. The alignment accuracy of the aligner 160 is high, and is required of the accuracy of submicrons when attempting to align a semiconductor substrate on which an element has been formed.

The pressurizing apparatus 130 pressurizes a pair of substrates 101 aligned and overlapped by the aligner 160, thereby bonding the substrates 101 each other. Accordingly, the substrates 101 will be a laminated substrate 102 eternally. Thus produced laminated substrate 102 is carried onto the load lock 200 by means of the environment loader 120, and then carried out from the load lock 200 by the atmosphere loader 121 and collected by the FOUP 111.

FIG. 2 is a longitudinal sectional view of an aligner 160. The aligner 160 includes a frame 162, a driving section 180 provided inside the frame 162, as well as a lower stage 170 and an upper stage 190.

The frame 162 includes a bottom plate 161 and a top plate 165, each of which is horizontal and parallel to the other, and a plurality of supporting columns 163 for coupling the bottom plate 161 to the top plate 165. All the bottom plate 161, the supporting columns 163, and the top plate 165 have high rigidity, to resist deformation even when subject to the reactive force exerted by operation of the aligner 160.

On the upper surface of the bottom plate 161 of the aligner 160, a driving section 180 including the X driving section 184 and the Y driving section 186 laminated sequentially is provided. The X driving section 184 moves in the X direction by being guided by the guide rail 182 fixed to the bottom plate 161. The Y driving section 186 moves in the Y direction on the X driving section 184. A lower stage 170 is mounted on the Y driving section 186. By doing so, the driving section 180 can move the lower stage 170 to anywhere on the X-Y plane.

A suction mechanism such as vacuum suction, electrostatic suction, or the like is provided on the upper surface of the lower stage 170, to suction the substrate holder 103 mounted thereon to hold it. The substrate holder 103 also holds the substrate 101 on its upper surface. The substrate holder 103 also includes a suction mechanism such as electrostatic suction. Consequently, the substrate 101 held by the substrate holder 103 can be fixed to the lower stage 170.

The microscope 171 is mounted to the Y driving section 186 together with the lower stage 170, and moves in the X direction and the Y direction together with the lower stage 170. Since the relative position of the microscope 171 and the lower stage 170 can be known in advance accurately, the relative position of the object facing against the lower stage 170 to the lower stage 170 can be detected with accuracy using the microscope 171.

The upper stage 190 and the microscope 191 suspend from the lower surface of the top plate 165. The upper stage 190 and the microscope 191 are fixed and immobile with respect to the top plate 165.

The upper stage 190 has a suction mechanism such as vacuum suction, electrostatic suction on its horizontal lower surface, to hold the substrate holder 103. The substrate 101 is held by suction by the substrate holder 103. Accordingly, the substrate 101 held by the upper stage 190 faces against the substrate 101 held by the lower stage 170.

Since the relative position of the upper stage 190 and the microscope 191 can be known in advance accurately, the relative position of the object facing against the upper stage 190 can be detected with accuracy using the microscope 191.

In the aligner 160 in the drawing, the lower microscope 171 detects the position of the alignment mark M of the substrate 101 held by the upper stage 190. On the other hand, the upper microscope 191 detects the position of the alignment mark M of the substrate 101 held on the lower stage 170. Accordingly, the relative position between the substrates 101 can be accurately detected.

Note that the alignment mark M shown by a triangular sign in the drawing may alternatively be a specific pattern formed on the substrate 101. It is also possible to use an element or the like formed in the substrate 101 as the alignment mark.

Figure 3:
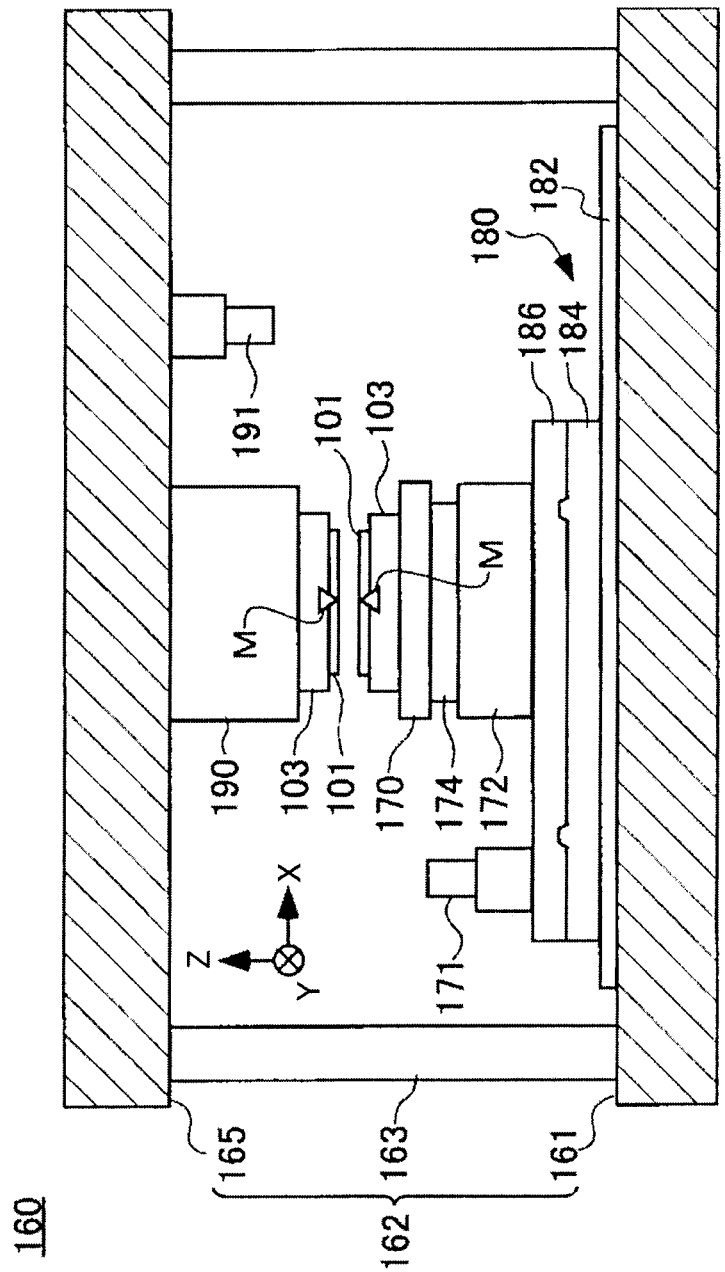
FIG. 3 is a longitudinal sectional view of an aligner 160.

FIG. 3 shows an operation of the aligner 160. Note that the microscopes 171, 191 have already detected the relative position between the substrates 101 by detecting the positions of the alignment marks M for the substrates 101 opposing each other. Therefore, so as to eliminate displacement in relative position between the substrates 101, the X driving section 184 and the Y driving section 186 are used to move the lower stage 170, thereby causing the pair of substrates 101 to oppose each other accurately. Subsequently, a cylinder 172 and a piston 174 are used to raise the lower stage 170, so as to conduct provisional coupling of the pair of already aligned substrates 101 by keeping them in direct contact with each other.

Figure 4:
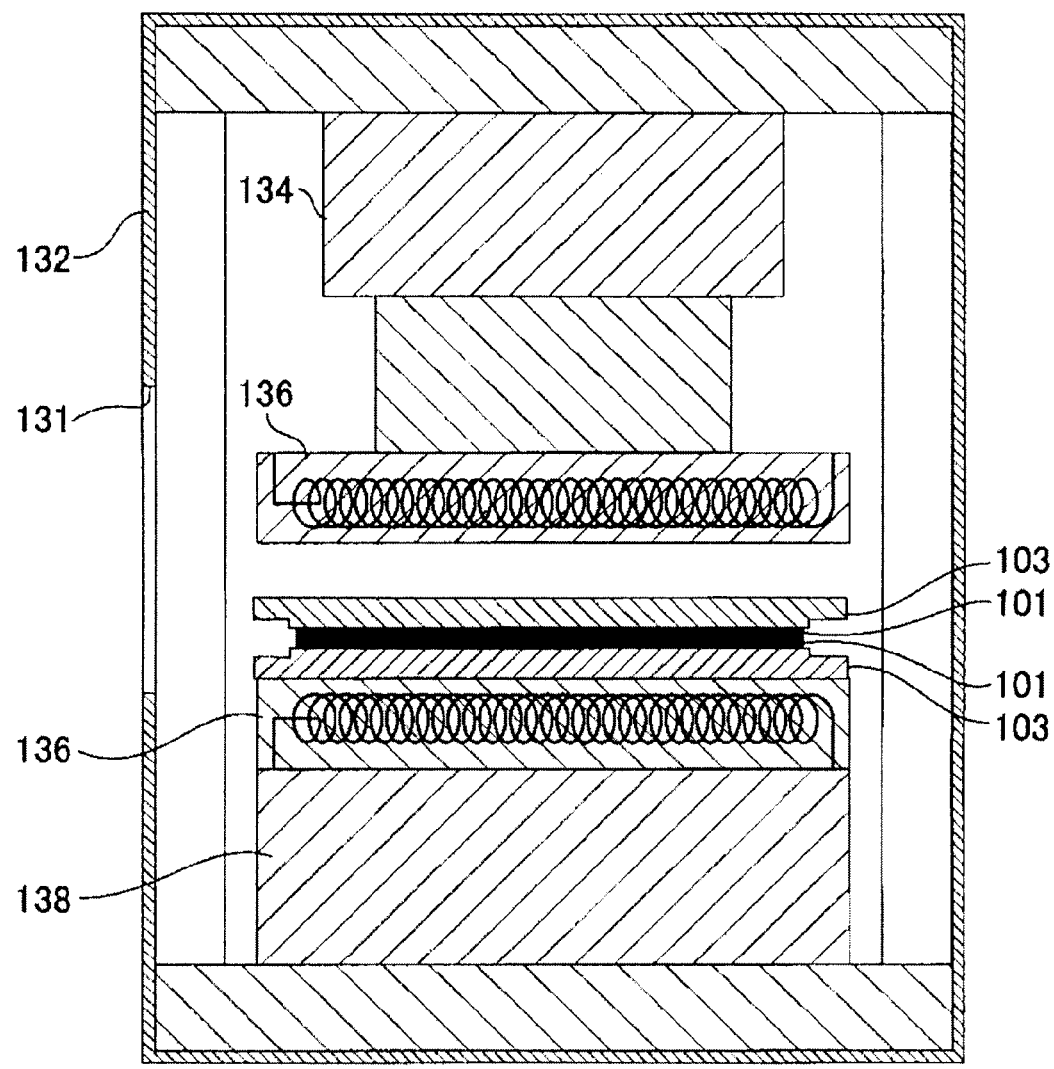
FIG. 4 is a longitudinal sectional view of a pressurizing apparatus 130.

FIG. 4 is a longitudinal sectional view of a pressurizing apparatus 130. The pressurizing apparatus 130 includes a press platen 138 and a heating plate 136 sequentially stacked from the bottom of the casing 132, and a pressurizing section 134 and a heating plate 136 hung from the ceiling surface of the casing 132. Each of the heating plates 136 includes therein a heater. In addition, one side surface of the casing 132 is provided with an insertion inlet 131. The insertion inlet 131 communicates with the load lock 200 detailed later, via the gate valve 214.

The substrates 101 already aligned and overlapped to each other are carried into the pressurizing apparatus 130, in the state sandwiched between the pair of substrate holders 103. The substrates 101 and the substrate holders 103 carried in are mounted on the upper surface of the heating plate 136 of the press platen 138.

The pressurizing apparatus 130 presses down the upper heating plate 136, by lowering the pressurizing section 134 as well as raising the temperature of the heating plate 136. Accordingly, the substrates 101 and the substrate holders 103, sandwiched between the heating plates 136, are heated and pressurized, to make eternal bonding of the substrates 101. As a result, the substrates 101 will be a laminated substrate 102.

Note that the pressurizing apparatus 130 may be further equipped with a cooling section for cooling the substrates 101 after subjected to heating and pressurizing processing.

According to this treatment, the substrates 101 can be carried out in the state cooled down to some extent, if not to the level of room temperatures, and immediately to the FOUP 111.

When the heating temperature of the heating plate 136 is high, the surfaces of the substrates 101 may occasionally cause chemical reaction with the atmosphere. For this reason, the load lock 200 is provided for the insertion inlet 131 of the pressurizing apparatus 130, for creating a vacuum environment in the casing 132.

Figure 5:
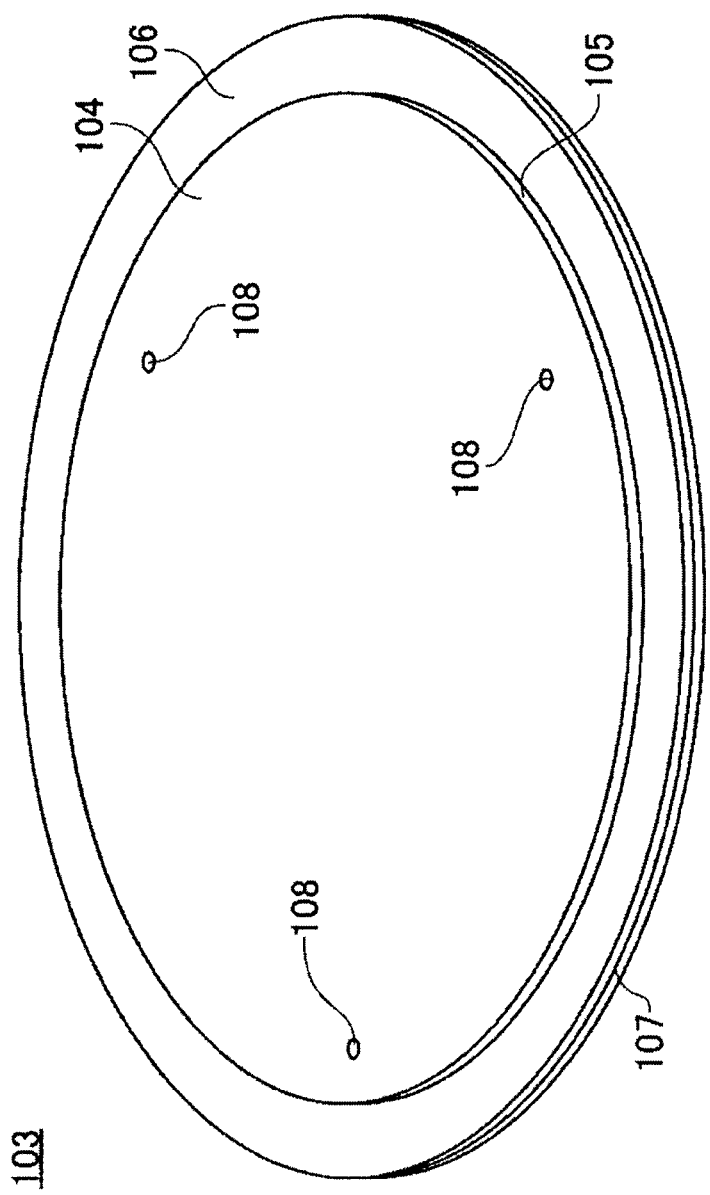
FIG. 5 is a perspective view of looking down a substrate holder 103.

FIG. 5 is a perspective view of looking down a substrate holder 103. The substrate holder 103 includes a holding surface 104, a flange section 106, and through holes 108.

The overall shape of the substrate holder 103 is a disk, and includes a flat holding surface 104 in its center, for holding a substrate 101. The flange section 106 circumscribes and is adjacent to the holding surface 104. There is formed a step 105 between the holding surface 104 and the flange section 106; the holding surface 104 is in a position slightly higher than the flange section 106.

A through hole 108 is provided to penetrate from the front surface to the rear surface of a substrate holder 103, and has an inner diameter which allows insertion of a lift pin detailed later. Three or more through holes 108 are provided at a constant interval thereamong, on a circle concentric to the holding surface 104. A groove 107 is provided on the side surface of the circumference of the flange section 106.

Figure 6:
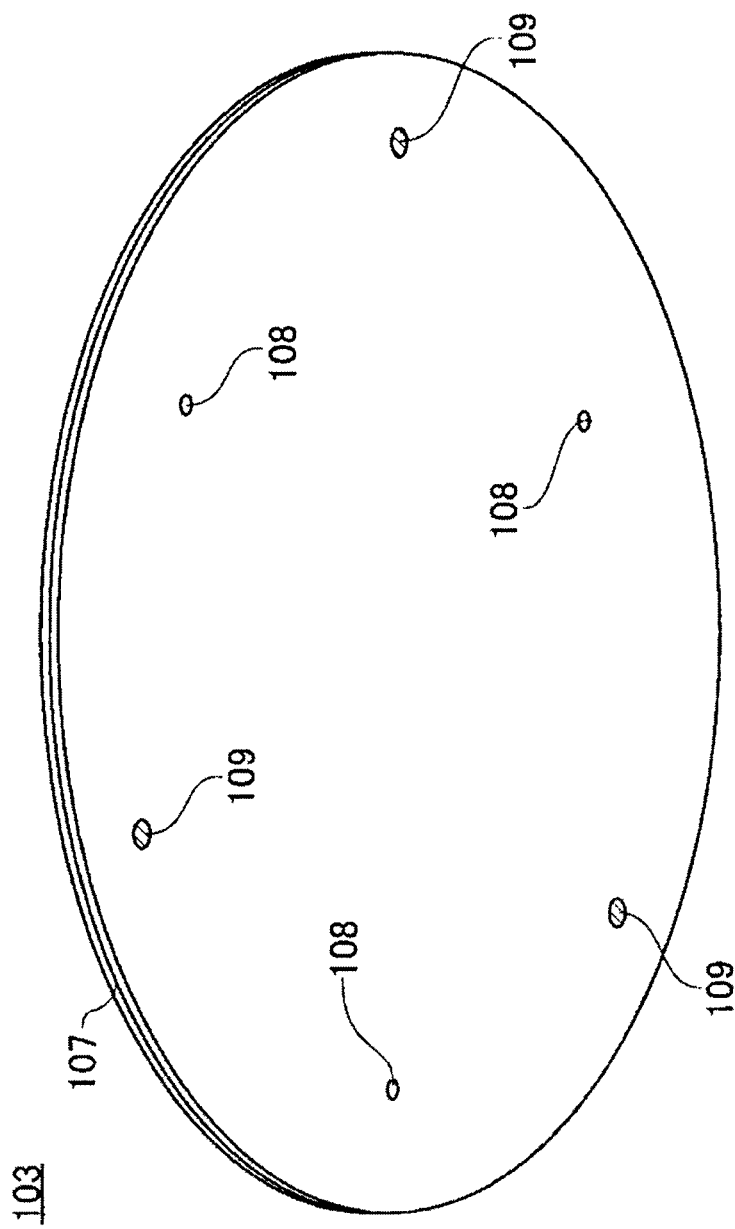
FIG. 6 is a perspective view of looking up a substrate holder 103.

FIG. 6 is a perspective view of looking up a substrate holder 103. Respective ends of the through holes 108 as well as power supply terminals 109 exist on the lower surface of the substrate holder 103.

The power supply terminal 109 has a surface common to the lower surface of the substrate holder 103, and is connected to the internal electrode buried inside the substrate holder 103. The power supply terminal 109 conveys a voltage applied from outside to the electrode buried in the substrate holder 103, thereby forming an electrostatic chuck on the holding surface 104 of the substrate holder 103, for suctioning the substrate 101.

There may be a plurality of internal electrodes formed in a single substrate holder 103, and a plurality of power supply terminals corresponding in number to the internal electrodes. The substrate holder 103 is integrally formed using ceramics, metal, or the like having high rigidity.

FIG. 7, FIG. 8, FIG. 9, FIG. 10 are diagrams showing state transition of the substrate 101 in the substrate boding apparatus 100. The following explains the operation of the substrate bonding apparatus 100 by referring to these drawings.

The substrates 101 to be bonded are mounted to the substrate bonding apparatus 100 in the state contained in the FOUP 111. Firstly in the substrate bonding apparatus 100, the environment loader 120 mounts, to the pre-aligner 150, the substrate holder 103 taken out from the holder stocker 140.

In the pre-aligner 150, the mounting position of the substrate holder 103 to the environment loader 120 is adjusted. Having adjusted its mounting position to the environment loader 120, the substrate holder 103 is carried in the aligner 160, to be held by the upper stage 190 or by the lower stage 170.

Next, the environment loader 120 transfers the substrates 101 taken out one by one from the FOUP 111, to the pre-aligner 150. In the pre-aligner 150, the substrate 101 is also adjusted its mounting position with respect to the environment loader 120.

After being adjusted its mounting position to the environment loader 120, the substrate 101 is carried in the aligner 160 by means of the environment loader 120, and then is held by the substrate holder 103 held by the upper stage 190 or the lower stage 170. Since the pre-aligner 150 has already adjusted the mounting positions respectively of the substrate 101 and the substrate holder 103 with respect to the environment loader 120, the substrate 101 can be mounted to the substrate holder 103 relatively accurately. The substrate 101 mounted on the substrate holder 103 is held by the substrate holder 103 by electrostatic suction.

Figure 7:
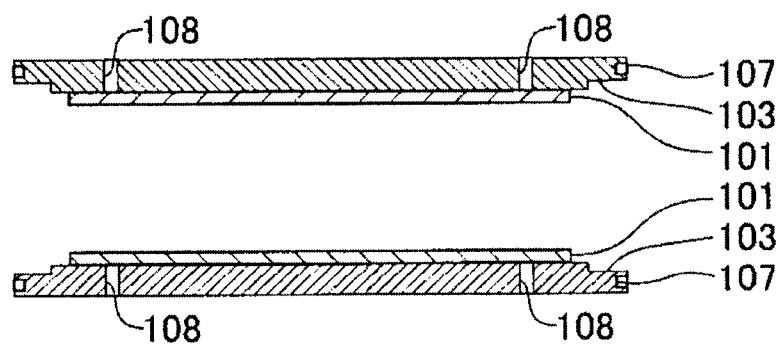
FIG. 7 is a sectional view showing a state transition of a substrate 101.
Figure 8:
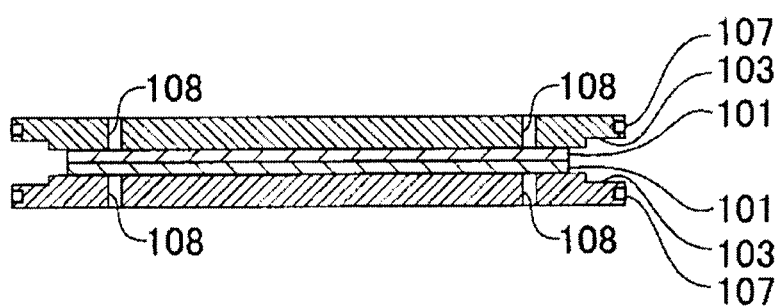
FIG. 8 is a sectional view showing a state transition of a substrate 101.

Eventually as shown in FIG. 7, the substrates 101 opposing each other held by the substrate holders 103 are prepared in the aligner 160. Next, as shown in FIG. 8, the substrate holders 103 and the substrates 101 aligned and provisionally coupled to each other by the aligner 160 will result in a state mutually stacked to each other.

Figure 9:
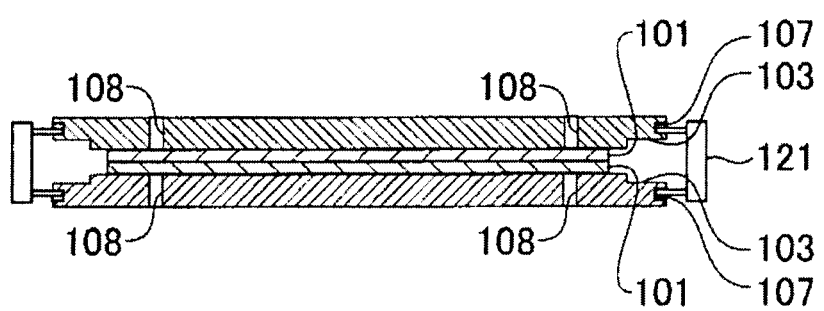
FIG. 9 is a sectional view showing a state transition of a substrate 101.
Figure 10:
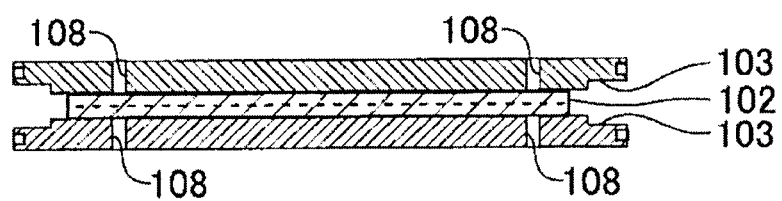
FIG. 10 is a sectional view showing a state transition of a substrate 101.

In this step, the pair of substrates 101 provisionally coupled are not bonded to each other. Therefore, as shown in FIG. 9, a clip 129 is fit to the grooves 107 of the substrate holders 130. Accordingly, the pair of substrate holders 103 sandwiching the aligned substrates 101 therebetween can be collectively transported, while retaining the alignment by the aligner 160.

The environment loader 120 carries, into the pressurizing apparatus 130, the substrate holders 103 sandwiching the pair of substrates 101 provisionally coupled. The pair of substrates 101 are heated and pressurized by the pressurizing apparatus 130, to be eternally bonded to each other (i.e. the laminated substrate 102 of FIG. 10). The laminated substrate 102 is separated from the substrate holder 103, and carried by the environment loader 120 to the FOUP 111 to be collected there. The substrate holders 103 are carried to the holder stocker 140, and waits for the next usage.

When the substrates 101 sandwiched between the substrate holders 103 are pressurized in the pressurizing apparatus 130, the laminated substarte 102 and the substrate holders 103 may partially fix to each other, due to the soot and dust or welding inevitably exiting between the substrates 101 and the substrate holders 103. With this in view, when taking out the laminated substrate 102, aggressive separation from the substrate holders 103 is required.

When the laminated substrate 102 is strongly attached to the substrate holders 103, however, when the laminated substrate 102 and the substrate holders 103 are attempted to be separated hard, the bonding of the laminated substrate 102 may come off, or the laminated substrate 102 may undergo cracking. In view of this, it is desirable not to exert excessive stress onto the laminated substrate 102 when attempting to separate the laminated substrate 102 from the substrate holder 103.

Figure 11:
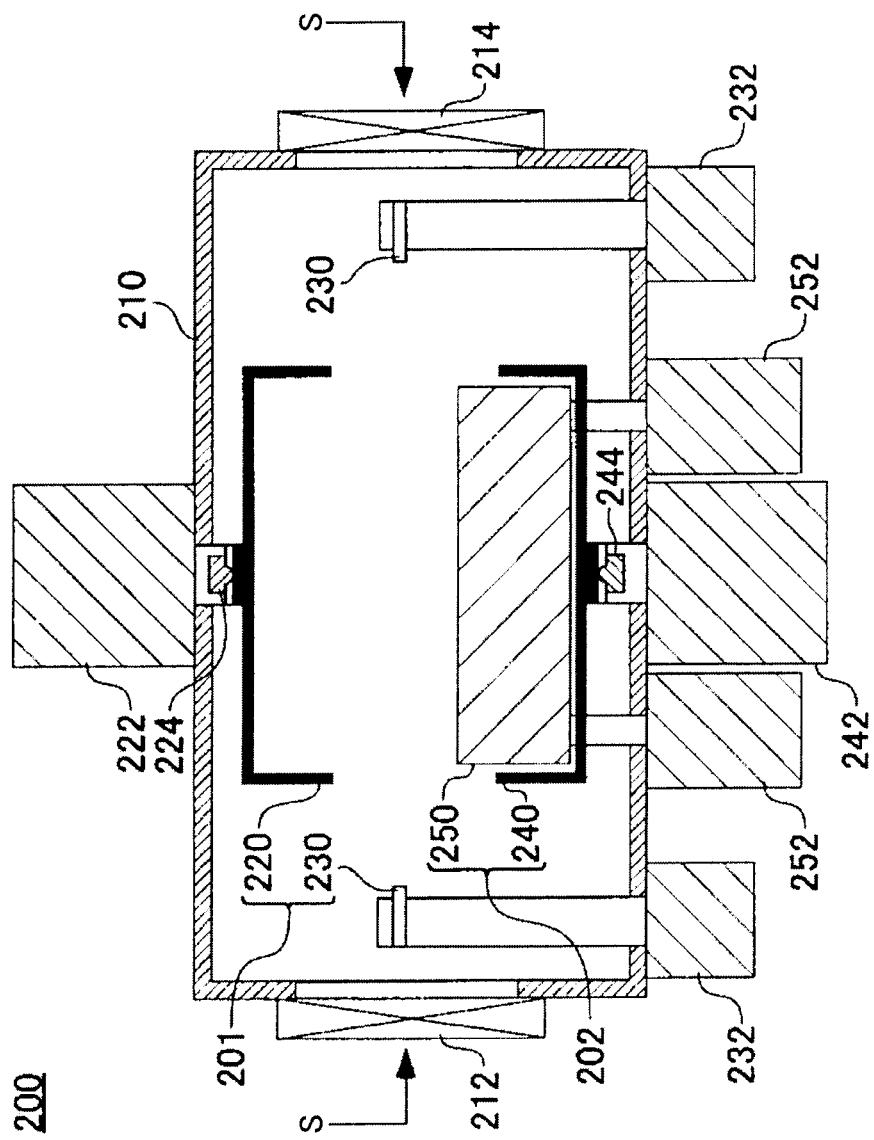
FIG. 11 is a longitudinal sectional view of a load lock 200.

FIG. 11 is a longitudinal sectional view of the structure of the load lock 200. The load lock 200 includes a casing 210, a pair of gate valves 212, 214, as well as a first separation mechanism 201 and a second separation mechanism 202.

The gate valves 212, 214 are provided on the side surfaces of the casing 210 opposed to each other. The gate valves 212 opens and closes facing the atmosphere loader 121. The gate valve 214 opens and closes facing the environment loader 120. The gate valves 212, 214 close the casing 210 airtight. Please note that the casing 210 can be exhausted to create a vacuum environment, or can be supplied air to create an atmosphere environment.

In an example, by closing the gate valve 214 and opening the gate valve 212, the substrate 101 can be carried into the load lock 200 without breaking the vacuum environment in which the environment loader 120 is placed. In addition, by opening the gate valve 214 after creating a vacuum environment by exhausting the casing 210 while keeping both of the gate valves 212, 214 closed, the substrate 101 can be carried into the vacuum environment without breaking the vacuum environment in which the environment loader 120 is placed.

The laminated substrate 102 can also be carried out by keeping the vacuum environment by conducting the above procedures in the reverse order. In addition, the substrates 101 or the laminated substrate 102 and the substrate holders 103 are placed on the table 250 inside the load lock 200.

The first separation mechanism 201 includes a lift pin 220 and a lift plate 230. The lift pin 220 suspends from the actuator 222, and raises and lowers as the actuator 222 is operated. A load cell 224 is placed between the lift pin 220 and the actuator 222, to detect the load that the lift pin 220 is subject to.

The load cell 224 can be replaced by the circuit detecting the increase/decrease of the driving load of the actuator 222. The lift plate 230 is supported by the actuator 232. The lift plate 230 rotates around the vertical rotation axis, as well as raising and lowering according to the operation of the actuator 232.

The second separation mechanism 202 includes a lift pin 240 and a table 250. The lift pin 240 is supported by the actuator 242 from below, and raises and lowers in accordance with the operation of the actuator 242. A load cell 244 is placed between the lift pin 240 and the actuator 222, to detect the load that the lift pin 240 is subject to. The load cell 244 can be replaced by the circuit detecting the driving load of the actuator 222.

The table 250 is supported by the actuator 252 from below, and raises and lowers in accordance with the operation of the actuator 252. The table 250 includes a suction mechanism of suctioning the substrate holder 103 mounted on its upper surface, by means of electrostatic suction, vacuum suction, or the like.

FIG. 12 is a horizontal sectional view of a load lock 200 when cut at the horizontal plane shown by the arrow S in FIG. 11. Each lift pin 240 is provided at a position insertable into a through hole of the substrate holder 103. Although not shown in the drawings, the lift pins 220 are also provided at position insertable to the through holes of the substrate holder 103.

A plurality of lift plates 230 are provided to surround the table 250, at positions not obstructing carrying in and out of the substrate holder 103 with respect to the table 250. When rotated by operation of the actuator 232, the lift plate 230 moves between the position overlapped with the substrate holder 103 carried in and the position not interfering with the substrate holder 103, as shown in the arrow R in the drawing.

FIG. 13 is a flow showing the operation of a first separating mechanism 201 separating the laminated substrate 102 from the substrate holders 103. The laminated substrate 102 and a pair of substrate holders 103 sandwiching it are carried into the load lock 200, to cause it to be held by the table 250. Next, the actuator 232 is operated to insert the lift plate 230 below the substrate holder 103. In this state, the laminated substrate 102 is started to be separated from the upper substrate holder 103 by means of the first separation mechanism 201.

First, the actuator 222 is operated to lower the lift pin 220, to insert the lower end of the lift pin 220 to a through hole 108 of the upper substrate holder 103 (S101). Furthermore, while lowering the lift pin 220 using the actuator 222, the load onto the lift pin 220 is monitored using the load cell 224 (S 102).

When the load cell 224 does not detect any change in load (S102: NO), the lowering operation of the lift pin 220 is continued. When the tip of the lift pin 220 eventually reaches and is abut against the laminated substrate 102, the load detected by the load cell 224 increases (S102: YES), and therefore the actuator 222 is stopped to fix the lift pin 220 at the position (S 103).

Next, the actuator 232 is operated to raise the lift plate 230 (S 104). By raising the lift plate 230, the load of the lift pin 220 detected by the load cell 224 is monitored (S 105). When the load detected by the load cell 224 does not exceed the pre-set value (S105: NO), the operation of the actuator 232 is continued. Also when there is no decline in the load detected by the load cell 224 (S106: NO), the operation of the actuator 232 is continued to continue raising the lift plate 230.

When the load detected by the load cell 224 has exceeded the set value (S105: YES), it means that the laminated substrate 102 is fixed hard to the substrate holders 103, and so it becomes quite likely to cause wear and tear, or the peeling off of the laminated substrate 102 attributed to the excessive load. In such a case, the first separation mechanism 201 is stopped from continuing the separation process of the laminated substrate 102 from the substrate holders 103 (S 107).

When the laminated substrate 102 is separated from the substrate holders 103, the load onto the lift pin 220 drops. When the drop in the load of the lift pin 220 is detected by the load cell 224 (S 106: YES), the operation of the first separation mechanism 201 is stopped.

FIG. 14-FIG. 17 are diagrams showing how the first separation mechanism 201 performs the above-mentioned procedure, step by step. Note that the constituting elements common to the other diagrams are assigned the same reference numerals and the overlapping explanation may not be provided.

Figure 14:
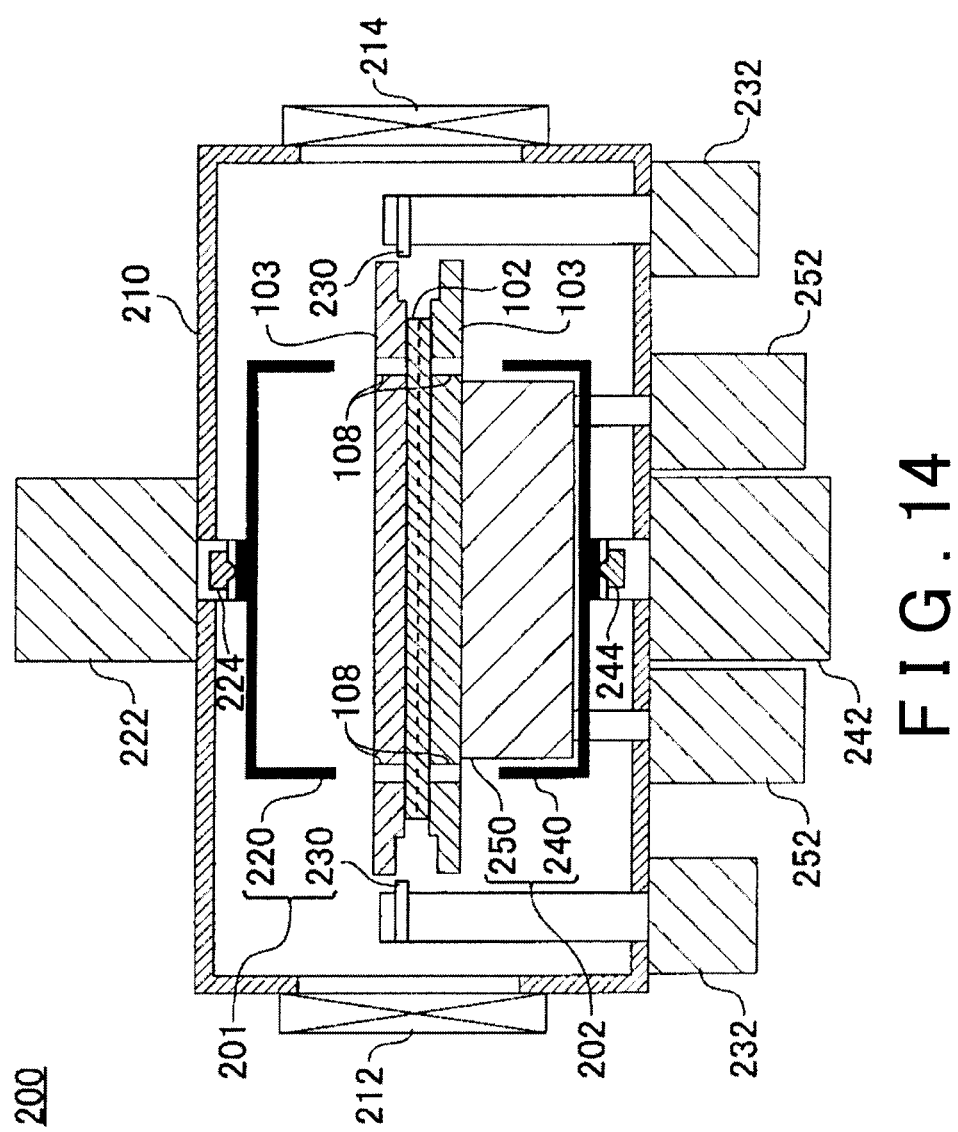
FIG. 14 is a diagram showing a process of separating a laminated substrate 102 from a substrate holder 103.

First, as shown in FIG. 14, the laminated substrate 102 sandwiched between the pair of substrate holders 103 is carried into the load lock 200. The laminated substrate 102 and the substrate holders 103 carried in are mounted on the table 250, to be suctioned by the table 250.

Figure 15:
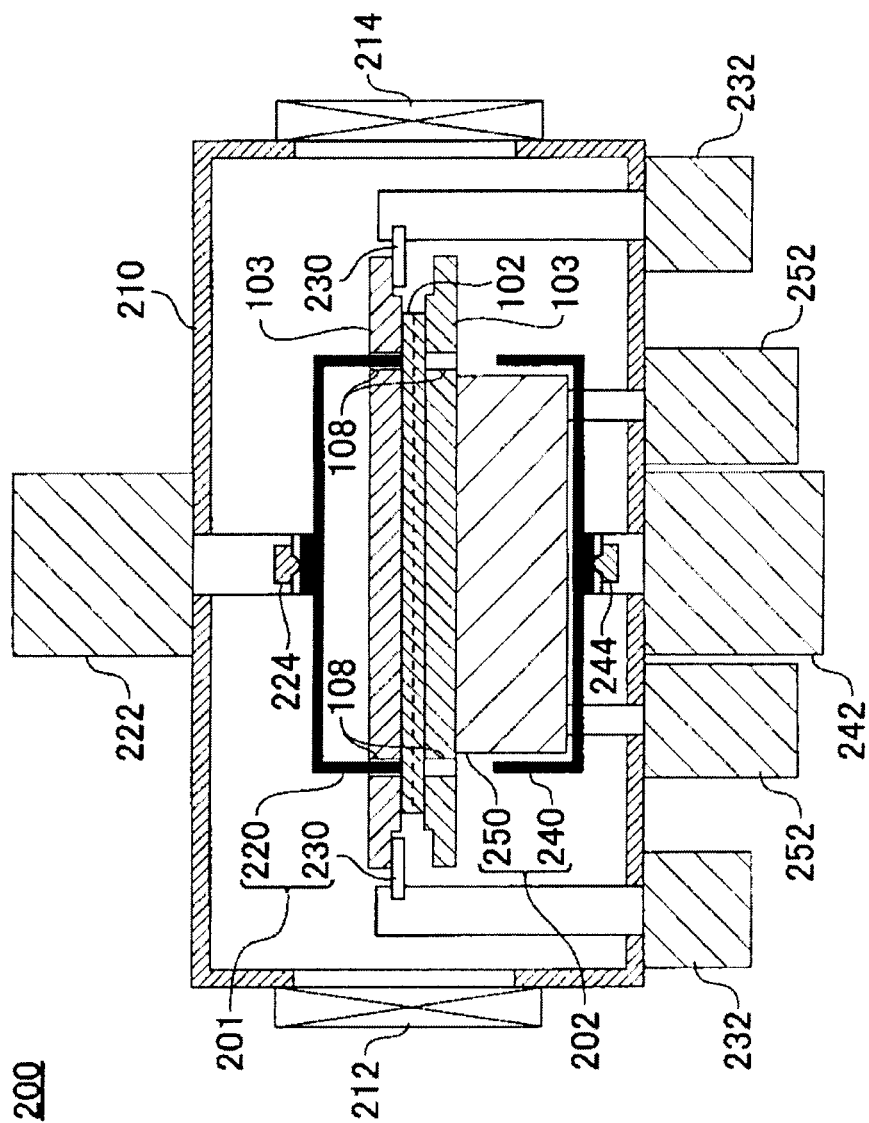
FIG. 15 is a diagram showing a process of separating a laminated substrate 102 from a substrate holder 103.

Next as shown in FIG. 15, the lift pin 220 lowers through the through hole 108 provided through the upper substrate holder 103, in accordance with the operation of the actuator 222. Accordingly, the lower end of the lift pin 220 will abut against the upper surface of the laminated substrate 102, which pushes the laminated substrate 102 towards the lower substrate holder 301. In addition, when the actuator 232 is operated, the lift plate 230 rotates, thereby inserting the tip of the lift plate 230 below the upper substrate holder 103.

Figure 16:
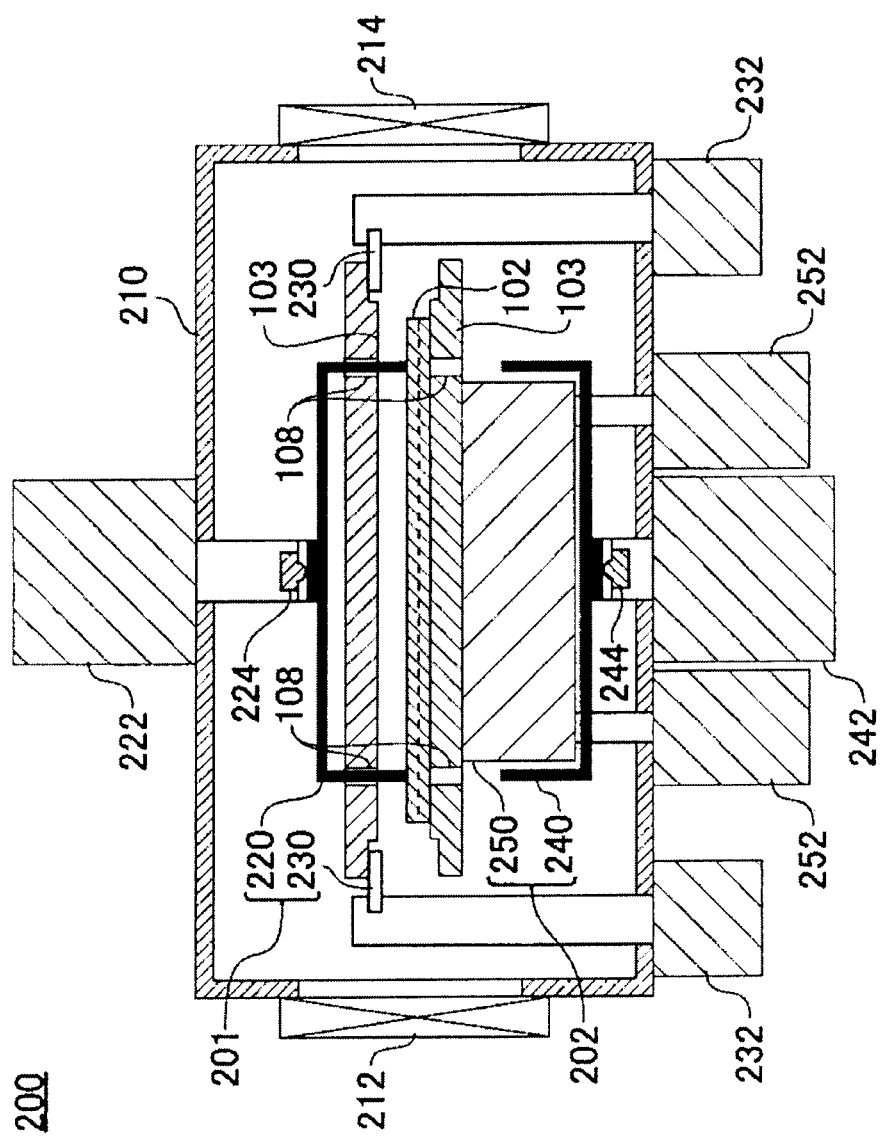
FIG. 16 is a diagram showing a process of separating a laminated substrate 102 from a substrate holder 103.

Next, as shown in FIG. 16, while the lift pin 220 is fixed in the state abutting against to the laminated substrate 102, the actuator 232 is operated to raise the lift plate 230. According to this configuration, the upper substrate holder 103 is raised upward. However, since the laminated substrate 102 is restricted from moving upward by the presence of the lift pin 220, the substrate holder 103 is peeled off from the laminated holder 102. In this manner, the upper substrate holder 103 can be separated from the laminated substrate 102, by distancing the upper substrate holder 103 from the lower substrate holder, while maintaining the state in which the laminated substrate 102 is abut against the lower substrate holder 103 by means of the lift pin 220.

Note that when the laminated substrate 102 is fixed to the upper substrate holder 103 hard, a large load will be detected on the load cell 224 during the process of peeling off the upper substrate holder 103 by means of the lift plate 230. Accordingly, when there is a possibility that the peeling power of the substrate holder 103 exceeds the bonding strength or the breakdown strength of the laminated substrate 102, the separation process of the substrate holders 103 will be stopped. This helps prevent the laminated substrate 102 from peeling off or broken.

Note that the detection of the load that the lift pin 220 is subjected to can also be performed by other means than the load cell 224 provided at the base portion of the lift pin 220. An example of which is a sensor provided on the tip of the lift pin 220. It is alternatively possible to detect the load onto the lift pin 220 based on the driving load of the actuator 222.

Figure 17:
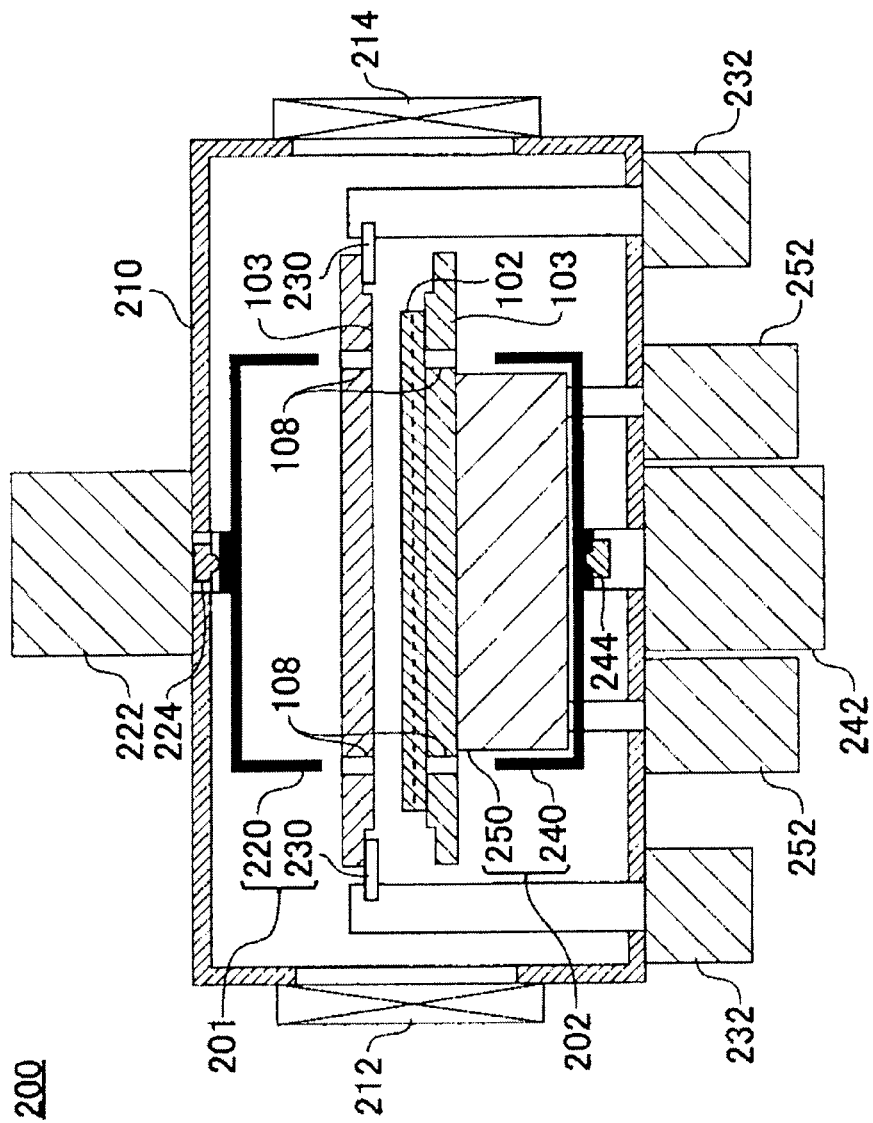
FIG. 17 is a diagram showing a process of separating a laminated substrate 102 from a substrate holder 103.

Finally, the lift pin 220 is raised by operating the actuator 222 as shown in FIG. 17. Accordingly, the lift pin 220 is removed from the through hole 108 of the substrate holder 103, and sets the upper substrate holder 103 to be ready for being carried out independently from the load lock 200.

Figure 18:
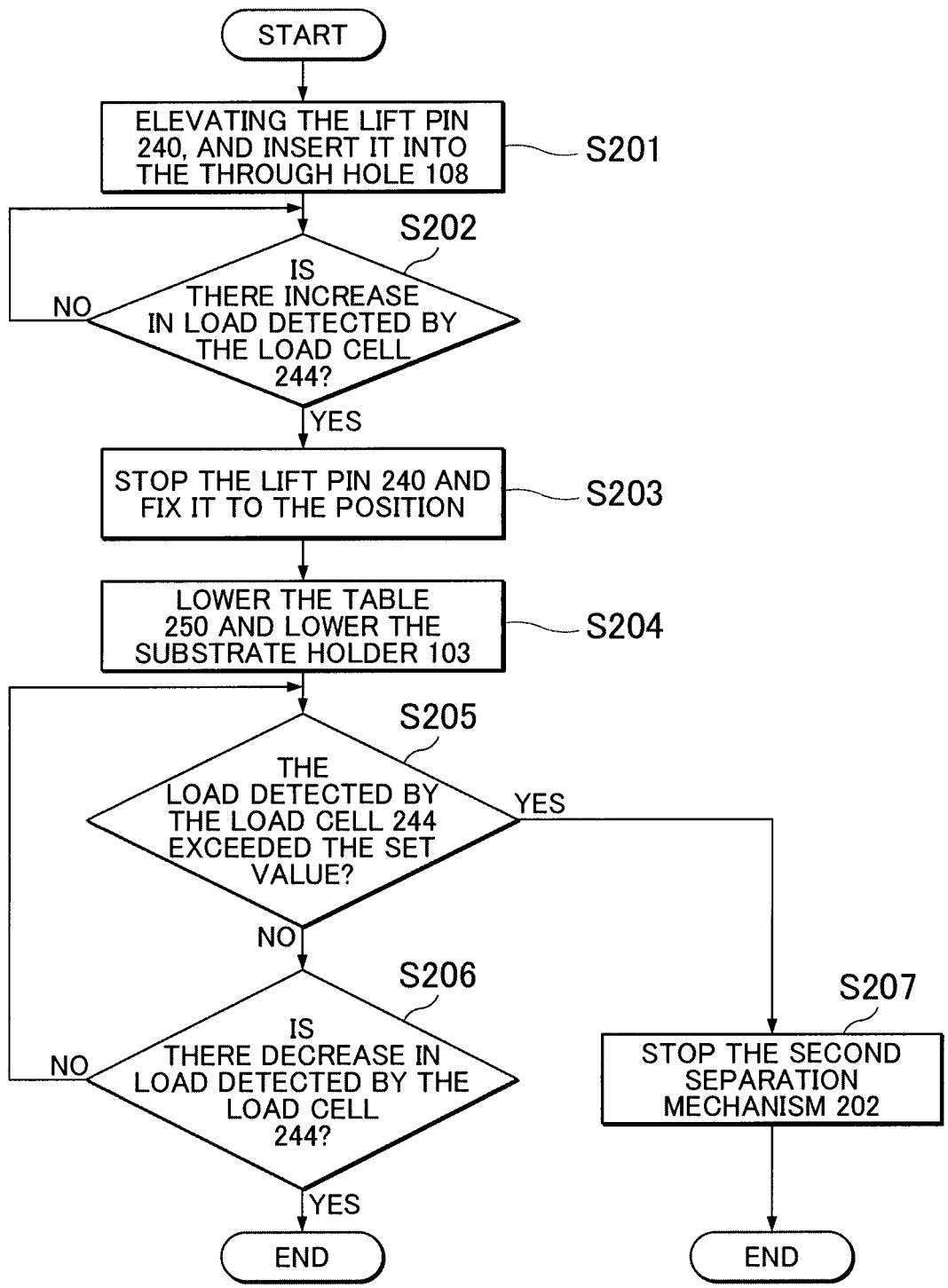
FIG. 18 is a flow showing an overview showing the operation of a second separating mechanism 202.

FIG. 18 is a flow showing the process of separating the laminated substrate 102 and the substrate holder 103 using the second separation mechanism 202. Note that the following is an explanation of the process that follows the process shown in FIG. 13, and the upper substrate holder 103 of the pair of the substrate holders 103 sandwiching the laminated substrate 102 is assumed to have been already separated from the laminated substrate 102 using the first separation mechanism 201. In other words, the second separation mechanism 202 separates the lower substrate holder 103 situated below the laminated substrate 102, from the laminated substrate 102.

First, the lift pin 240 is raised by operating the actuator 222, and the upper end of the lift pin 240 is inserted into the through hole 108 of the lower substrate holder 103 (S201). Furthermore, by raising the lift pin 240 using the actuator 242, the load onto the lift pin 240 is monitored using the load cell 244 (S202).

When the load cell 244 does not detect any change of load (S202:NO), the lift pin 240 is continually raised. When the tip of the lift pin 240 eventually reaches and is abut against the lower surface of the laminated substrate 102, the load cell 244 will detect an increased amount of load (S202: YES), and therefore the actuator 242 is stopped to fix the lift pin 240 at the position (S203).

Next, the actuator 252 is operated to lower the table 250 (S204). Since the lower substrate holder 103 is suctioned by the table 250, the substrate holder 103 also goes down in accordance with the lowering of the table 250. In addition, while lowering the table 250, the load of the lift pin 240 detected by the load cell 244 is monitored (S205).

When the load detected by the load cell 244 does not exceed a pre-set value (S205:NO), the operation of the actuator 252 is continued. Also when the load detected by the load cell 244 does not decrease (S206:NO), the operation of the actuator 242 is also continued to continue lowering the table 250.

When the load detected by the load cell 244 has exceeded the set value (S205:YES), it means that the laminated substrate 102 is fixed hard to the substrate holders 103, and so it becomes quite likely to cause wear and tear, or the peeling off of the laminated substrate 102 attributed to the excessive load. In such a case, the second separation mechanism 202 is stopped from continuing the separation process of the laminated substrate 102 from the substrate holders 103 (S207).

When the laminated substrate 102 is separated from the substrate holders 103, the load onto the lift pin 240 drops. When the drop in the load of the lift pin 240 is detected by the load cell 244 (S206: YES), the operation of the second separation mechanism 202 is stopped.

FIG. 19-FIG. 22 are diagrams showing how the second separation mechanism separates the lower substrate holder 103 from the laminated substrate 102, step by step. Note that the constituting elements common to the other diagrams are assigned the same reference numerals and the overlapping explanation may not be provided.

Figure 19:
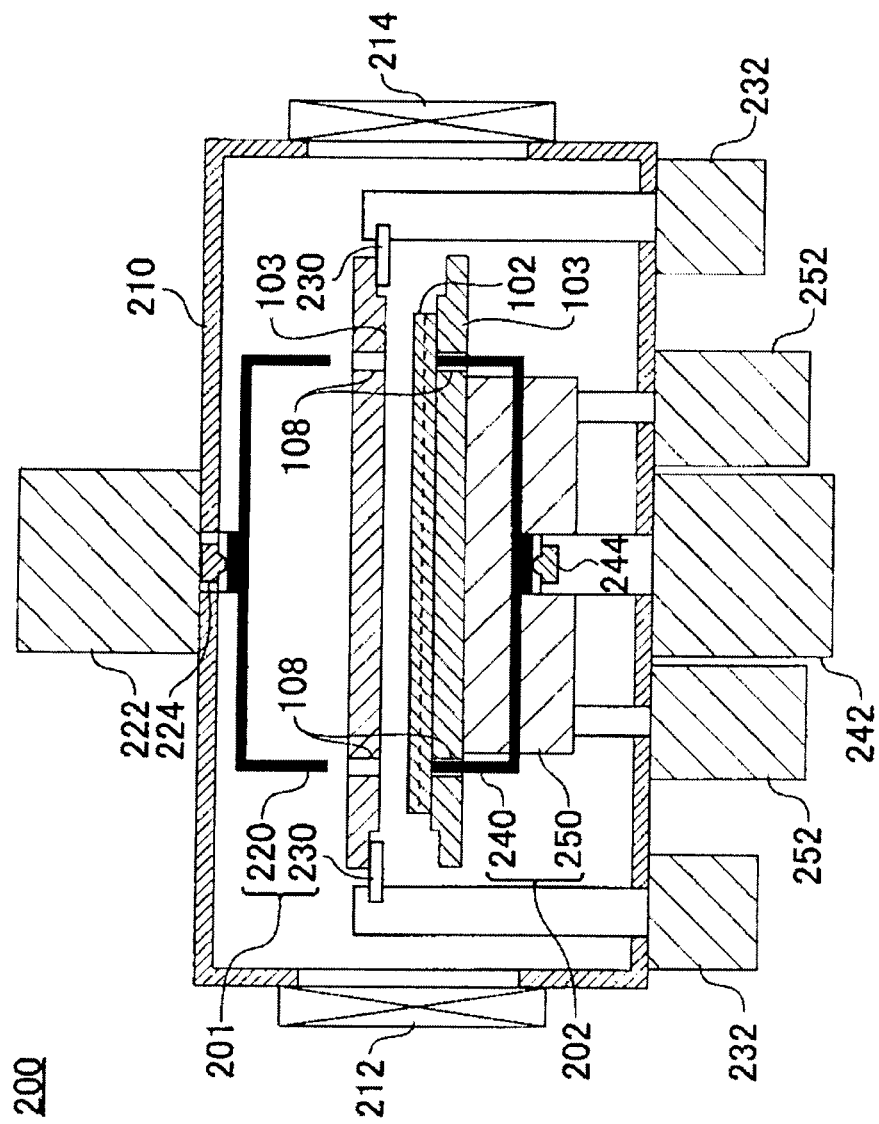
FIG. 19 is a diagram showing a process of separating a laminated substrate 102 from a substrate holder 103.

As shown in FIG. 19, by operating the actuator 242, the tip of lift pin 240 will be raised through the through hole 108 of the lower substrate holder 103. Accordingly, the upper end of the lift pin 220 will abut against the lower surface of the laminated substrate 102.

Figure 20:
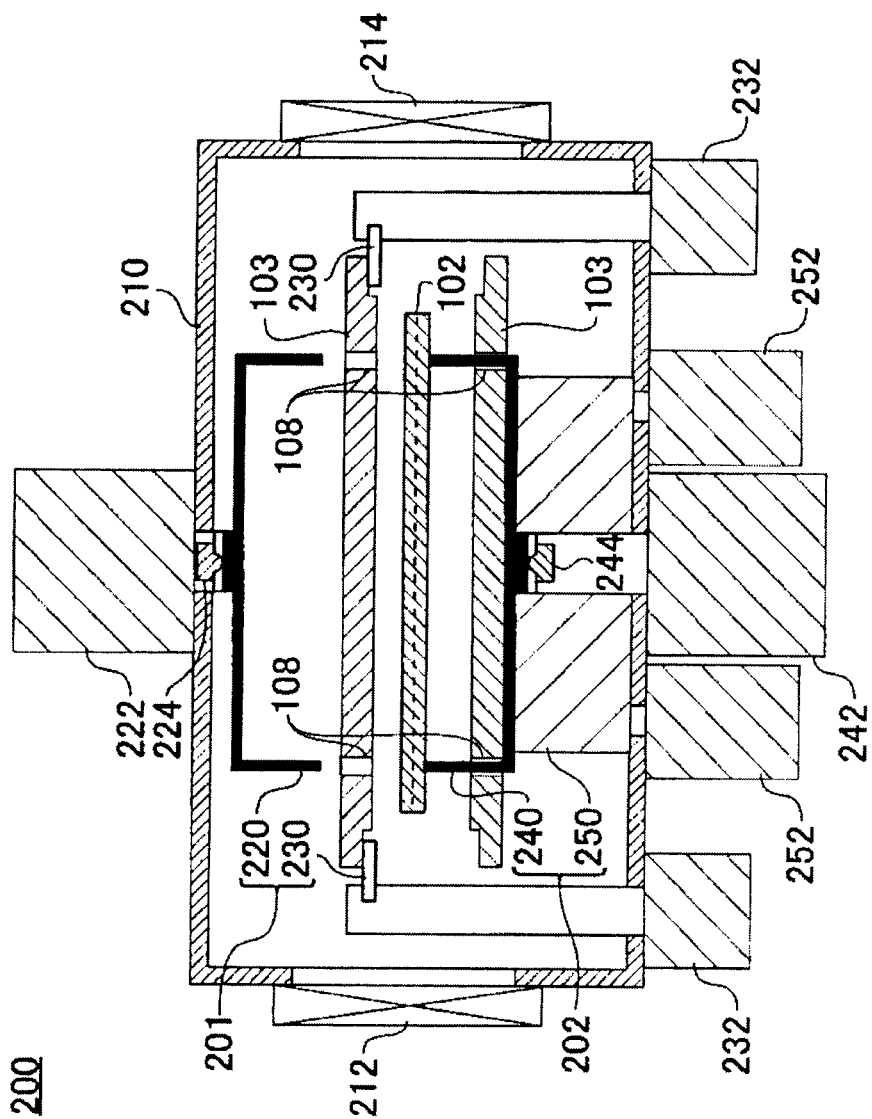
FIG. 20 is a diagram showing a process of separating a laminated substrate 102 from a substrate holder 103.

Next, as shown in FIG. 20, while fixing the lift pin 240 in the state abutting against to the laminated substrate 102, the actuator 252 is operated to lower the table 250. Since the table 250 is suctioning the substrate holder 103, the lower substrate holder 103 is also drawn downward in accordance with the lowering operation of the table 250.

Since the laminated substrate 102 is restricted from moving downward by being pushed by the lift pin 240 from below, the substrate holder 103 is peeled off from the laminated holder 102. In this manner, the lower substrate holder 103 can be separated from the laminated substrate 102.

The lower surface of the laminated substrate 102 is greatly distanced from the lower substrate holder 103, and the upper surface of the laminated substrate is also greatly distanced from the upper substrate holder 103. Therefore, the laminated substrate 102 can be taken out independently by the atmosphere loader 121 by opening the gate valve 212 at the side of the atmosphere environment.

Note that when the laminated substrate 102 is fixed to the lower substrate holder 103 hard, a large load will be detected on the load cell 244 during the process of peeling off the lower substrate holder 103 by means of the table 250. Accordingly, when there is a possibility that the peeling power of the substrate holder 103 exceeds the bonding strength or the breakdown strength of the laminated substrate 102, the separation process of the substrate holders 103 will be stopped. This helps prevent the laminated substrate 102 from peeling off or broken.

Note that the detection of the load that the lift pin 240 is subjected to can also be performed by other means than the load cell 244 provided at the base portion of the lift pin 240. There should be other places by which the fixing of the laminated substrate 102 and the substrate holder 103 can be detected (e.g., tip of the lift pin 240). It is alternatively possible to detect the load onto the lift pin 240 based on the driving load of the actuator 242.

Figure 21:
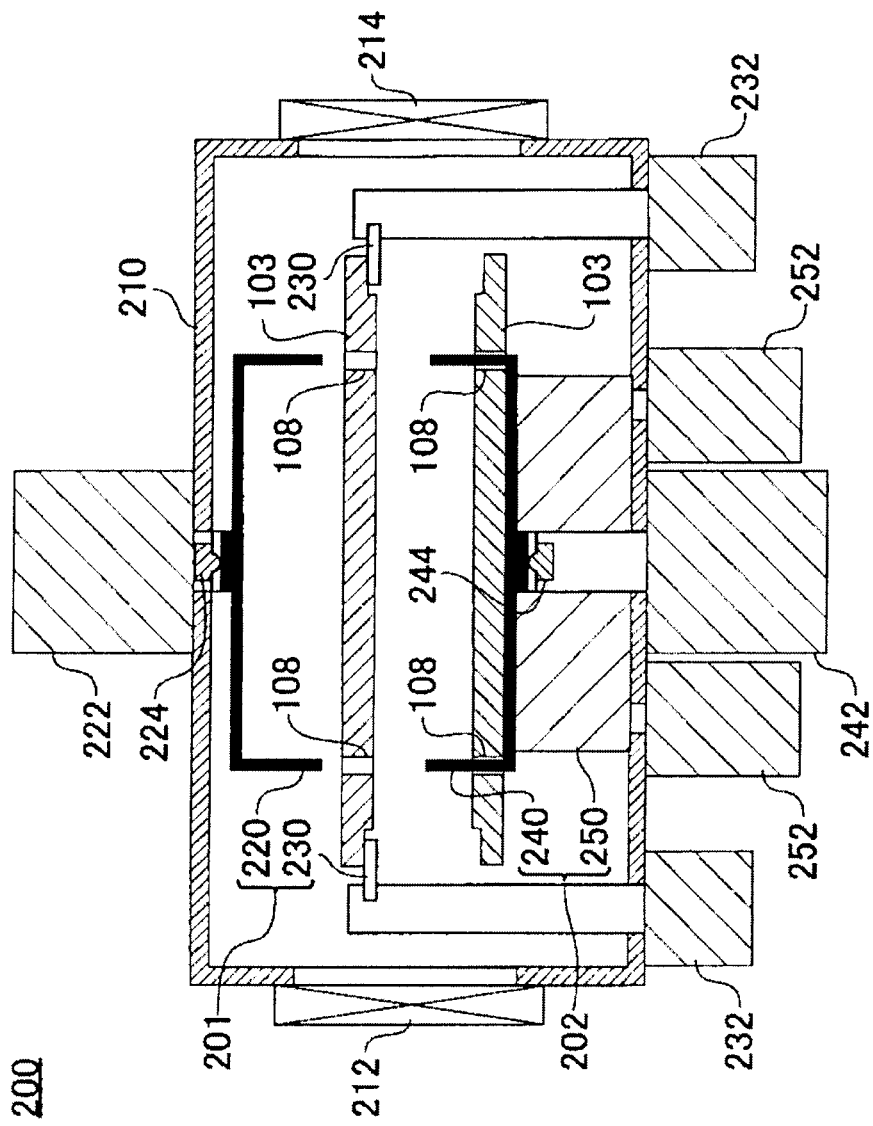
FIG. 21 is a diagram showing a process of separating a laminated substrate 102 from a substrate holder 103.

Next, as shown in FIG. 21, the laminated substrate 102 separated from both of the upper substrate holder 103 and the lower substrate holder 103 is carried out of the load lock 200. During this process, the gate valve 212 at the atmosphere side will be open. However, the vacuum at the side of the environment loader 120 will not be broken since the gate valve 214 at the environment loader side is closed.

By performing the aforementioned series of operations during air supply to the load lock 200 while the gate valves 212, 214 are both closed, the operation of returning the inside of the load lock 200 to the atmosphere environment and the operation of separating the laminated substrate 102 from the substrate holder 103 can be performed in parallel. This arrangement helps improve the throughput of the substrate bonding apparatus 100.

Figure 22:
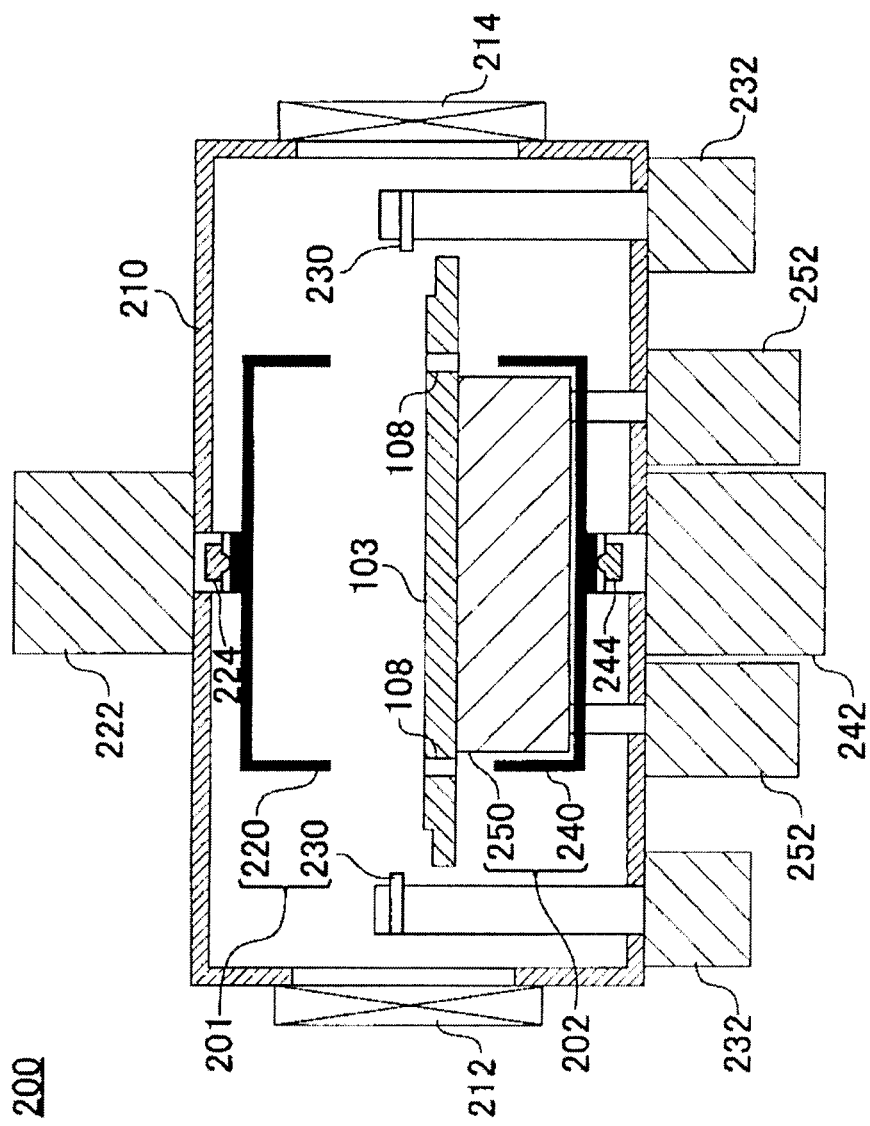
FIG. 22 is a diagram showing a process of separating a laminated substrate 102 from a substrate holder 103.

Finally, the lift pin 240 is lowered by operating the actuator 242 as shown in FIG. 22. Accordingly, the lift pin 240 is removed from the through hole 108 of the substrate holder 103, and the lower substrate holder 103 is also set to be ready for being carried out from the load lock 200. More specifically, both of the gate valves 212, 214 are closed, and then the load lock 200 is brought back to the vacuum environment. Then, the environment loader 120 is used to sequentially return the pair of substrate holders 103 to the holder stocker 140.

The pair of substrate holders 103 are collected towards the environment loader 120 in the vacuum environment. Therefore, first, the laminated substrate 102 is carried out, then the load lock 200 is exhausted by closing the gate valve 212. Next, the substrate holders 103 are carried out of the load lock 200 by opening the gate valve 214. The carried out substrate holder 103 is returned to the holder stocker 140, for example.

Instead of the embodiment explained through FIGS. 14-22, the substrate holders 103 may alternatively be moved with the laminated substrate 102 sandwiched between the lift pins 220, 240. In this case, power supply of the electrostatic chuck is stopped at the upper substrate holder 103 and the lower substrate holder 103. Thereafter, the lift pins 220, 240 are driven to stop the laminated substrate 102 by sandwiching it in the vertical direction. With the laminated substrate 102 sandwiched between the lift pins 220, 240, the tip of the lift plate 230 is inserted below the upper substrate holder 103, and then driven upward, thereby moving the upper substrate holder 103 upward. Simultaneously, or prior to or after this operation, the table 250 is lowered in the state in which the lift pins 220, 240 sandwich the laminated substrate 102, thereby moving the lower substrate holder 103 downward. Accordingly, the laminated substrate 102 is separated from both of the upper substrate holder 103 and the lower substrate holder 103.

Figure 23:
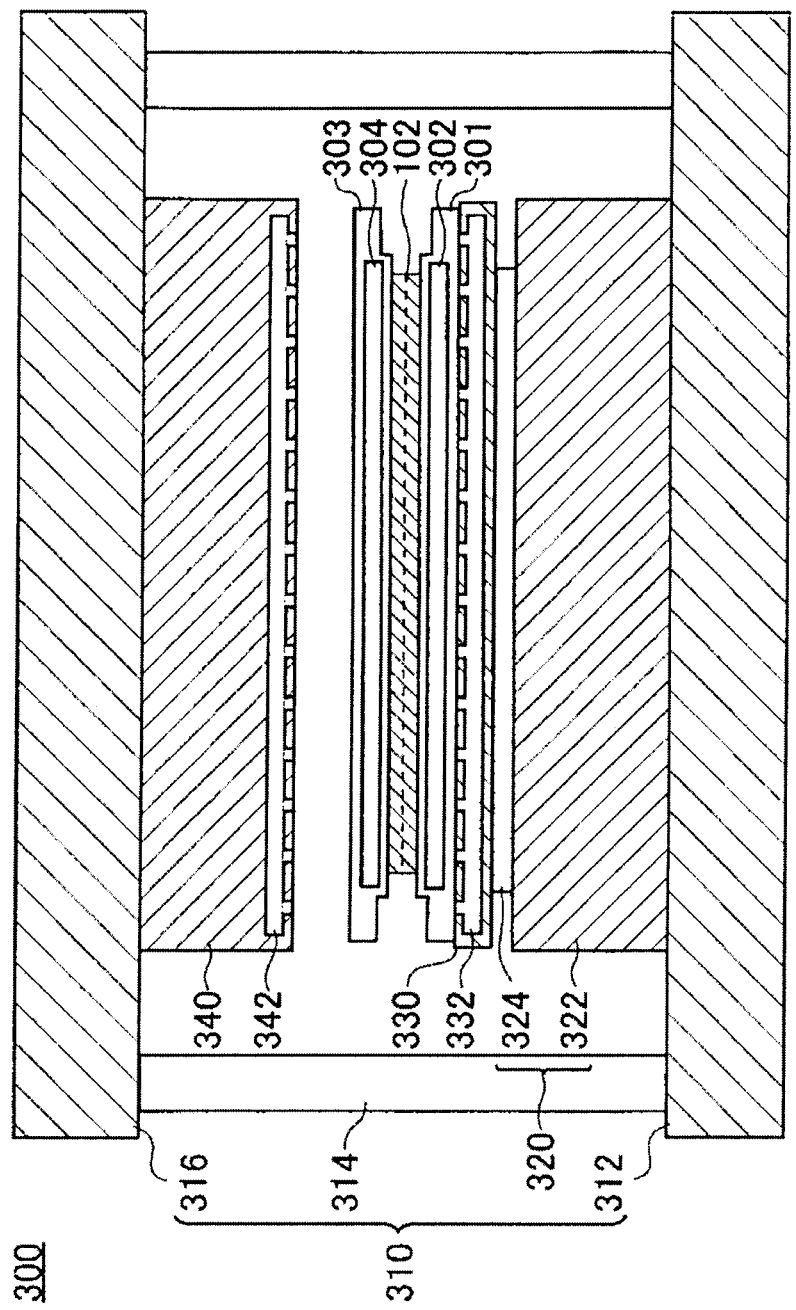
FIG. 23 is a sectional view of a structure of a substrate separating apparatus 300.

FIG. 23 is a sectional view of a different structure of the substrate separating apparatus 300. The substrate separating apparatus 300 includes a frame 310, a Z driving section 320 provided inside the frame 310, as well as an upper stage 330 and a lower stage 340.

A laminated substrate 102 and a pair of substrate holders 301, 303 sandwiching the laminated substrate 102 are mounted on the lower stage 330 of the substrate separating apparatus 300. Note that the substrate holders 301, 303 also include electrostatic chucks 302, 304 capable of independently operating and stopping.

The frame 310 includes a bottom plate 312 and a top plate 316, each of which is horizontal and parallel to the other, and a plurality of supporting columns 314 for coupling the bottom plate 312 to the top plate 316. All the bottom plate 312, the supporting columns 314, and the top plate 316 have high rigidity, to resist deformation even when subject to the reactive force operates in response to the operation of the laminated substrate 102.

On the upper surface of the bottom plate 312, a lower stage 330 is provided with the Z driving section 320 therebetween. The Z driving section 320 includes a cylinder 322 fixed to the bottom plate 312 and a piston 324 operable to move up and down in the vertical direction from the cylinder 322. The lower stage 330 is fixed to the upper end of the piston 324. By doing so, the lower stage 330 is raised and lowered with respect to the bottom plate 312.

The lower stage 330 includes a vacuum chuck 332. Due to this mechanism, the lower stage 330 can mount thereon the substrate holders 301, 303, and the laminated substrate 102, as well as holding, by suction force, the lower substrate holder 301 by the negative pressure. As a result, when lowering the lower stage 330, the substrate holder 301 held thereto also moves.

The upper stage 340 hangs from the lower surface of the top plate 316. A vacuum chuck 342 is provided on the lower surface of the upper stage 340. Due to this arrangement, the substrate holder 303 can be suctioned by the lower surface of the upper stage 340 by the negative pressure.

Figure 24:
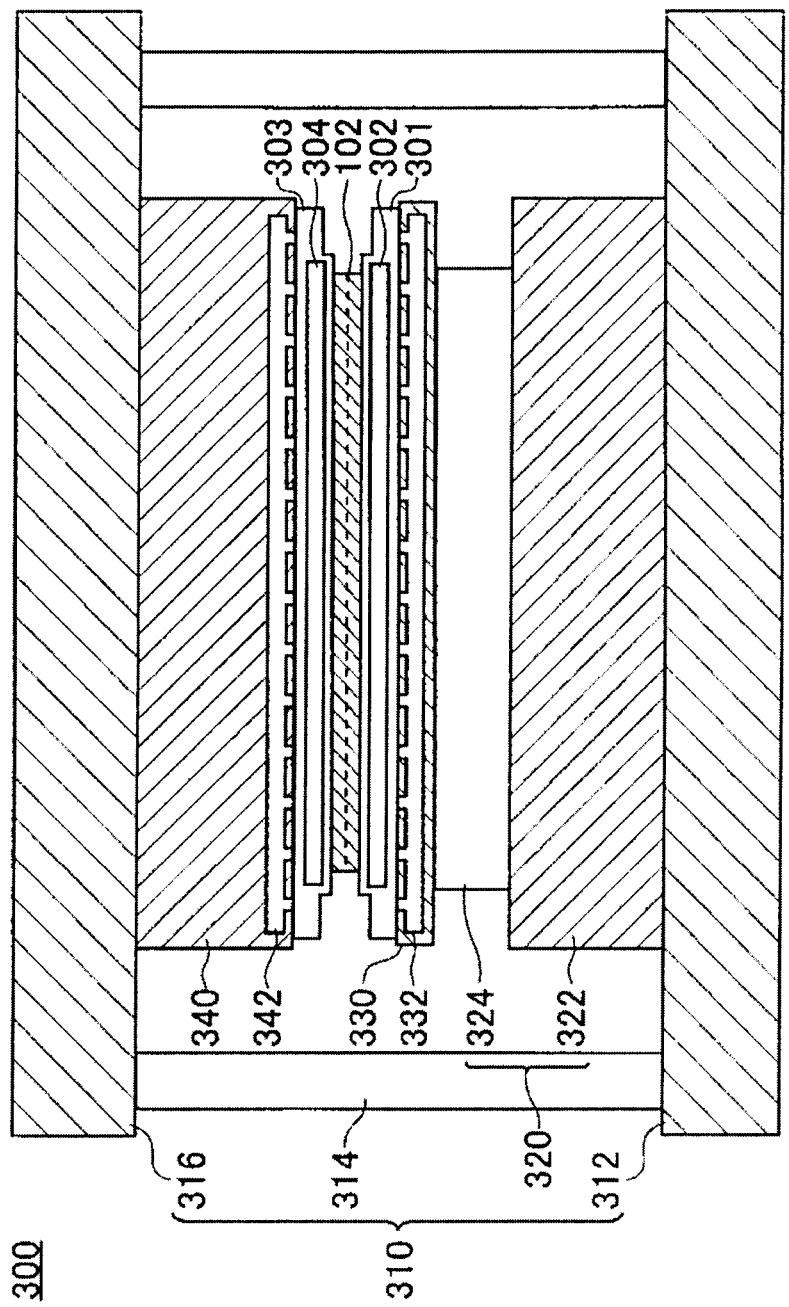
FIG. 24 is a sectional view showing an operation of a substrate separating apparatus 300.

FIG. 24 is a sectional view showing an operation of a substrate separating apparatus 300. As shown in this drawing, the piston 324 is lifted up from the cylinder 322, to also lift up the lower stage 330 to which the laminated substrate 102 and the substrate holders 301, 303 are mounted. In this way, the rear surface (upper surface) of the upper substrate holder 303 abuts in tight contact with the upper stage 340.

Figure 25:
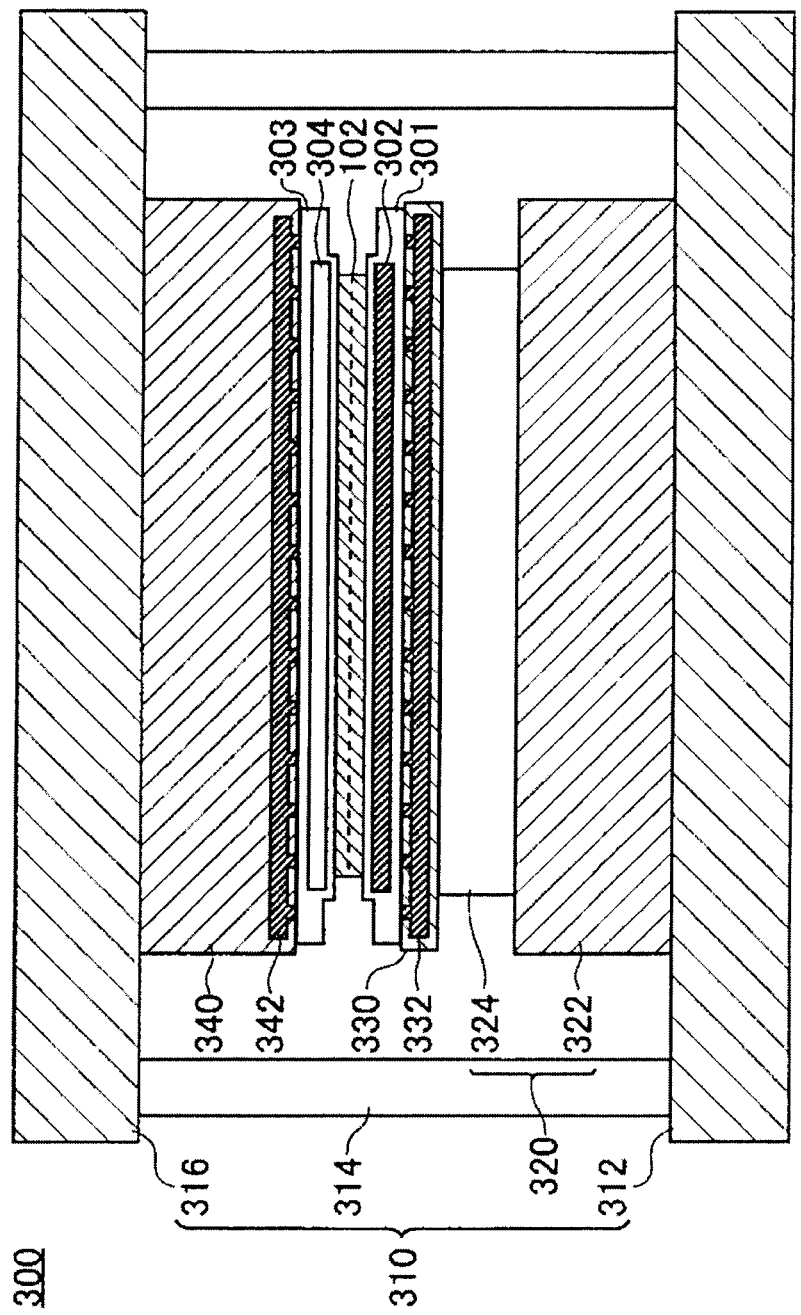
FIG. 25 is a sectional view showing an operation of a substrate separating apparatus 300.

FIG. 25 is a sectional view of the subsequent operation of a substrate separating apparatus 300. Next, the electrostatic chuck 302 of the lower substrate holder 301 as well as the vacuum chucks 332, 342 of the lower stage 330 and the upper stage 340 start operating. Note that in the drawing, the electrostatic chuck 302 and the vacuum chucks 332, 342 performing a suction operation are shown by hatching.

According to the stated mechanism, the lower stage 330 holds the lower substrate holder 301 by suction. In addition, the lower substrate holder 301 is maintained in the state of suctioning the laminated substrate 102 to be in tight contact. Furthermore, the upper stage 340 suctions the upper substrate holder 303 to be fixed thereto. Note that the upper substrate holder 303 is not suctioning the laminate substrate 102 during this operation.

Figure 26:
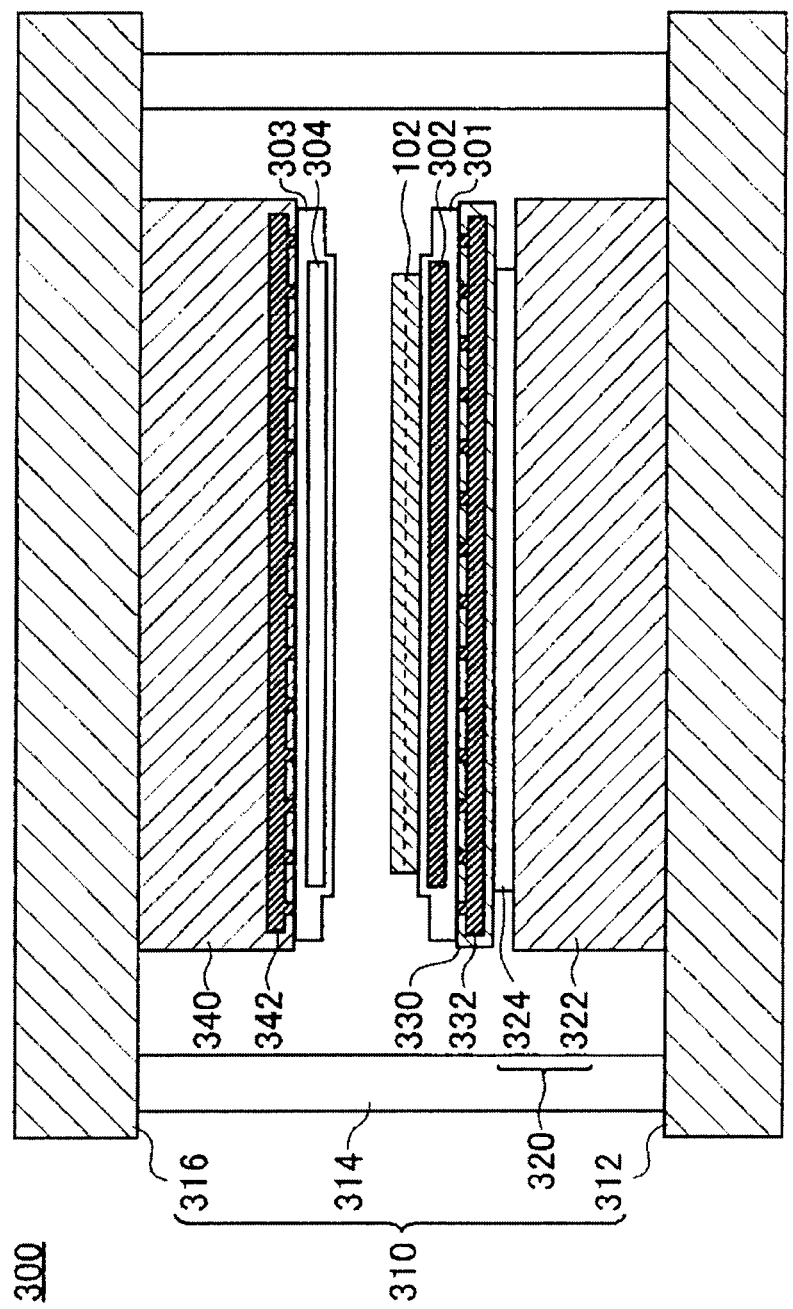
FIG. 26 is a sectional view showing an operation of a substrate separating apparatus 300.

FIG. 26 is a sectional view showing an operation of a substrate separating apparatus 300 that follows. When the cylinder 322 is caused to descend with respect to the piston 324, while keeping the aforementioned suction by the electrostatic chuck 302 and the vacuum chucks 332, 342, the lower stage 330 also descends. Accordingly, the lower substrate holder 301 suctioned by the lower stage 330 and the laminated substrate 102 suctioned by the lower substrate holder 301 descend together with the lower stage 330.

However, the upper substrate holder 303 remains at the upper stage 340 by being suctioned by the vacuum chuck 342. In this way, the upper substrate holder 303 is separated by the laminated substrate 102. In addition, the upper substrate holder 303 can be effectively separated by operating the electrostatic chuck 302 and the vacuum chucks 332, 342 in a suitable manner, which leads to effective execution of the following procedures.

Figure 27:
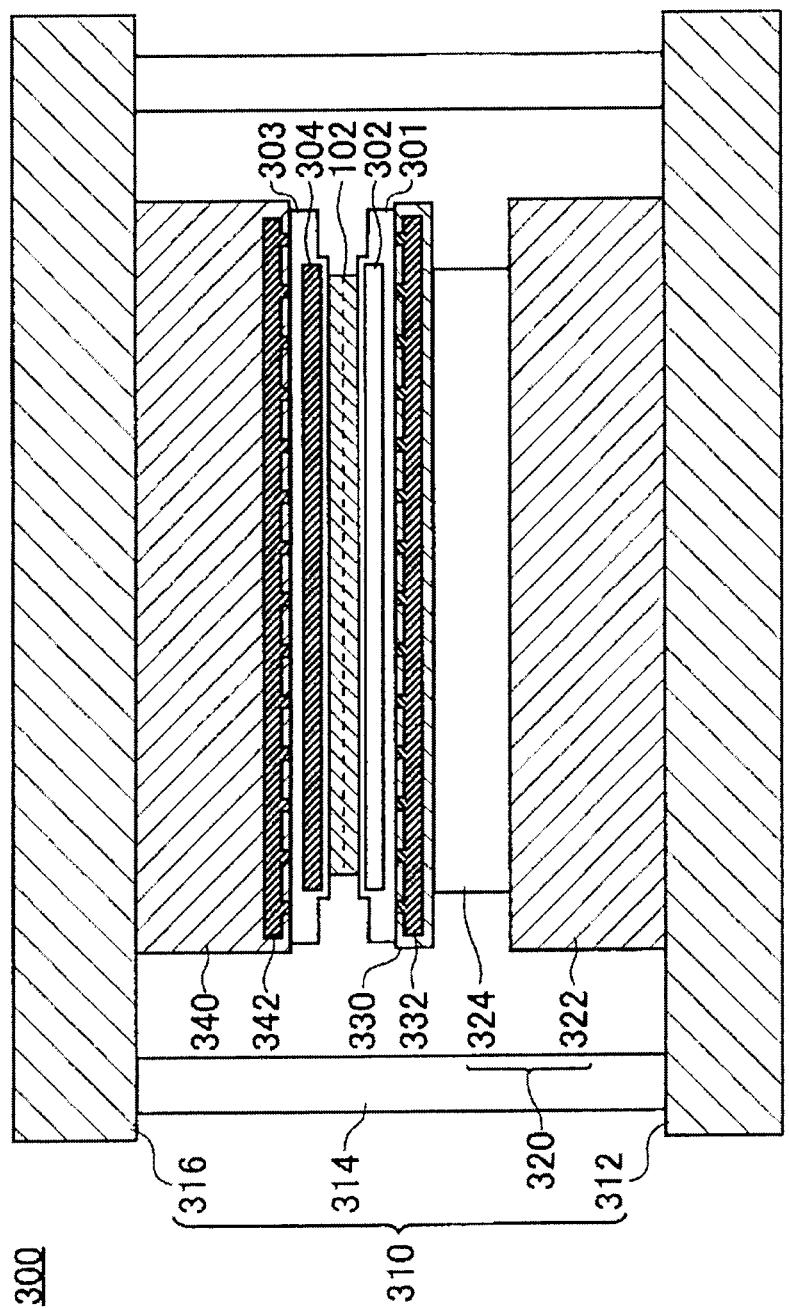
FIG. 27 is a sectional view showing an operation of a substrate separating apparatus 300.

FIG. 27 is a sectional view showing another type of operation of a substrate separating apparatus 300. As shown in FIG. 27, by elevating the piston 324 from the cylinder 322, the lower stage 330, mounting thereon the laminated substrate 102 and the lower substrate holder 302, is also elevated. By dong so, the upper surface of the laminated substrate 102 abuts against the lower surface of the upper substrate holder 303 suctioned by the upper stage 340, to be in tight contact with thereto.

Next, the vacuum chucks 332, 342 of the lower stage 330 and the upper stage 340 as well as the electrostatic chuck 304 of the upper substrate holder 303 are operated. By doing so, the once separated laminated substrate 102 goes back to the state of being suctioned by and in tight contact with the upper substrate holder 303, and is maintained in that state.

However, the fixing between the lamintated substarte 102 and the upper substrate holder 303 created by the pressure from the pressurizing apparatus 130 has already been broken by the former separation process. Therefore when the suction is broken by the electrostatic chuck 304 of the substrate holder 303, the suction of the laminated substrate 102 to the substrate holder 303 can be effectively cancelled.

Figure 28:
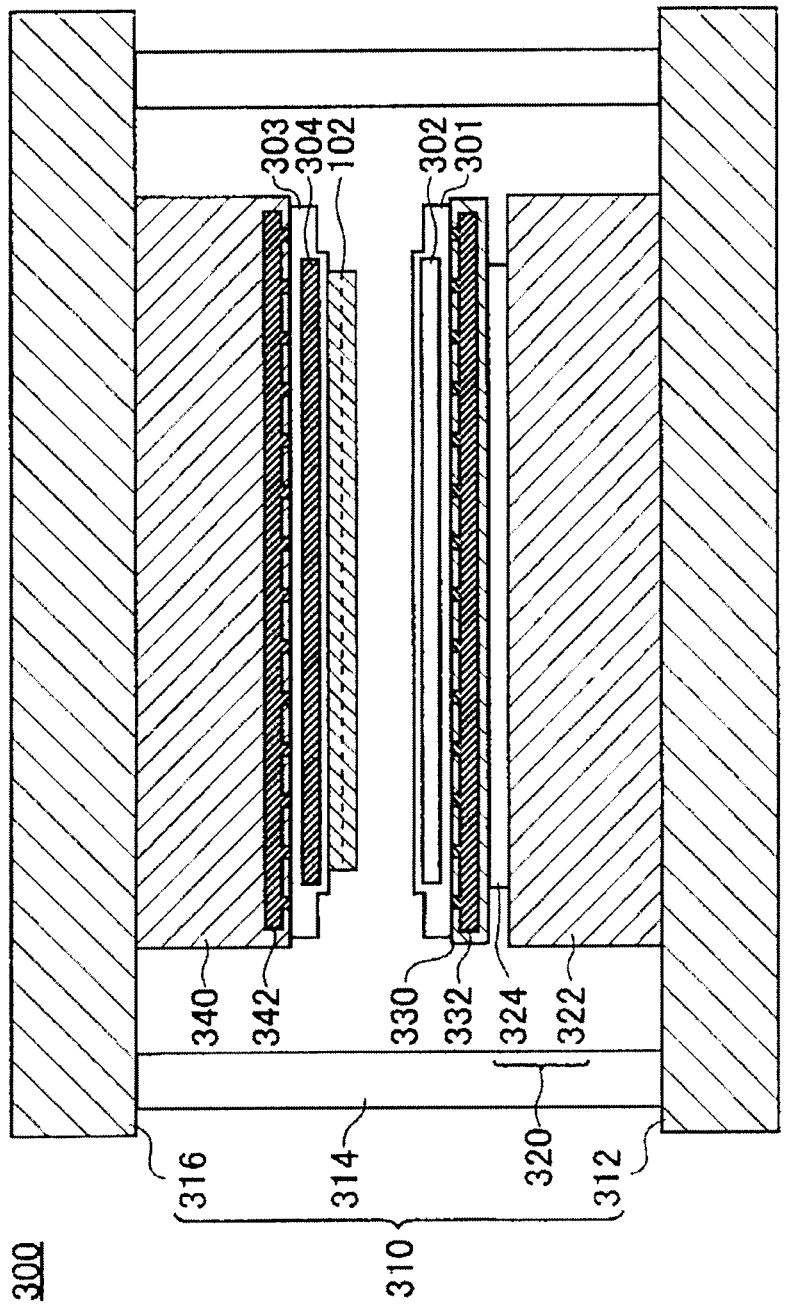
FIG. 28 is a sectional view showing an operation of a substrate separating apparatus 300.

FIG. 28 is a sectional view showing an operation of a substrate separating apparatus 300. By allowing the cylinder 322 to descend with respect to the piston 324 while maintaining the above-explained suction by means of the electrostatic chuck 304 and the vacuum chucks 332, 342, the lower stage 330 also descends. Accordingly, the lower substrate holder 301 held by suction by the lower stage 330 goes down together with the lower stage 330.

On the other hand, the laminated substrate 102 suctioned and fixed to the upper substrate holder 303 remains without descending with the upper stage 340. Accordingly, the fixing of the laminated substrate 102 and the lower substrate holder 303 is cancelled. Consequently, it becomes possible to carry out the laminated substrate 102 independently, by inserting a loader or the like under the laminated substrate 102 having the state illustrated in the drawing, to break the suction of the substrate holder 303.

Note that in the above, the upper substrate holder 303 was explained to be separated first, and then the lower substrate holder 301. However, it should be needless to say that the order of separation can be reversed, i. e., the lower substrate holder 301 first, and then the upper substrate holder 303.

When one of the substrate holders 301, 303 is separated, the separated substrate holder 301, 303 may be carried out from the substrate separating apparatus 300. In such a case, the laminated substrate 102 can be directly suctioned by the upper stage 340 or the lower stage 330 at the timing at which the other substrate holder 301, 303 is separated.

Furthermore, the suction of the substrate holders 301, 303 to the lower stage 330 and the upper stage 340 is not exclusively performed by the vacuum chuck 332, 342. Different structures such as an electrostatic chuck can also be used. In addition, although not shown in the drawings, lift pin(s) for lifting up the substrate holder 301 from the lower stage 330 may also be formed, for the purpose of helping the remaining lower substrate holder 301 carried out.

Figure 29:
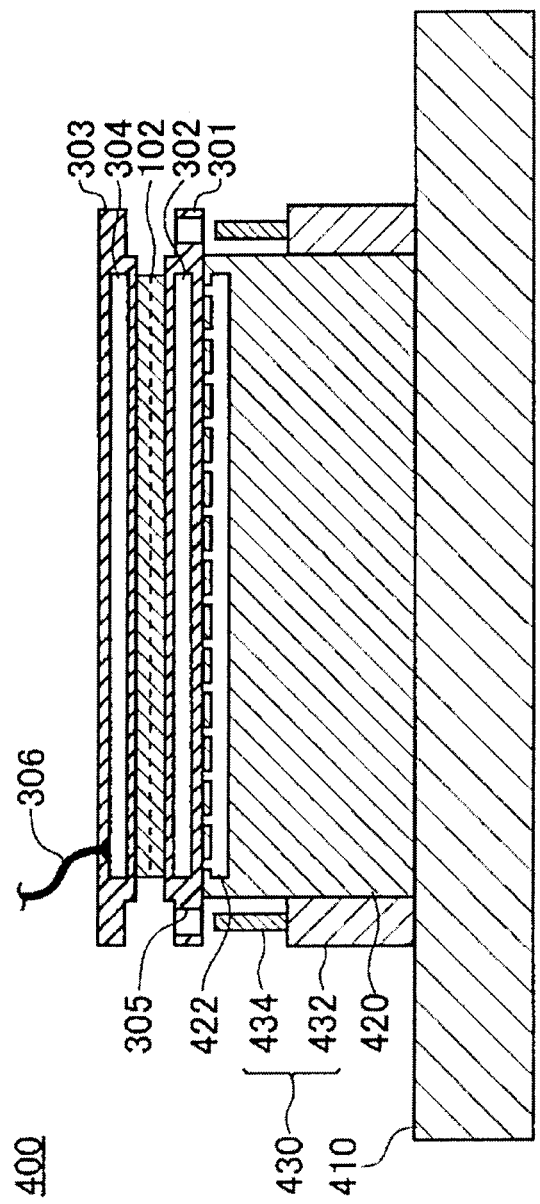
FIG. 29 is a sectional view of a structure of a substrate separating apparatus 400.

FIG. 29 is a sectional view of a different structure of the substrate separating apparatus 400. The substrate separating apparatus 400 includes a bottom plate 410, as well as a table 420 and a Z driving section 430 mounted on the bottom plate 410.

The table 420 includes a vacuum chuck 422 for suctioning and fixing the substrate holder 301 mounted on its upper surface. The Z driving section 430 includes an actuator 432 and a lift pin 434 provided along the side surface of the table 420. The actuator 432 lowers and raises the lift pin 434 vertically.

The laminated substrate 102 and the substrate holders 301, 303 laminated sequentially are provided on the table 420. Note that the table 420 has a diameter smaller than that of the substrate holders 301, 303. Therefore, the portion in the vicinity of the edges of the substrate holders 301, 303 comes out over the side of the table 420.

The substrate holders 301, 303 include electrostatic chucks 302, 304 capable of independently operating and stopping. In view of this, the substrate separating apparatus 400 includes a power supply line 306 for supplying power to the electrostatic chuck 304 of the upper substrate holder 303.

In addition, at least the lower substrate holder 301 has a through hole 305 penetrating in the thickness direction. The through hole 305 is provided outside of the laminated substrate 102 sandwiched between the substrate holders 301, 303. Therefore, the lift pin 434 raised by the actuator 432 can reach the upper substrate holder 303 after passing through the through hole 305.

Figure 30:
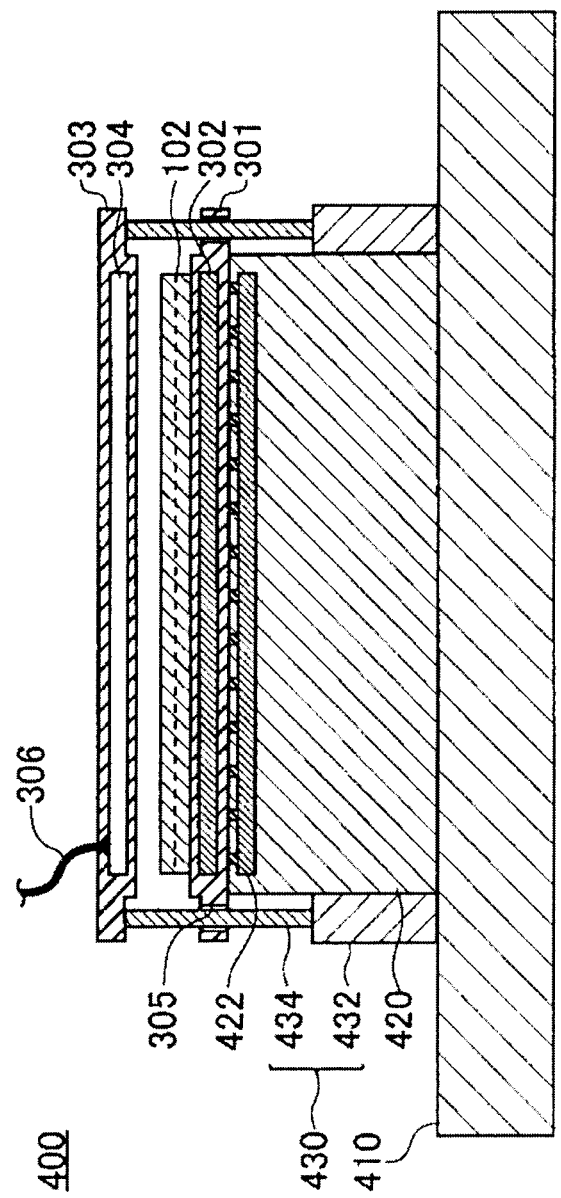
FIG. 30 is a sectional view showing an operation of a substrate separating apparatus 400.

FIG. 30 is a sectional view showing an operation of a substrate separating apparatus 400. As shown in this drawing, lift pin 434 is elevated while the vacuum chuck 422 of the table 420 as well as the electrostatic chuck 302 of the lower substrate holder 301 are in operation. According to this operation, the upper end of the lift pin 434 eventually abuts against the lower surface of the upper substrate holder 303.

The lower substrate holder 301 is suctioned and fixed to the table 420. The laminated substrate 102 is kept suctioned and in tight contact with the lower substrate holder 301. Therefore, when the actuator 432 further elevates the lift pin 434, the upper substrate holder 303 is distanced from the lower substrate holder 301, and will eventually be separated from the laminated substrate 102 and lifted up.

Figure 31:
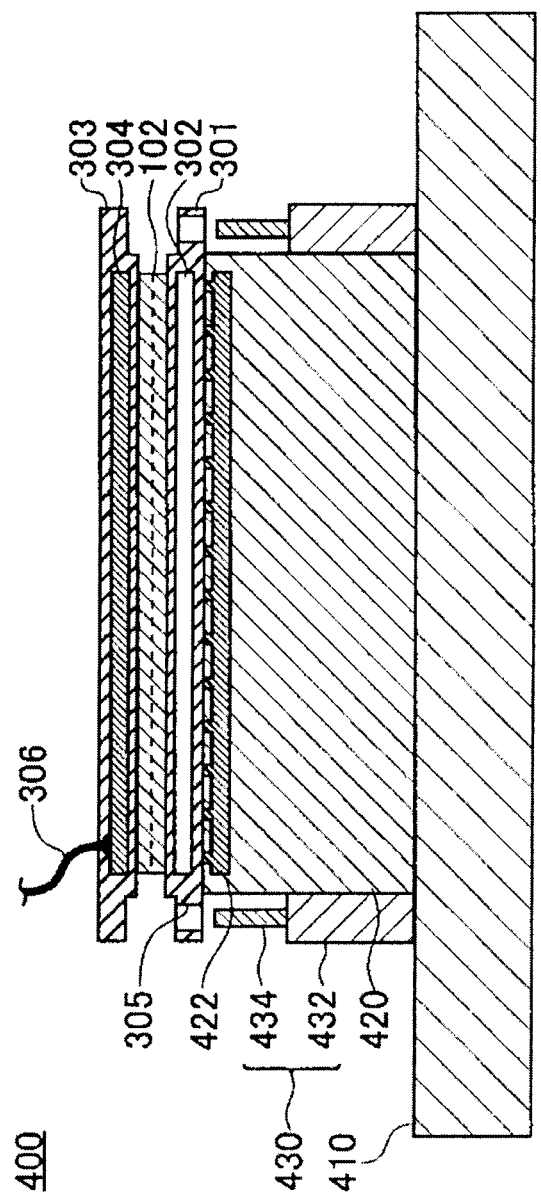
FIG. 31 is a sectional view showing an operation of a substrate separating apparatus 400.

FIG. 31 is a sectional view of the subsequent operation of a substrate separating apparatus 400. As shown, the upper substrate holder 303 is lowered by lowering the lift pin 434 using the actuator 432. Accordingly, the upper substrate holder 303 will again abut against the upper surface of the laminated substrate 102.

Next, the suction of the laminated substrate 102 by the electrostatic chuck 302 of the lower substrate holder 301 is cancelled, while keeping effective the suction of the lower substrate holder 301 by the table 420 as well as the suction of the laminated substrate 102 by the upper substrate holder 303. Accordingly, the laminated substrate 102 once separated will be suctioned by the upper substrate holder 303 again to be in tight contact thereto.

However, the attachment of the laminated substrate 102 and the upper substrate holder 303 due to pressurization by the pressurizing apparatus 130 is already cancelled. Therefore, by stopping the operation of the electrostatic chuck 304 of the substrate holder 303, the suction of the laminated substrate 102 by means of the substrate holder 303 can be assuredly stopped.

Figure 32:
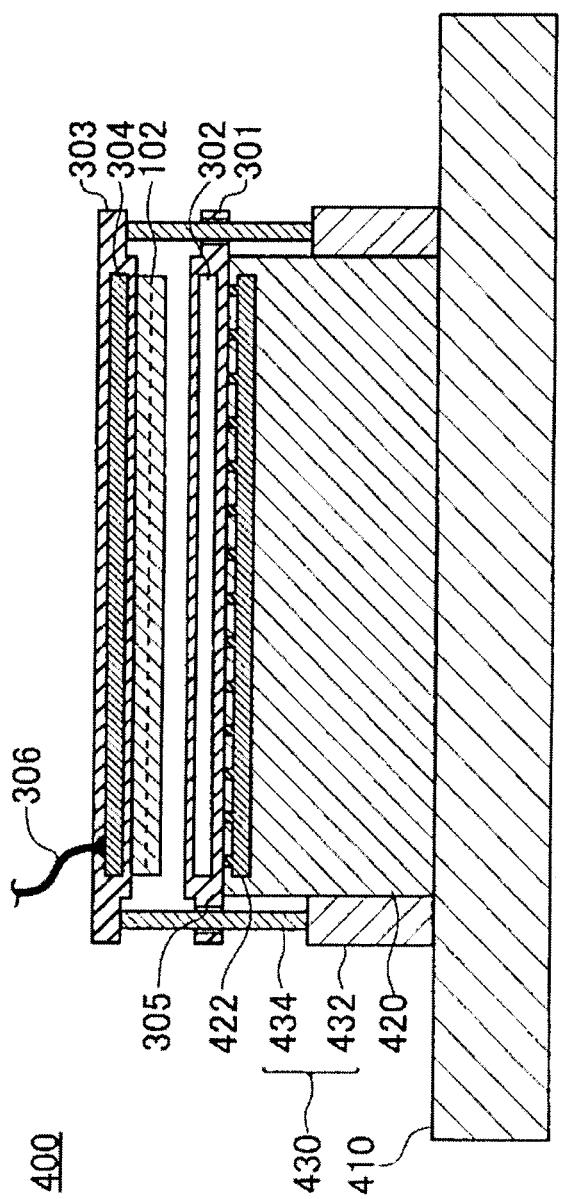
FIG. 32 is a sectional view showing an operation of a substrate separating apparatus 400.

FIG. 32 is a sectional view showing an operation of a substrate separating apparatus 400. The lift pin is raised again by operating the actuator 432, while keeping the suction by the electrostatic chuck 304 and the vacuum chuck 422, thereby raising the upper substrate holder 303 once again.

During this process, the laminated substrate 102 is suctioned by the upper substrate holder 303, and so the laminated substrate 102 will be elevated together with the upper substrate holder 303, so as to be separated from the lower substrate holder 301. Therefore, the laminated substrate 102 can be carried out independently by stopping the suction of the electrostatic chuck 304 after inserting the loader or the like below the laminated substrate 102 in the illustrated state.

In this way, the substrate separating apparatus 400 does not have any structure mounted above the upper substrate holder 303, and so it is possible to easily create a vertically smaller substrate separating apparatus 400. Such a small substrate separating apparatus 400 is preferable when it should be accommodated in the load lock 200 or the like.

Figure 33:
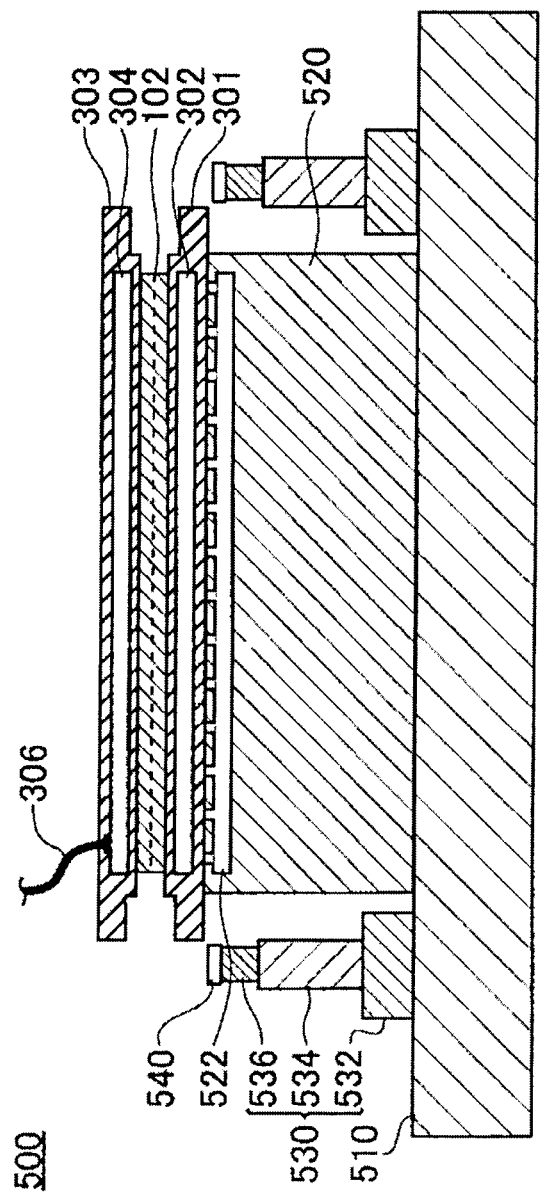
FIG. 33 is a sectional view of a structure of a substrate separating apparatus 500.

FIG. 33 is a sectional view showing another structure of a substrate separating apparatus 500. The substrate separating apparatus 500 includes a bottom plate 510, as well as a table 520 and a Z driving section 530 mounted on the bottom plate 510. The laminated substrate 102 and the substrate holders 301, 303 are laminated sequentially on the upper surface of the table 520.

The substrate holders 301, 303 include electrostatic chucks 302, 304 capable of independently being operated or stopped. In view of this, a power supply line 306 is provided to supply power to the electrostatic chuck 304 of the upper substrate holder 303.

The table 520 includes a vacuum chuck 522 for suctioning the substrate holder 301 mounted on its upper surface. The Z driving section 530 is provided on the side of the table 520, and includes a rotation actuator 532, an elevator actuator 534 and a lift rod 536. The rotation actuator 532 rotates the elevator actuator 534 and the lift rod 536 around the rotation axis vertical to the bottom plate 510. The elevator actuator 534 raises or lowers the lift rod 536 vertically with respect to the bottom plate 510.

Note that the load that the lift rod 536 is subject to is not so different from the load onto the lift pin 434 of the substrate separating apparatus 400 shown in FIG. 29. However, a stress is exerted onto the lift rod 536 functioning as a bending stress.

Therefore, compared with the lift pin 434, the lift rod 536 should desirably have larger bending rigidity.

A horizontal plate 540 is provided on the upper edge of the lift rod 536. The horizontal plate 540 has a width close to the diameter of the lift rod 536, in the illustrated state. However, as detailed later, the horizontal plate 540 has a larger size in the direction orthogonal to the paper in which the drawing is drawn. Therefore, when operating the rotation actuator 532, the size in the widthwise direction viewable in the drawing gets larger.

Figure 34:
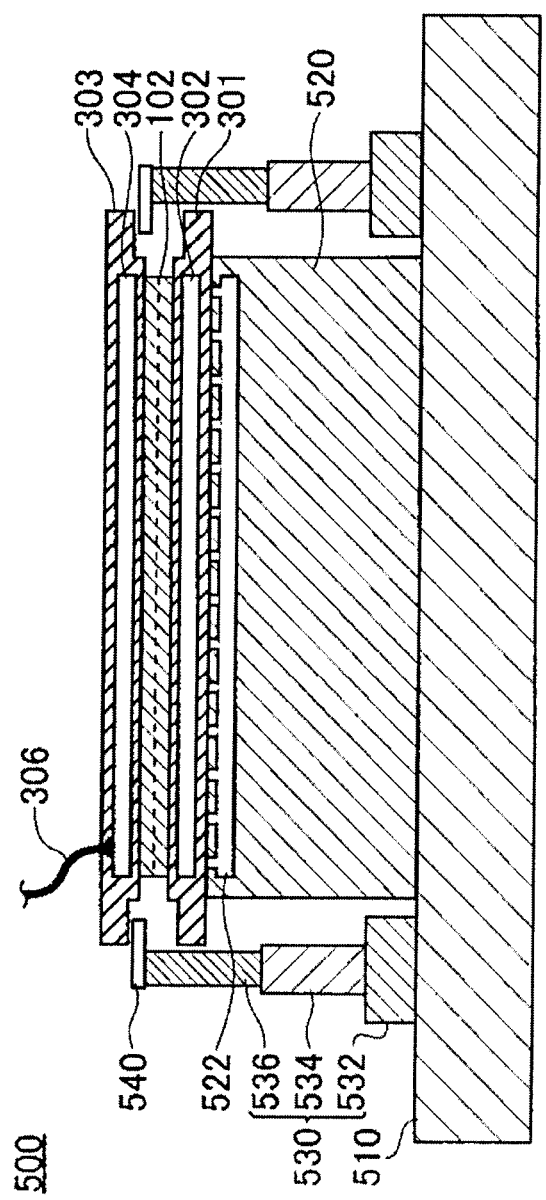
FIG. 34 is a sectional view showing an operation of a substrate separating apparatus 500.

FIG. 34 is a sectional view showing an operation of a substrate separating apparatus 500. As shown in this drawing, the lift rod 536 is elevated by operating the elevator actuator 534. Accordingly, the horizontal plate 540 provided on the upper edge of the lift rod 536 is elevated to the height between the pair of substrate holders 301, 303.

Next, the rotation actuator 532 is used to rotate the elevator actuator 534 and the lift rod 536. Accordingly, one end of the horizontal plate 540 is inserted between the substrate holders 301, 303 at the edge of the substrate holders 301, 303. This configuration enables the upper substrate holder 303 to be raised when the lift rod 536 is raised.

Figure 35:
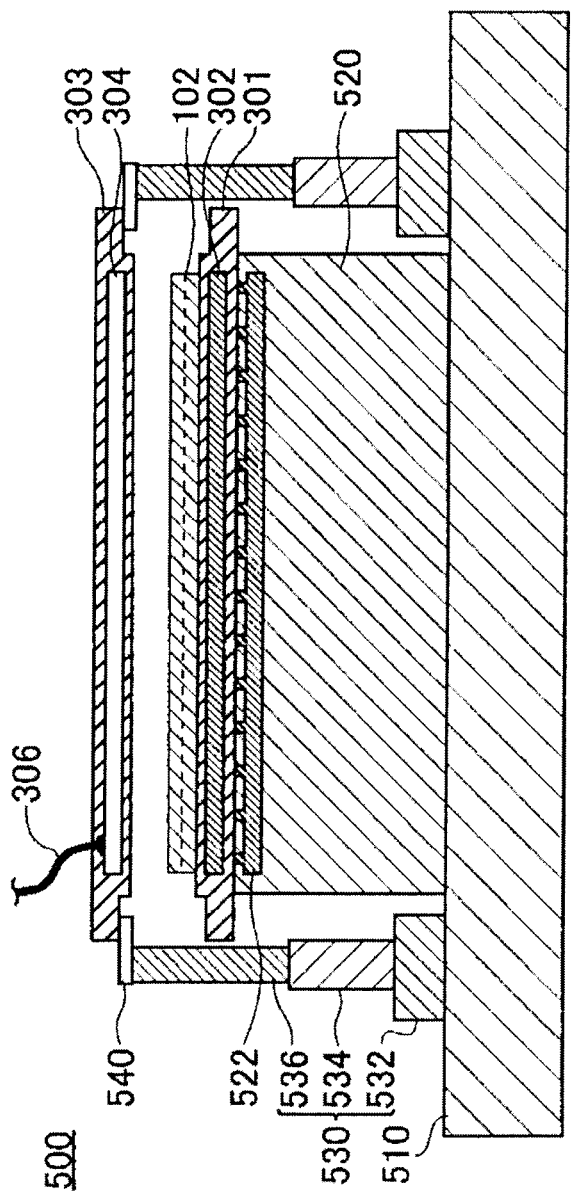
FIG. 35 is a sectional view of a structure of a substrate separating apparatus 500.

FIG. 35 is a sectional view showing the subsequent operation of the substrate separating apparatus 500. As shown in this drawing, the elevator actuator 534 is operated to raise the lift rod 536 by keeping operating the vacuum chuck 522 of the table 520 and the electrostatic chuck 302 of the lower substrate holder 301. Accordingly, the horizontal plate 540 at the upper end of the lift rod 536 abuts against the lower surface of the upper substrate holder 303.

During this process, the lower substrate holder 301 is suctioned to the table 420. In addition, the laminated substrate 102 is suctioned by the lower substrate holder 301. Therefore, by further raising the lift rod 536 and the horizontal plate 540, the upper substrate holder 303 is separated from the laminated substrate 102 and lifted up.

Figure 36:
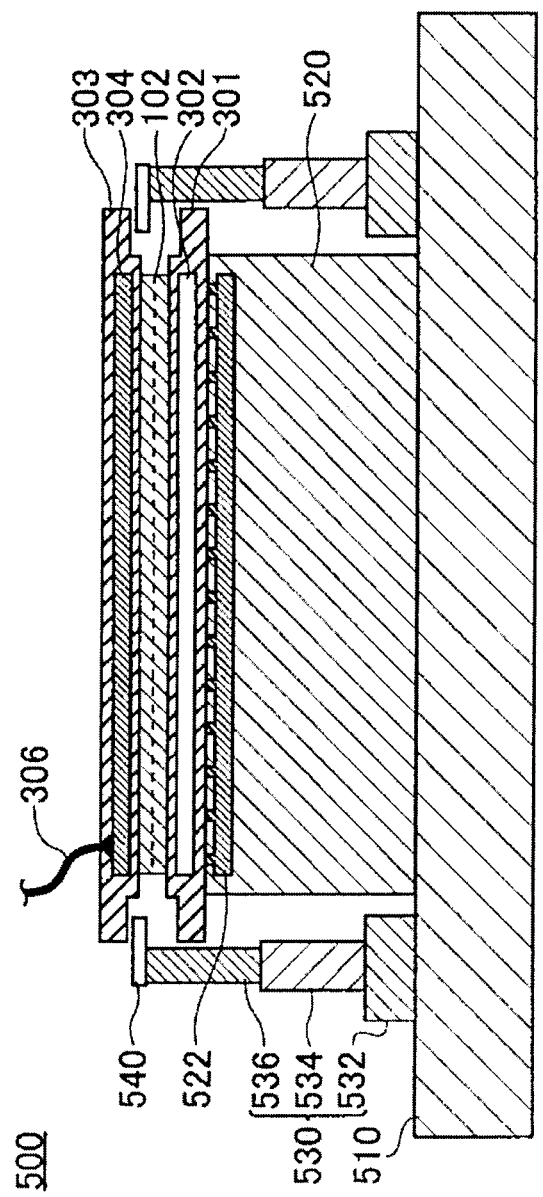
FIG. 36 is a sectional view showing an operation of a substrate separating apparatus 500.

FIG. 36 is a sectional view showing the following operation of a substrate separating apparatus 500. As shown in this drawing, the elevator actuator 534 is used to lower the lift rod 536, thereby lowering the upper substrate holder 303. As a result, the upper substrate holder 303 will abut against the upper surface of the laminated substrate 102 and is brought back in tight contact to it.

Next, the suction of the laminated substrate 102 by the electrostatic chuck 302 of the lower substrate holder 301 is cancelled, while keeping effective the suction of the lower substrate holder 301 by the table 520 as well as the suction of the laminated substrate 102 by the upper substrate holder 303. Accordingly, the laminated substrate 102 once separated will be suctioned by the upper substrate holder 303 again to be in tight contact thereto.

Note that the laminated substrate 102 has been already separated from the upper substrate holder 303. Therefore, the attachment of the laminated substrate 102 and the upper substrate holder 303 due to pressurization by the pressurizing apparatus 130 has been cancelled. Therefore, when the operation of the electrostatic chuck 304 is stopped, the suction of the laminated substrate 102 by means of the substrate holder 303 can be assuredly stopped.

Figure 37:
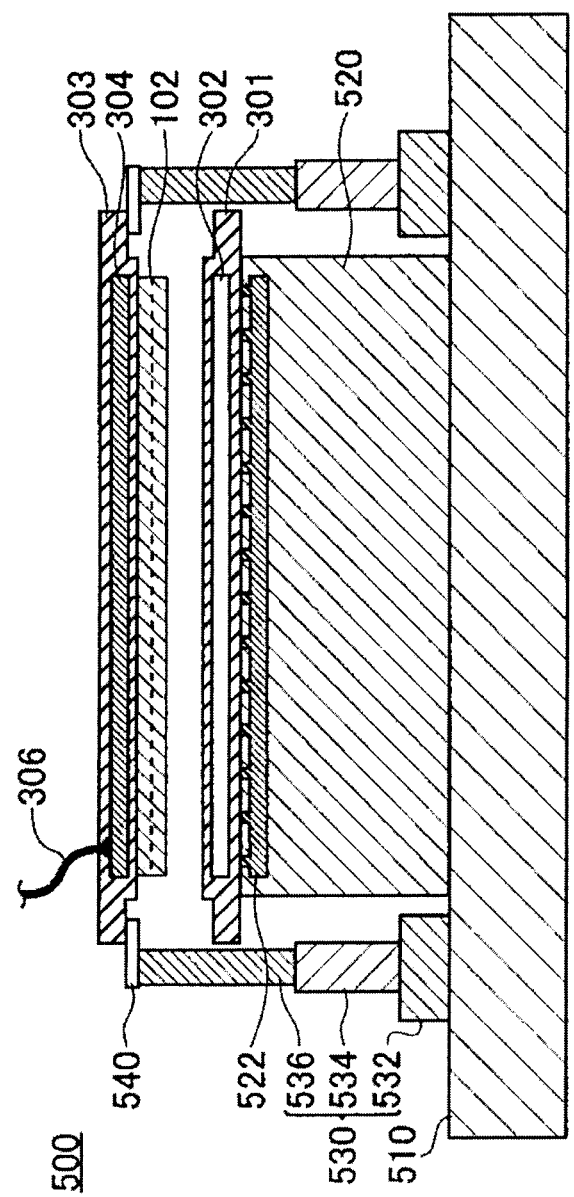
FIG. 37 is a sectional view showing an operation of a substrate separating apparatus 500.

FIG. 37 is a sectional view of the subsequent operation of the substrate separating apparatus 500. The upper substrate holder 303 is lifted again to be elevated by the horizontal plate 540, by elevating the lift rod 536 using the elevator actuator 534 while maintaining the suction of the laminated substrate 102 by the electrostatic chuck 304 of the upper substrate holder 303.

During this process, the laminated substrate 102 is suctioned by the electrostatic chuck 304 of the upper substrate holder 303. The lower substrate holder 301, however, is suctioned by the vacuum chuck 522 of the table 520. Therefore, the laminated substrate 102 is separated from the lower substrate holder 303, thereby stopping the fixation therebetween. Accordingly, the laminated substrate 102 can be carried out independently by stopping the suction of the substrate holder 303 by inserting the loader or the like below the laminated substrate 102 in the illustrated state.

In this way, the substrate separating apparatus 500 also does not have any structure mounted above the upper substrate holder 303. Therefore, it is also possible to create a vertically smaller substrate separating apparatus 500. Such a small substrate separating apparatus 500 is preferable when it should be accommodated in the load lock 200 or the like.

By using the lift rod 536 with the horizontal plate 540, even substrate holders 301, 303, which do not have any through holes 305, can separate the laminated substrate 102. Therefore, the usability of the substrate separating apparatus 500 improves, as well as contributing to reduction in cost of the substrate holders 301, 303.

Figure 38:
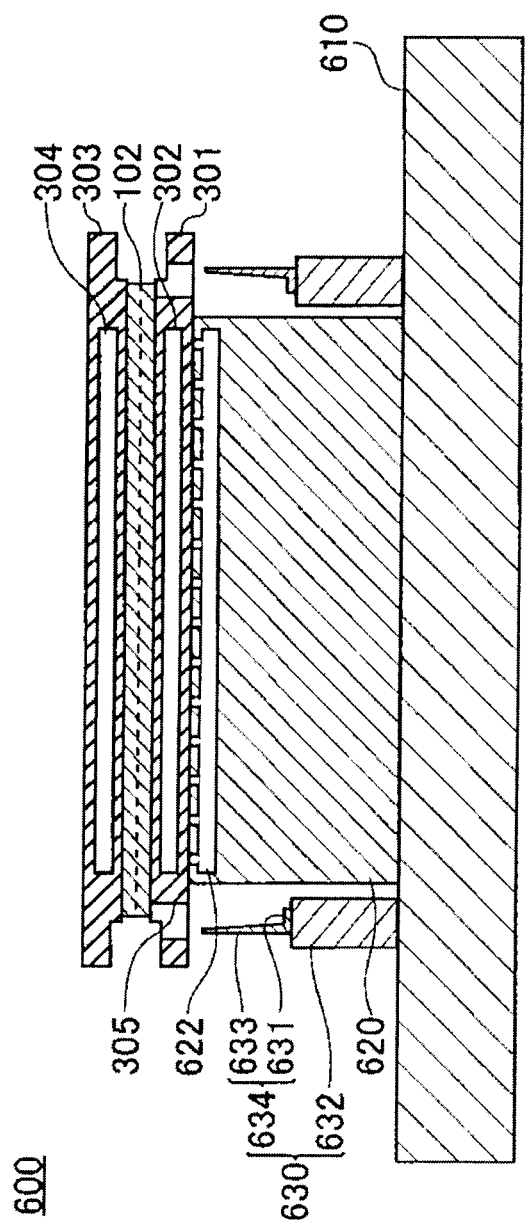
FIG. 38 is a sectional view of a structure of a substrate separating apparatus 600.

FIG. 38 is a sectional view of another structure of the substrate separating apparatus 600. The substrate separating apparatus 600 includes a bottom plate 610, as well as a table 620 and a Z driving section 630 mounted on the bottom plate 610. On the upper surface of the table 620, the laminated substrate 102 and the substrate holders 301, 303 are stacked sequentially.

The substrate holders 301, 303 include electrostatic chucks 302, 304 capable of independently operating and stopping. However in this embodiment, the upper substrate holder 303 is not provided with any electrostatic chuck 304. Therefore, there is no need to provide a mechanism to supply power to the electrostatic chuck 304.

The table 620 includes a vacuum chuck 622 for suctioning the substrate holder 301 mounted on its upper surface. The Z driving section 630 is provided on the side of the table 620, and includes a rotation actuator 632 and a lift pin 634. The lift pin 634 includes a wafer supporting section 631 and a holder supporting section 633.

The actuator 632 raises or lowers the lift pin 634 vertically with respect to the bottom plate 510. The upper end of the lift pin 634 also functions as the holder supporting section 633. On the contrary, the wafer supporting section 631 is formed as a horizontal plane midway through the lift pin 634. Therefore, the lift pin 634 changes its width after the wafer supporting section 631. In addition, the wafer supporting section 631 is provided to position inside the periphery of the laminated substrate 102.

Note that at least the lower substrate holder 301 has a through hole 305 penetrating in the thickness direction. The through hole 305 is provided in the region including the edge of the laminated substrate 102 sandwiched between the substrate holders 301, 303.

Figure 39:
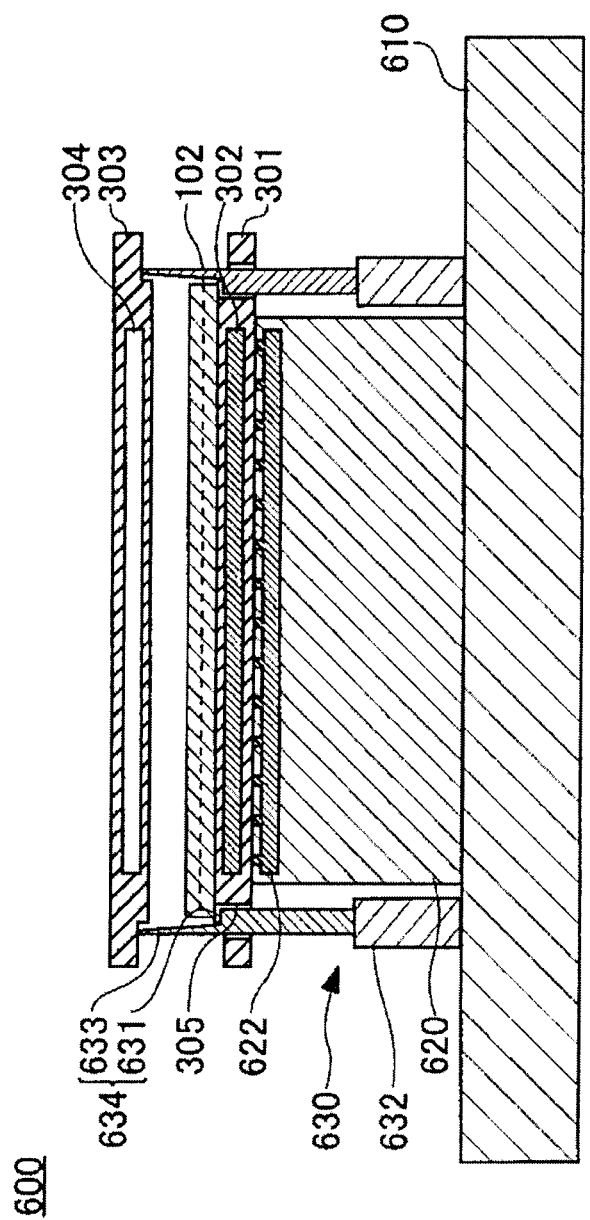
FIG. 39 is a sectional view showing an operation of a substrate separating apparatus 600.

FIG. 39 is a sectional view showing an operation of a substrate separating apparatus 600. As shown in the drawing, the vacuum chuck 622 of the lower table 620 and the electrostatic chuck 302 of the lower substrate holder 301 are first operated. By doing so, the lower stage 330 suctions the lower substrate holder 301. The lower substrate holder 301 suctions the laminated substrate 102.

Next, by keeping the aforementioned suction state, the lift pin 634 is lifted up by operating the actuator 632. The holder supporting section 633 of the lifted lift pin 634 goes up in the through hole 305, passes the side of the laminated substrate 102, and eventually reaches the lower surface of the upper substrate holder 303 When the lift pin 634 is further raised, the upper substrate holder 303 is lifted up by the lift pin 634.

During this process, the laminated substrate 102 is suctioned by the table 620 via the lower substrate holder 301. Therefore, the upper substrate holder 303 can be separated from the laminated substrate 102. Note that the elevation of the lift pin 634 stops immediately before the wafer supporting section 631 reaches the lower surface of the laminated substrate 102.

Figure 40:
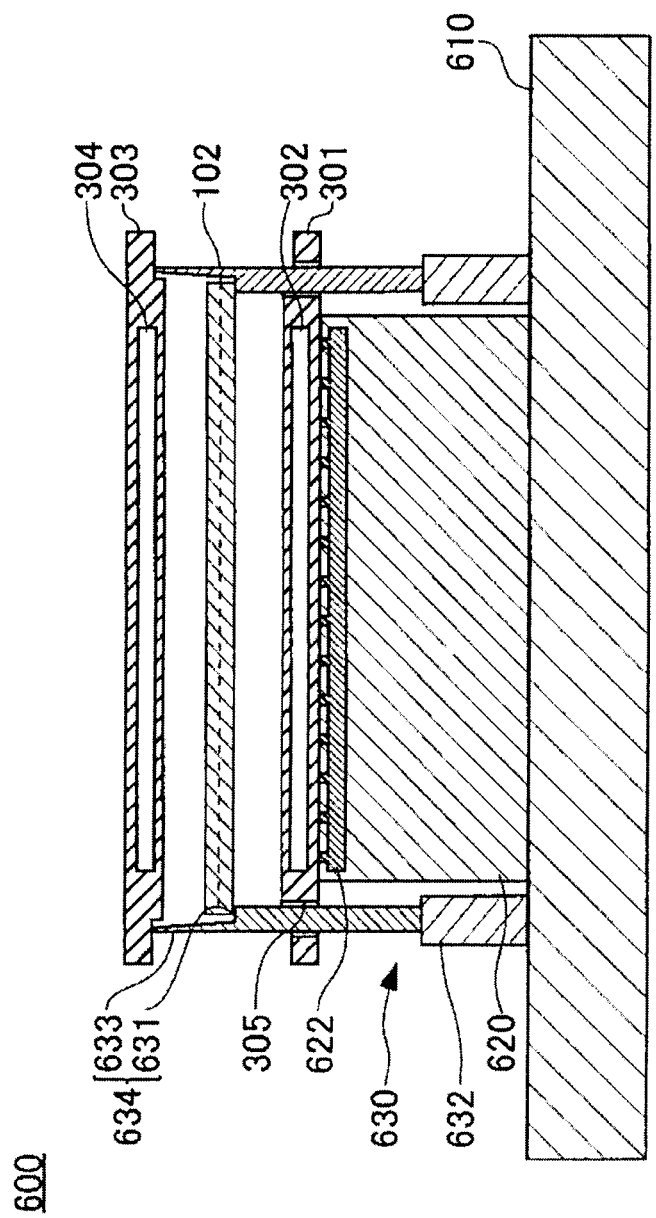
FIG. 40 is a sectional view showing an operation of a substrate separating apparatus 600.

FIG. 40 is a sectional view showing the subsequent operation of the substrate separating apparatus 600. As shown in this drawing, when the upper substrate holder 303 is separated from the laminated substrate 102, the operation of the electrostatic chuck 302 of the lower substrate holder 301 is stopped.

When the suction force by the electrostatic chuck 302 is stopped, the actuator 632 is operated again, to further raise the lift pin 634. By doing so, the wafer supporting section 631 of the lift pin 634 abuts against the lower surface of the laminated substrate 102. By further elevating the lift pin, the laminated substrate 102 will be eventually elevated by being lifted up by the lift pin 634.

During this process, the lower substrate holder 301 is suctioned by the table 620. This means that the substrate holder 301 is or can be separated from the laminated substrate 102. The portion of the lift pin 634 above the wafer supporting section 631 can also function as a fence preventing the lifted laminated substrate 102 from falling off from the wafer supporting section 631.

Note that in the drawing, the upper substrate holder 303 and the laminated substrate 102 are simultaneously mounted to the lift pin 634. It is alternatively possible, however, to carry out the upper substrate holder 303 from the substrate separating apparatus 600, at the timing when the upper substrate holder 303 is separated from the laminated substrate 102. This measure can help reduce the load on the actuator 632.

As seen above, the substrate separating apparatus 600 does not have any structure mounted above the upper substrate holder 303. Therefore, it becomes possible to create a smaller substrate separating apparatus 600. Another advantage is that the laminated substrate 102 can be isolated by consecutively operating the lift pin 634. This is advantageous because the time required for separating a substrate can be reduced, to contribute to improvement in throughput of the substrate bonding apparatus 100.

Figure 41:
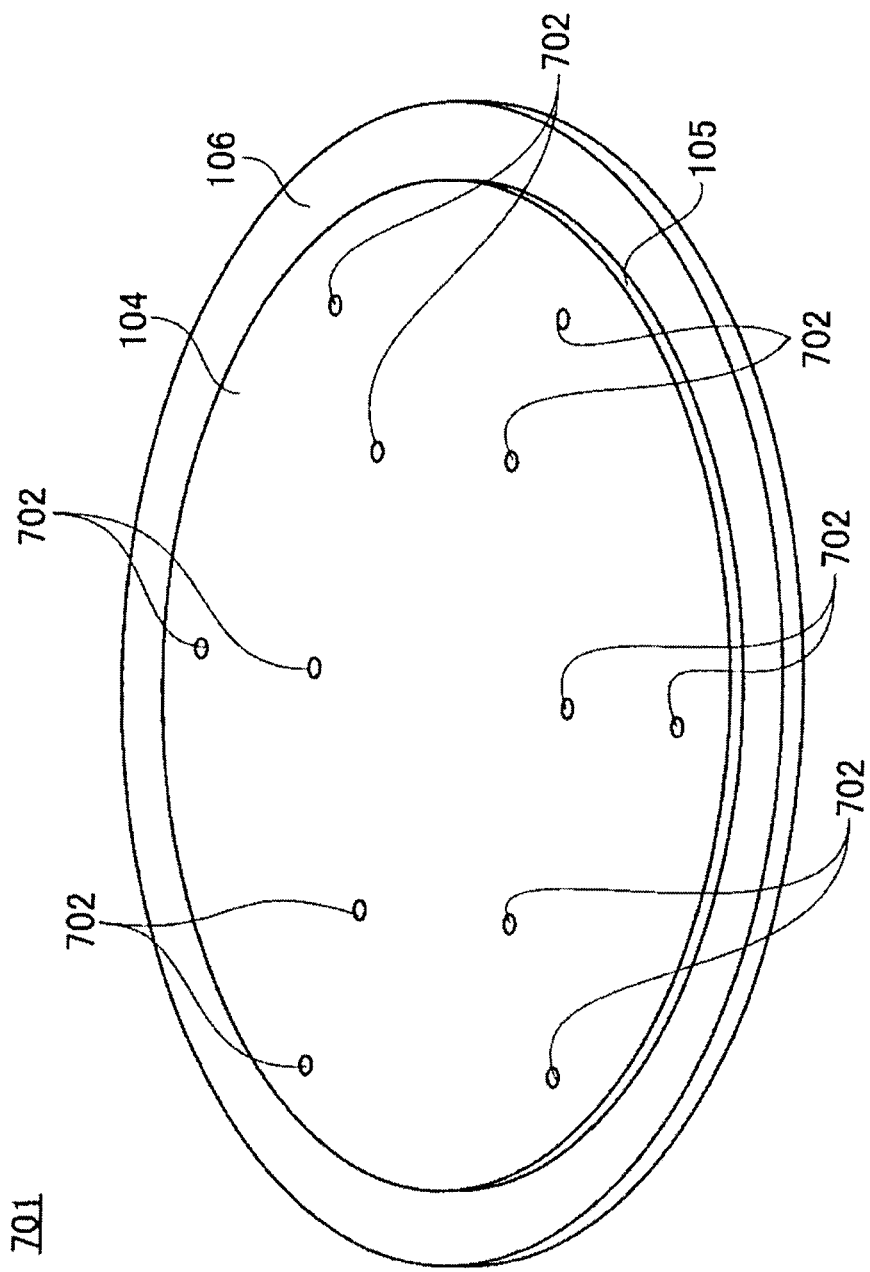
FIG. 41 is a perspective view of looking down a substrate holder 701.

FIG. 41 is a perspective view of looking down a substrate holder 701. The substrate holder 701 includes a holding surface 104, a flange section 106, and an aeration hole 702.

The overall shape of the substrate holder 701 is a disk, and has a flat holding surface 104 for holding the substrate 101 in its center. The flange section 106 circumscribes and is adjacent to the holding surface 104. The flange section 106 is thinner than the holding surface 104, and a step 105 is formed between the holding surface 104 and the flange section 106.

Each of the plurality of aeration holes 702 is open at the holding surface 104. Each of the aeration holes 702 is illustrated in the drawing to be visible to the human eyes. However, the aeration hole 702 should preferably have a smaller inner diameter for the purpose of maintaining the flatness of the holding surface 104, as long as the inner diameter allows communication of gas such as dry air or nitrogen.

Figure 42:
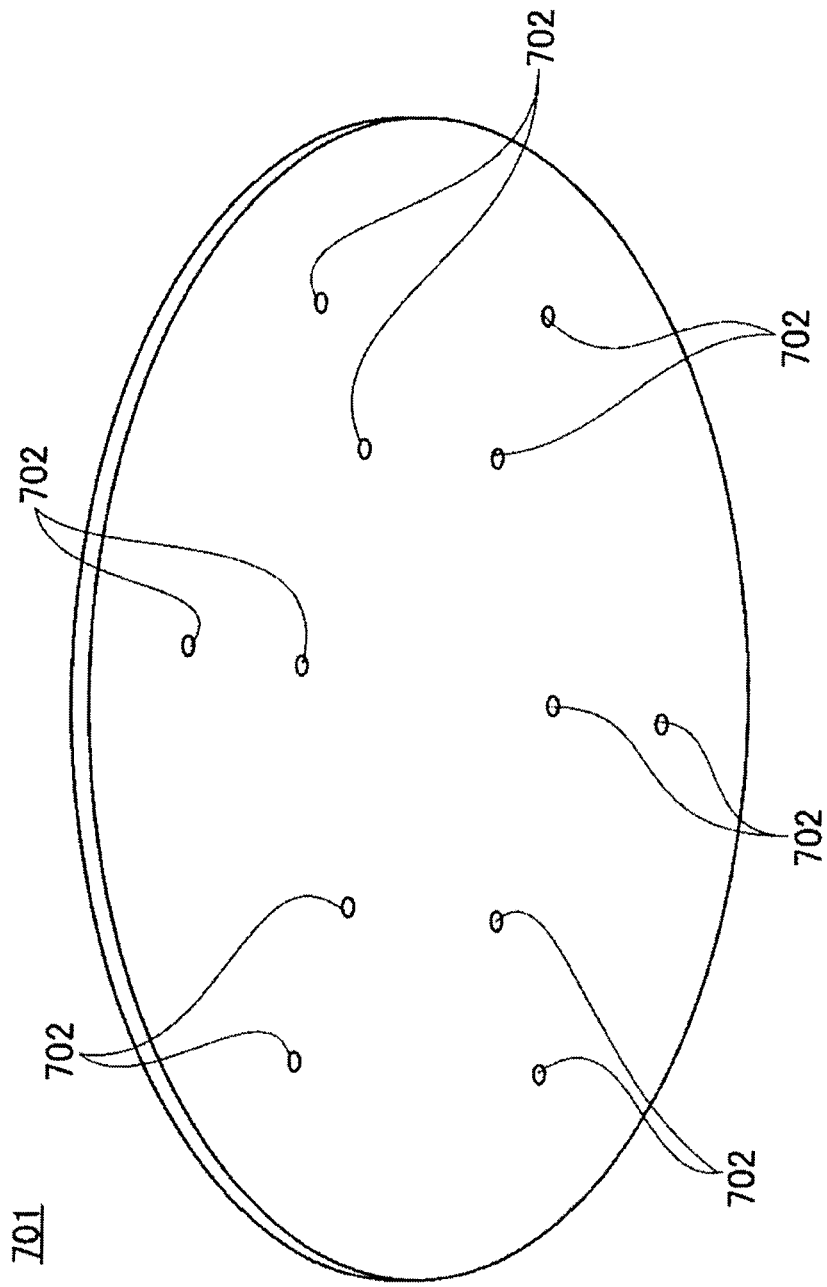
FIG. 42 is a perspective view of looking up a substrate holder 701.

FIG. 42 is a perspective view of looking up the substrate holder 701 from below. Each of the aeration holes 702 opens also through the lower surface of the substrate holder 701. In other words, each of the aeration holes 702 is formed to penetrate from the front to the rear of the substrate holder 701 of the holding surface 104.

Figure 43:
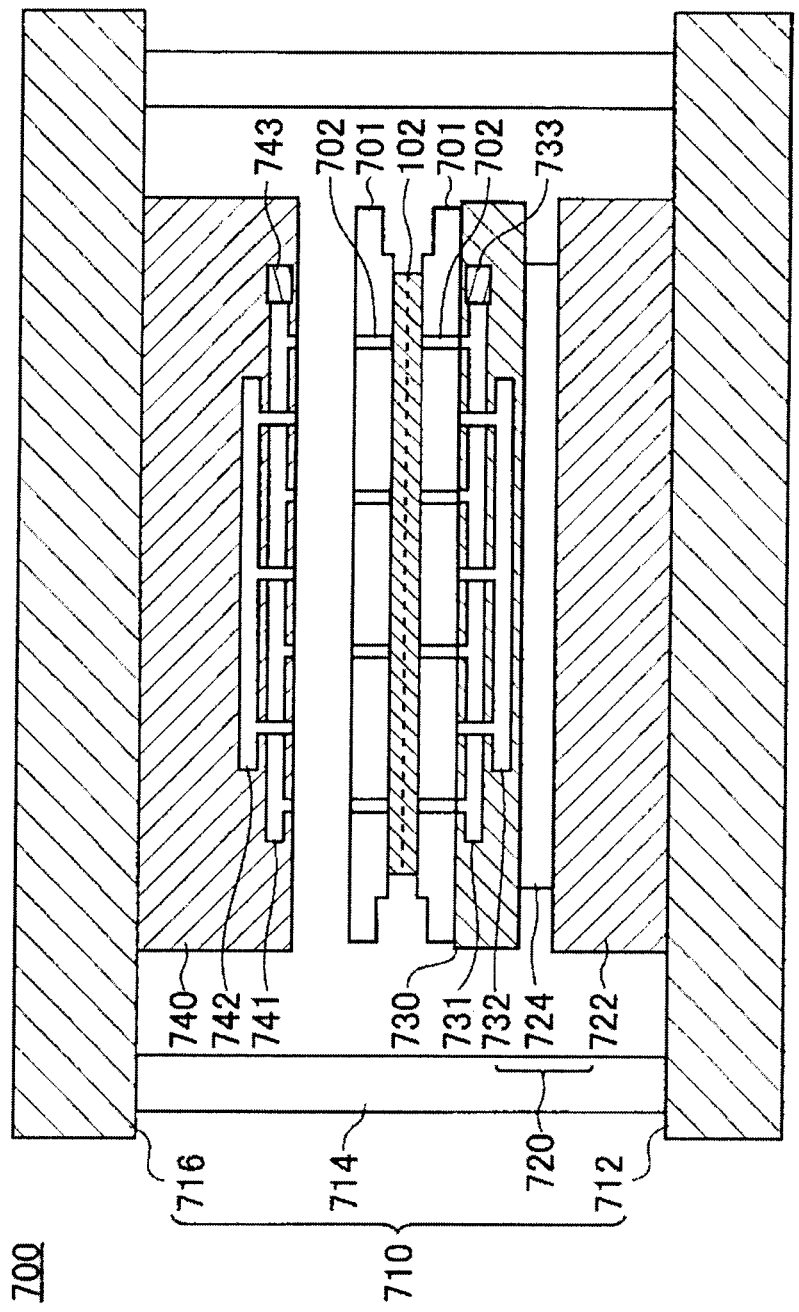
FIG. 43 is a sectional view of a structure of a substrate separating apparatus 700.

FIG. 43 is a sectional view showing another structure of the substrate separating apparatus 700. The substrate separating apparatus 700 includes a frame 710, a Z driving section 720 provided inside the frame 710, as well as a lower stage 730 and an upper stage 740.

The frame 710 includes a bottom plate 712 and a top plate 716, each of which is horizontal and parallel to the other, and a plurality of supporting columns 714 for coupling the bottom plate 712 to the top plate 716. All the bottom plate 712, the supporting columns 714, and the top plate 716 have high rigidity, to resist deformation even when subject to the reactive force in response to the separation of the laminated substrate 102.

A lower stage 730 is provided on the upper surface of the bottom plate 712 with the X driving section 720 therebetween. The Z driving section 720 includes a cylinder 722 fixed to the bottom plate 712 as well as a piston 724 operable to move up and down in the vertical direction from the cylinder 722. The lower stage 730 is fixed to the upper end of the piston 724. Accordingly, the lower stage 730 can be raised and lowered with respect to the bottom plate 712.

The lower stage 730 includes a vacuum chuck 732 and an air passage 731. The vacuum chuck 732 suctions and holds a flat object mounted on the upper surface of the lower stage 730 when subjected to a negative pressure.

In addition to a function of the vacuum chuck 732 when receiving the negative pressure, the air passage 731 can discharge the pressurized operating fluid (e.g., pressurized air) from the upper surface of the lower stage 730. Exemplary operating fluids, other than dry air, are inert gasses such as nitrogen gas, argon gas.

In addition, the air passage 731 includes a pressure sensor 733 for detecting the internal pressure of the air passage 731. The pressure sensor 733 enables to detect, from outside, the incidence that the supplied operating fluid has flown out of the air passage 731.

An upper stage 740 is suspended from the lower surface of the top plate 716. The upper stage 740 includes a vacuum chuck 742 and an air passage 741 on its lower surface. The vacuum chuck 742 suctions and holds a flat object onto the lower surface of the upper stage 740 when supplied a negative pressure.

In addition to a function of the vacuum chuck 742 when receiving the negative pressure, the air passage 741 can also exhaust the operating fluid from the lower surface of the upper stage 740 when supplied with the pressurized operating fluid. In addition, the air passage 741 includes a pressures sensor 743 for detecting the internal pressure of the air passage 741. Accordingly, when the supplied operating fluid is flown out of the air passage 741, the incidence can be detected from outside.

FIG. 44, FIG. 45, FIG. 46, FIG. 47, and FIG. 48 show the operation of the substrate separating apparatus 700 step by step. In these drawings, the elements common to FIG. 43 are assigned the same reference numerals, and overlapping explanations thereof may be omitted. In addition, in these drawings and FIG. 43, the laminated substrate 102 and a pair of substrate holders 701 sandwiching the laminated substrate 102 are assumed to have been already mounted to the substrate separating apparatus 700.

Figure 44:
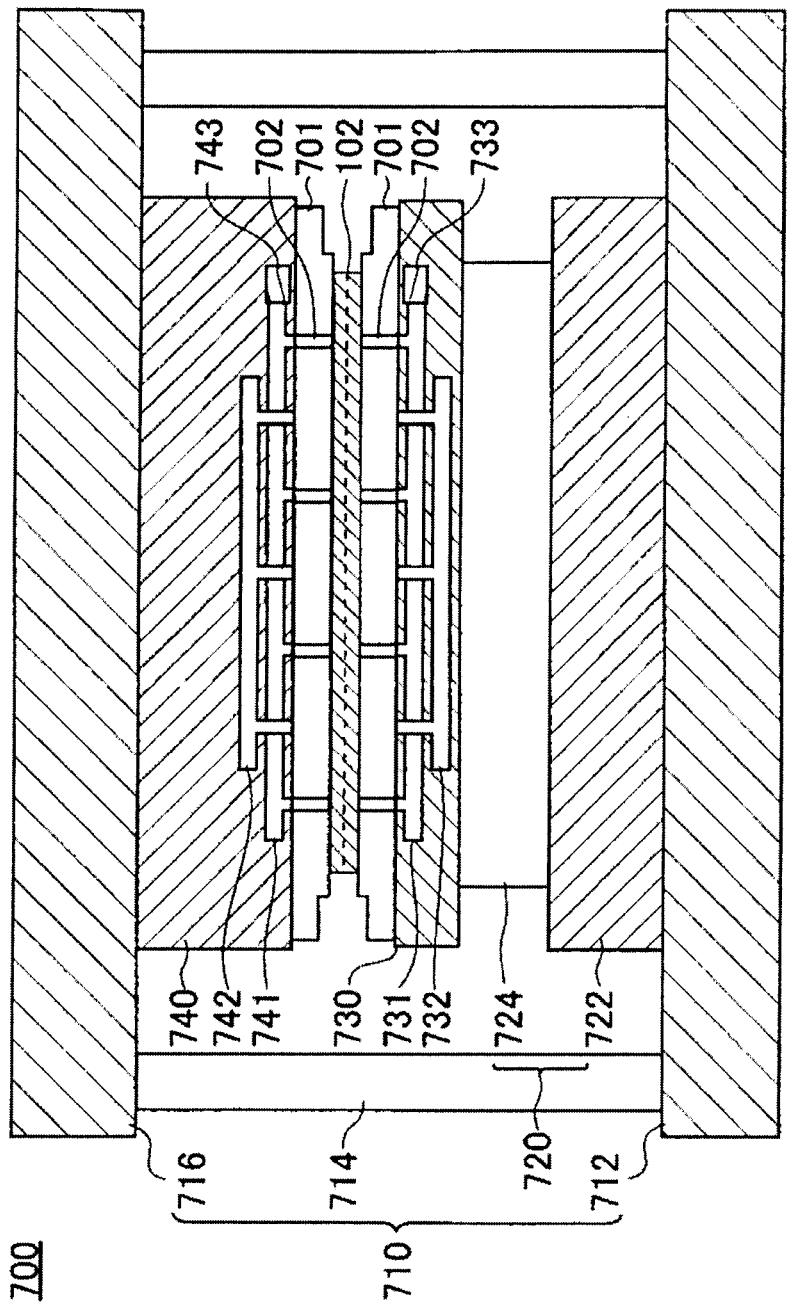
FIG. 44 is a sectional view showing an operation of a substrate separating apparatus 700.

FIG. 44 is a sectional view showing the operation of the substrate separating apparatus 700. As shown in this drawing, the piston 724 is raised from the cylinder 722, thereby raising the lower stage 730, as well as raising the laminated substrate 102 and the substrate holder 701. By doing as aforementioned, the rear surface (upper surface) of the upper substrate holder 303 abuts against the upper stage 740 to make tight contact therewith.

Figure 45:
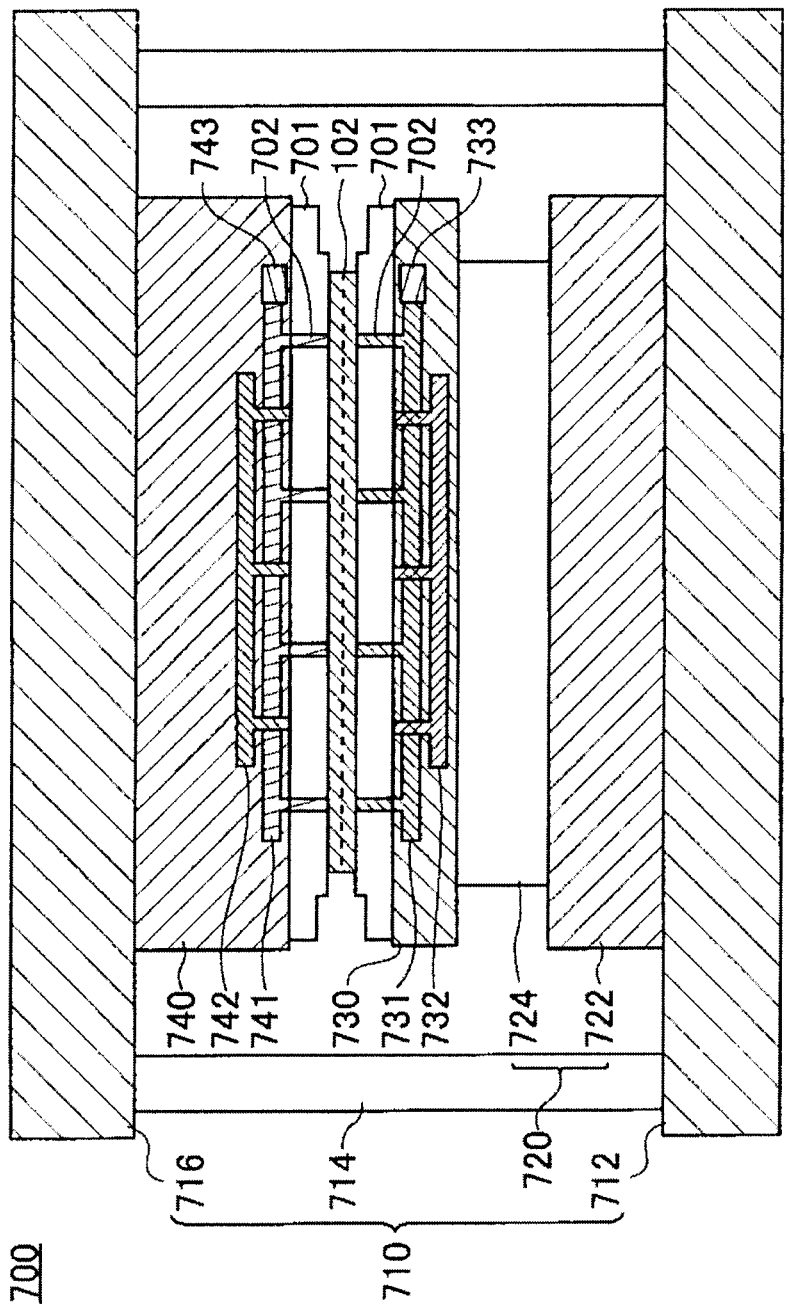
FIG. 45 is a sectional view showing an operation of a substrate separating apparatus 700.

FIG. 45 is a sectional view of the subsequent operation of the substrate separating apparatus 700. In this stage, the vacuum chuck 732 of the lower stage 730 operates, to hold the lower substrate holder 701 to the lower stage 730.

A negative pressure is also supplied to the air passage 731 of the lower stage 730. The negative pressure of the air passage 731 suctions the lower surface of the laminated substrate 102 via the aeration hole 702 of the substrate holder 701. By this arrangement, the laminated substrate 102 can also be held by the lower stage 730. Note that while suctioning the laminated substrate 102, the pressure sensor 733 keeps detecting the negative pressure.

In the upper stage 740, the negative pressure continues to be supplied to the vacuum chuck 742. According to this arrangement, the upper stage 740 can suction and hold the upper substrate holder 701. On the other hand, a pressurized operating fluid is supplied to the air passage 741 of the upper stage 740. The pressure of the operating fluid affects the upper surface of the laminated substrate 102 via the aeration hole 702 of the upper substrate holder 701. During this process, the pressure sensor 743 will detect the pressure of the pressure fluid.

In the meantime, the attachment of the laminated substrate 102 to the upper substrate holder 701 attributed to contamination welding or the like will be broken due to the pressure of the operating fluid applied onto the laminated substrate 102. During this process, the operating fluid flows out from the gap created between the substrate holder 701 and the laminated substrate 102, and so therefore the pressure sensor 743 detects the declining pressure in the air passage 741.

Figure 46:
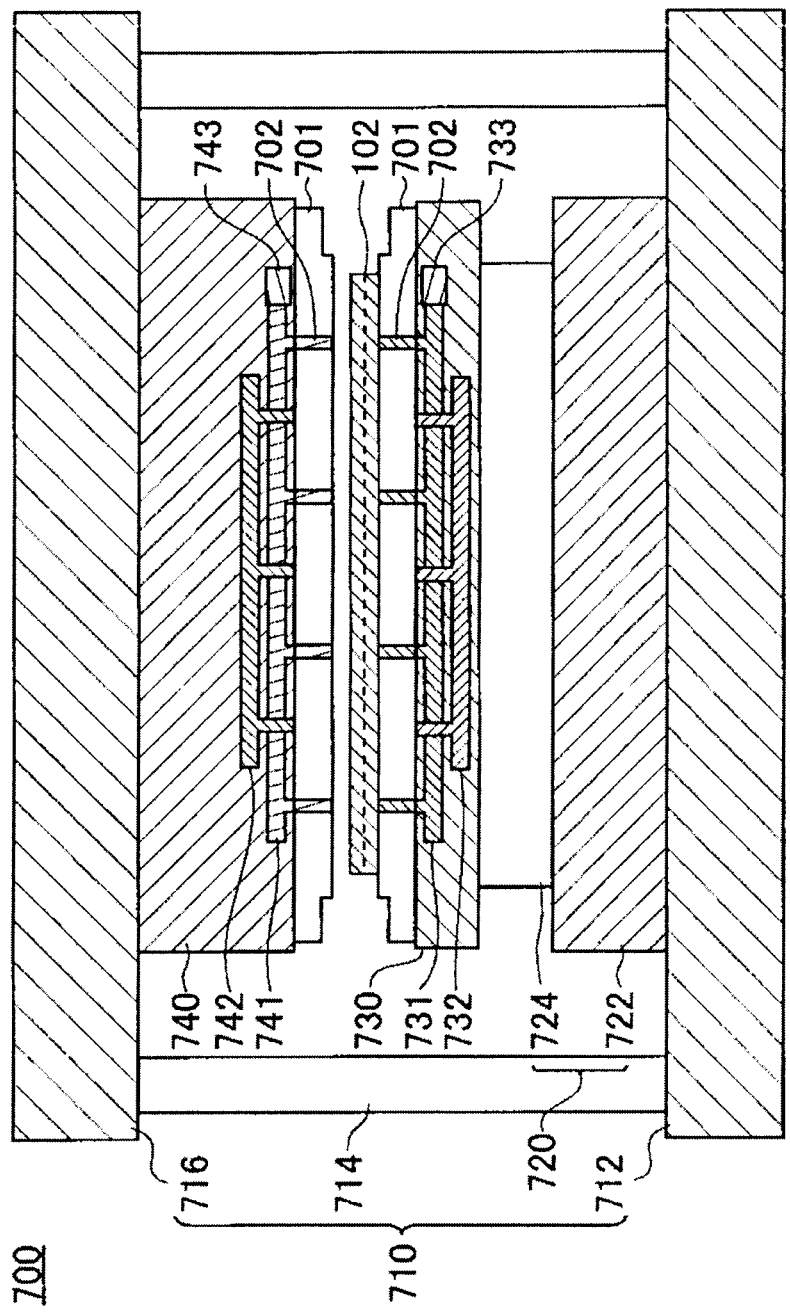
FIG. 46 is a sectional view showing an operation of a substrate separating apparatus 700.

FIG. 46 is a sectional view of the succeeding operation of the substrate separating apparatus 700. When the pressure sensor 743 has detected the declining pressure in the air passage 741, the cylinder 722 descends with respect to the piston 724, while keeping effective the suction of the substrate holder 701 by the vacuum chucks 732, 742, as well as the suction of the laminated substrate 102 by means of the negative pressure supplied via the air passage 731 and the aeration hole 702. This causes the lower stage 730 to be lowered too.

As a result, the pressure of the operating fluid is operated between the upper surface of the laminated substrate 102 and the lower surface of the upper substrate holder 701 via the air passage 741 and the aeration hole 702. Accordingly, the laminated substrate 102 will be pushed and peeled off from the upper substrate holder 701 by the operating fluid. The laminated substrate 102 separated from the substrate holder 701 in this way descends together with the lower substrate holder 701 suctioned by the lower stage 730.

On the contrary, the upper substrate holder 701 remains on the upper stage 740 by being suctioned by the vacuum chuck 742. In this way, the laminated substrate 102 is or can be separated from the upper substrate holder 701. Note that because the pressure of the operating fluid peels off the laminated substrate 102 from the upper substrate holder 701, the lower stage 730 and the lower substrate holder 701 can keep holding the laminated substrate 102 with only a slight suction force. The upper stage 740 can also keep holding the upper substrate holder 701 with a slight suction force.

The operating fluid may be kept supplied between the laminated substrate 102 and the substrate holder 701, even after the laminated substrate 102 is separated from the substrate holder 701. Accordingly, the contamination or the like exposed on the surfaces of the laminated substrate 102 and the substrate holder 701 can be blown off, to clean off the surface of the laminated substrate 102.

Figure 47:
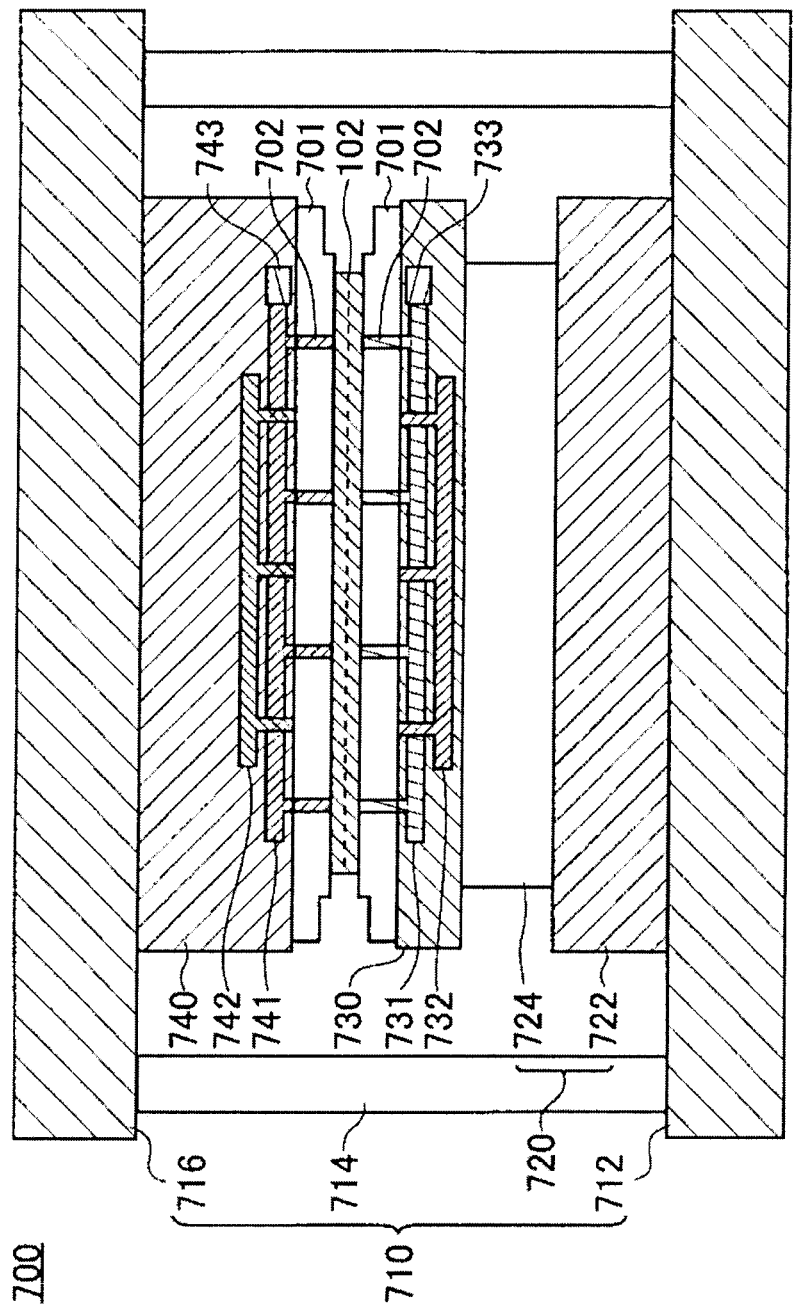
FIG. 47 is a sectional view showing an operation of a substrate separating apparatus 700.

FIG. 47 is a sectional view showing the following operation of the substrate separating apparatus 700. As shown in this drawing, the piston 724 is elevated again from the cylinder 722, to bring the laminated substrate 102 and the pair of substrate holders 701 in tight contact with the upper stage 740 again. Furthermore, the vacuum chuck 732 of the lower stage 730 and the vacuum chuck 742 of the upper stage 740 are respectively operated, to make the lower stage 730 and the upper stage 740 respectively hold the substrate holder 701.

To the air passage 731 of the lower stage 730, the pressurized operating fluid is supplied. Accordingly, the pressure sensor 733 will detect the presence of a high pressure of the pressurized operating fluid.

On the other hand, the air passage 741 of the upper stage is supplied with the negative pressure. According to this, the pressure of the operating fluid operates onto the lower surface of the laminated substrate 102, while the upper surface of the laminated substrate 102 is suctioned to the upper substrate holder 701.

In the meantime, the pressure of the operating fluid applied on the laminated substrate 102 will break the attachment of the laminated substrate 102 to the lower substrate holder 701 due to the contamination welding or the like. During this process, the operating fluid flows out from the gap created between the substrate holder 701 and the laminated substrate 102, and so the pressure sensor 733 detects the declining pressure in the air passage 741.

Figure 48:
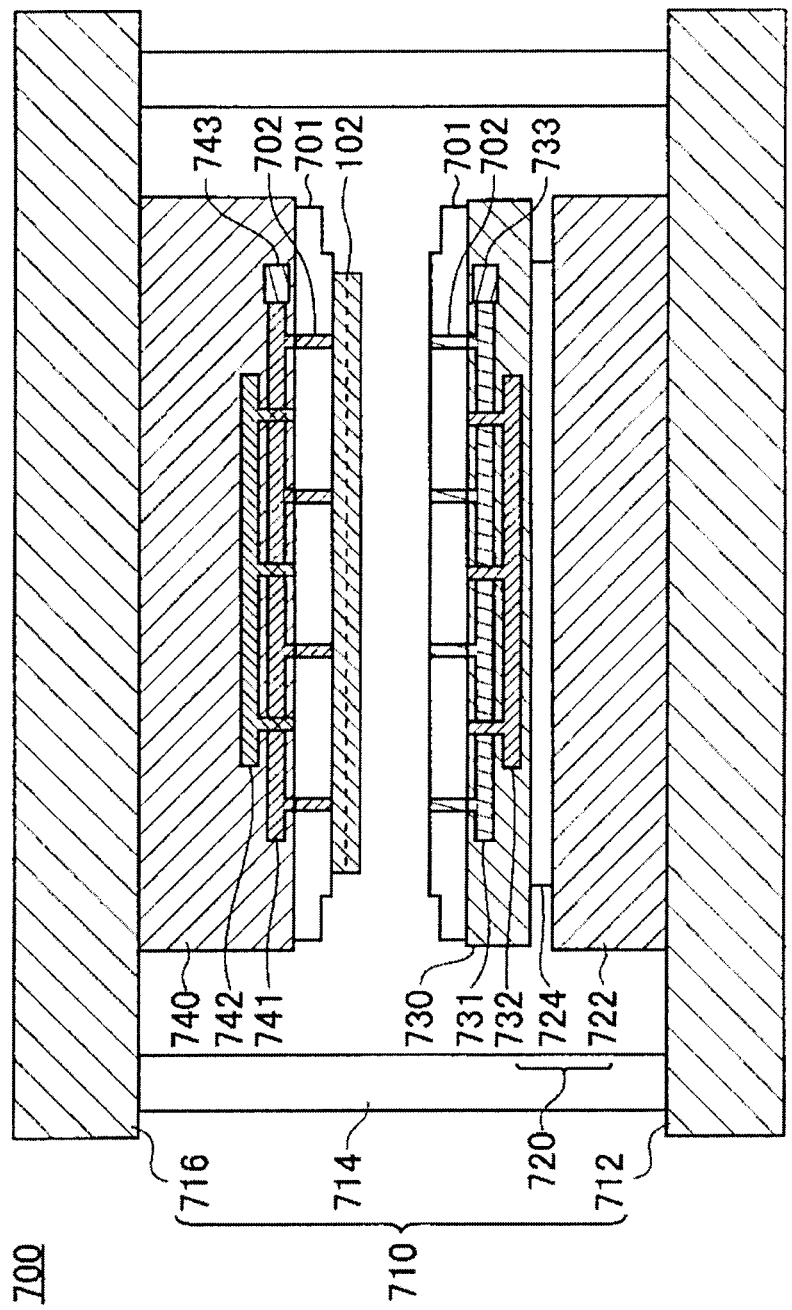
FIG. 48 is a sectional view showing an operation of a substrate separating apparatus 700.

FIG. 48 is a sectional view of the subsequent operation of the substrate separating apparatus 700. When the pressure sensor 733 has detected the declining pressure in the air passage 741, the cylinder 722 descends with respect to the piston 724, while keeping effective the suction of the substrate holder 701 by the vacuum chucks 732, 742, as well as the suction of the laminated substrate 102 by means of the negative pressure supplied via the air passage 731 and the aeration hole 702. As a result, the lower stage 730 descends.

As a result, the pressure of the operating fluid is operated between the lower surface of the laminated substrate 102 and the upper surface of the lower substrate holder 701 via the air passage 731 and the aeration hole 702. Accordingly, the laminated substrate 102 will be pushed and peeled off from the lower substrate holder 701 by the pressurized operating fluid. The laminated substrate 102 separated from the substrate holder 701 in this way ascends together with the upper substrate holder 701 suctioned by the upper stage 740.

The lower substrate holder 701 is suctioned to the vacuum chuck 732 and so remains on the lower stage 730. In this way, the laminated substrate 102 is separated from the lower substrate holder 701. Note that because the pressure of the operating fluid peels off the laminated substrate 102 from the lower substrate holder 701, the upper stage 740 and the upper substrate holder 701 can keep holding the laminated substrate 102 with only a slight suction force. The lower stage 730 can also keep holding the lower substrate holder 701 with a slight suction force.

In the state shown in the drawing, the lower surface of the laminated substrate 102 is already released, and so the loader or the like can be inserted below the laminated substrate 102. It is also possible to independently carry out the laminated substrate 102 from the substrate separating apparatus 700, by stopping the supply of the negative pressure to the upper air passage 741 and releasing the laminated substrate 102.

The operating fluid may be kept supplied between the laminated substrate 102 and the substrate holder 701, even after the laminated substrate 102 is separated from the substrate holder 701. Accordingly, the contamination or the like exposed on the surfaces of the laminated substrate 102 and the substrate holder 701 can be blown off, to clean off the surface of the laminated substrate 102.

Note that in the state of the drawing, the upper surface of the laminated substrate 102 is in tight contact with the lower surface of the upper substrate holder 701. However, at the stage shown in FIG. 46, the attachment of the laminated substrate 102 due to welding of contamination or the like has been cancelled.

Therefore, the laminated substrate 102 can be ensured to be carried out by breaking the attachment of the laminated substrate 102 due to the negative pressure.

In the above, the upper substrate holder 701 was explained to be separated first, and then the lower substrate holder 701. However, it is needless to say that the order of separation may be reversed to separate the lower substrate holder 701 first, and then the upper substrate holder 701.

Furthermore, the suction of the substrate holder 701 to the lower stage 730 and the upper stage 740 can also be pursued by other means than the vacuum chucks 732, 742. Other structures such as an electrostatic chuck can also be used. In addition, although not shown in the drawings, lift pin(s) for lifting up the substrate holder 701 from the lower stage 730 may also be formed, for the purpose of help carry out the lower substrate holder 701 remaining after the laminated substrate 102 has been carried out.

Figure 49:
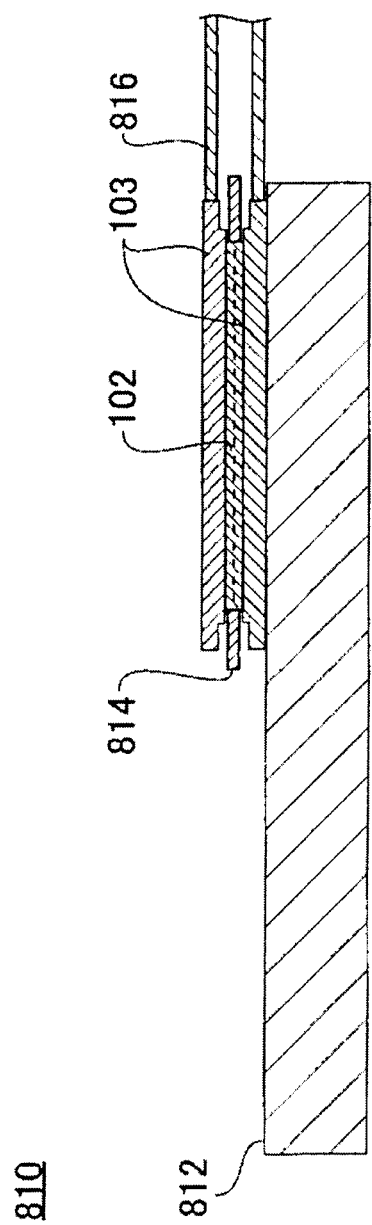
FIG. 49 is a sectional view schematically showing the structure of a separating apparatus 810.

FIG. 49 is a sectional view schematically showing the structure of the other separating apparatus 810. The separating apparatus 810 includes a slide table 812, a side clamper 814, and a holder pusher 816. In this separation apparatus 810, a pair of substrate holders 103 sandwiching a laminated substrate 102 are mounted on the upper surface of the slide table 812.

The upper surface of the slide table 812 is flat and smooth, so as not to interfere with the sliding movement of the substrate holder 103 mounted thereon. In addition, none of the upper surface of the slide table 812 and the lower surface of the substrate holder 103 will be damaged.

The side clamper 814 sandwiches and holds the side surface of the laminated substrate 102 situated between the substrate holders 103. Here, the slide clamper 814 does not come in direct contact with the substrate holders 103.

As opposed to such a configuration of the side clamper 814, the holder pusher 816 has a biforked edge, which is abutted against the side surface of the substrate holder 103. Accordingly, the holder pusher 816 can push the side of the substrate holders 103, without abutting to the side surface of the laminated substrate 102 or to the side clamper 814.

Figure 50:
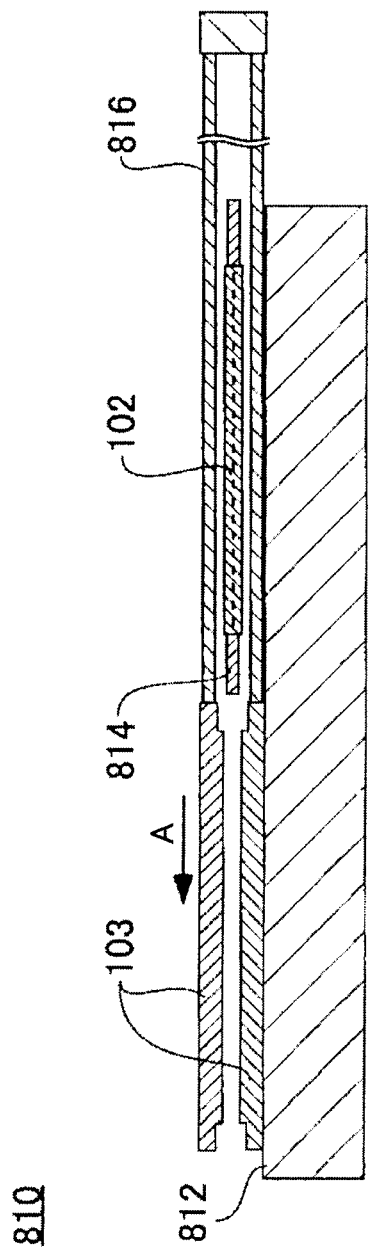
FIG. 50 shows a separated laminating substrate 102.

FIG. 50 shows a state of the laminated substrate 102 separated by the separating apparatus 810. The common elements to those of FIG. 49 are assigned the same reference numerals, and overlapping explanation may be omitted as follows.

As shown in this drawing, the holder pusher 816 of the separating apparatus 810 pushes the side of the substrate holder 103 horizontally, while keeping the state in which the side clamper 814 holds the laminated substrate 102 by the side surface and fixes it in a certain position. Accordingly, the substrate holder 103 is separated from the laminated substrate 102, and slides on the slide table 812, as shown by the arrow A in this drawing. The laminated substrate 102 can be separated from the pair of substrate holders 103 as explained above.

FIG. 51 is a sectional view schematically showing the structure of a still different separating apparatus 820. This separating apparatus 820 includes a pair of holder supports 822 and a side clamper 824.

The holder supports 822 contain therein a vacuum chuck 826 for holding the substrate holder 103. The holder supports 822 are supported by the spinner 828, and separately rotate around the vertical rotation axis. The side clamper 824 sandwiches, from the side, the laminated substrate 102 that is held between the substrate holders 103, and holds it.

Figure 52:
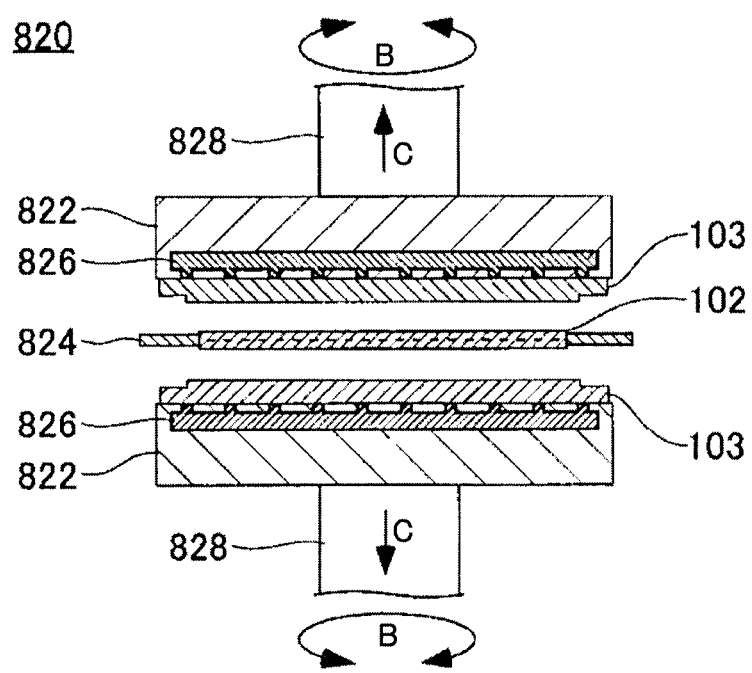
FIG. 52 shows a separated laminating substrate 102.

FIG. 52 shows a state in which the laminated substrate 102 is separated by the separating apparatus 820. The elements common to those of FIG. 51 are assigned the same reference numerals, and overlapping explanation may be omitted as follows.

As shown in this drawing, the side clamper 814 of the separating apparatus 820 holds the laminated substrate 102 by its side, and fixes it to a certain position. Next, while keeping this state, the vacuum chuck 826 is rendered effective, so as to hold the substrate holders 103 by the holder supports 822.

Next, as shown by the arrow B in the drawing, the spinner 828 is used to rotate the holder supports 822, thereby exerting a rotation power to the substrate holders 103. By doing so, the shearing force operates onto between the laminated substrate 102 and the substrate holders 103, to release the laminated substrate 102 from its fixed state to the substrate holders 103.

As further shown by the arrow C of the drawing, the holder supports 822 are operated to be apart from each other, thereby separating the laminated substrate 102 from the substrate holders 103. The laminated substrate 102 is separated from the substrate holder 103 and independently held by the side clamper 824.

Figure 53:
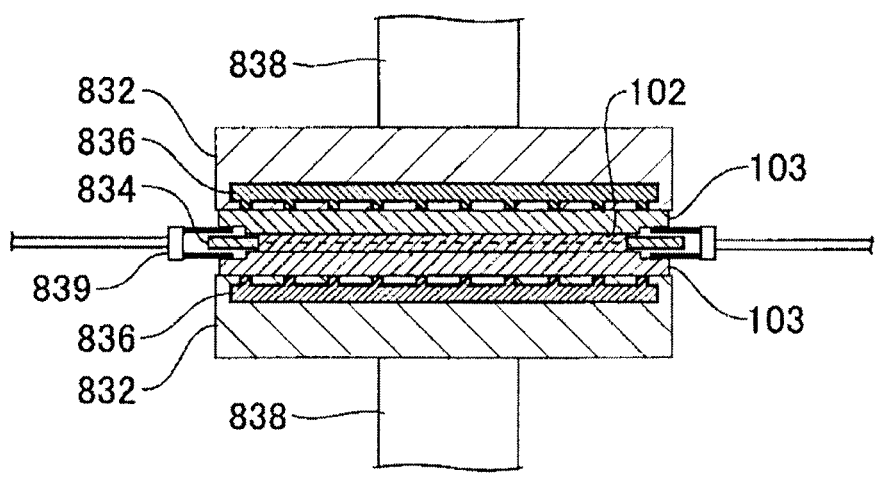
FIG. 53 is a sectional view schematically showing the structure of a separating apparatus 830.

FIG. 53 is a sectional view schematically showing the structure of a still different separating apparatus 830. The separating apparatus 830 includes a holder support 832, a side clamper 834, and a holder separator 839.

The holder support 832 contains therein a vacuum chuck 836 for suctioning and holding the substrate holder 103. The holder supports 832 are supported by the lifter 838, and are capable of approaching and distancing with respect to each other in the vertical direction. The side clamper 834 sandwiches, from the sides, the laminated substrate 102 held between the substrate holders 103, and holds it.

An edge of the holder separator 839 is inserted between the pair of substrate holders 103. The edge of the holder separator 839 is partially biforked. This portion of the edge is abutted against both of the substrate holders 103.

Figure 54:
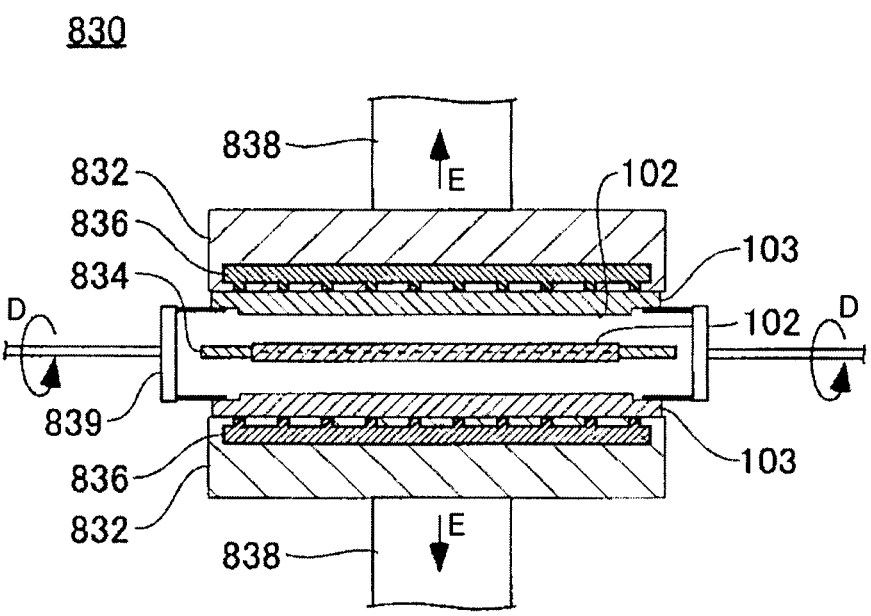
FIG. 54 shows a separated laminating substrate 102.

FIG. 54 shows the laminated substrate 102 separated by the separating apparatus 830. The elements common to those of FIG. 53 are assigned the same reference numerals, and overlapping explanation is not done as follows.

As shown in this drawing, the side clamper 834 of the separating apparatus 830 holds the laminated substrate 102 by the side and fixes it to a certain position as the first step. Next, while keeping this condition, the vacuum chuck 836 is made effective, to hold the substrate holders 103 by means of the holder support 822.

Subsequently, as shown by the arrow D, the holder separator 839 is made to rotate around the horizontal rotation axis, and pushes apart the pair of substrate holders 103 from each other using its biforked edge. Furthermore, as shown in the arrow E, the lifter 838 is operated, to move the holder support 832 in an attempt to distance the pair of substrate holders 103 from each other. By doing so, the laminated substrate 102 can be separated from the substrate holders 103 and held by the side clamper 824 independently.

Figure 55:
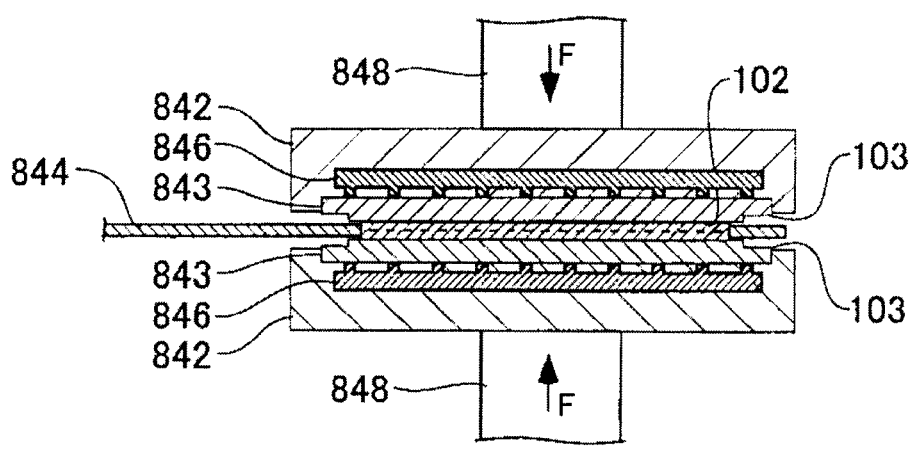
FIG. 55 is a sectional view schematically showing the structure of a separating apparatus 840.

FIG. 55 is a sectional view schematically showing a still another separating apparatus 840. The separating apparatus 840 includes a holder support 842 and an extractor 844.

The holder support 842 accommodates therein a vacuum chuck 846 for suctioning and holding the substrate holders 103. The holder supports 842 are supported by the lifter 848, and are operable of approaching and distancing with respect to each other in the vertical direction.

Each of the holder supports 842 is equipped with a side dam 843 created by recessing a part of the surface to which the substrate holder 103 is held. In this way, when the lifter 848 brings the holder supports 842 to approach each other to hold the substrate holders 103 therebetween as shown by the arrow F, the side surface of the substrate holders 103 is abut against the side wall of the side dam 843.

The extractor 844 sandwiches the sides of the laminated substrate 102 held between the substrate holders 103 and holds the laminated substrate 102. The extractor 844 can move in the horizontal direction while holding the laminated substrate 102.

FIG. 56 shows the laminated substrate 102 separated by the separating apparatus 840. The elements common to those of FIG. 55 are assigned the same reference numerals, and overlapping explanation may be omitted in the following.

In this separating apparatus 840, while the vacuum chuck 846 is used to suction the substrate holder 103 to the holder supports 842, the extractor 844 is used to extract the laminated substrate 102 in the lateral direction, as shown in the arrow G of the drawing. During this process, each of the substrate holders 103 cannot move, restricted by the side dam 843. Accordingly, the extractor 844 can hold the laminated substrate 102 separated from the substrate holders 103, independently.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

The invention claimed is:

1. A method comprising:
    moving a laminated substrate relative to a first holder to separate the laminated substrate from the first holder;
    detecting a stress exerted on the laminated substrate; and
    stopping the moving when the stress exceeds a set value;
    wherein the moving includes holding the laminated substrate with a holding section, the holding including suctioning, using a suction section of the holding section, the laminated substrate to the holding section.

2. The method according to claim 1, wherein the moving includes abutting the one of the first holder and the laminated substrate with a lift member.

3. The method according to claim 2, wherein the moving includes lifting the first holder with the lift member.

4. The method according to claim 3, wherein the lifting includes moving the lift member in a single direction to separate the laminated substrate from the first holder and the holding section.

5. The method according to claim 3, wherein the lifting includes rotating the first holder relative to the holding section.

6. The method according to claim 3, wherein the lifting includes rotating the lift member.

7. The method according to claim 2, wherein the moving includes lifting the laminated substrate with the lift member.

8. The method according to claim 2, wherein the holding includes abutting the laminated substrate with the lift member.

9. The method according to claim 1, wherein the suctioning uses an electrostatic suction force.

10. The method according to claim 1, wherein the suctioning uses a vacuum suction force.

11. The method according to claim 1, wherein the holding includes clamping the laminated substrate at a side surface of the laminated substrate with the holding section.

12. The method according to claim 1, wherein the moving includes supplying a pressurized operating fluid between the laminated substrate and the first holder to separate the laminated substrate from the first holder.

13. The method according to claim 12, wherein the supplying includes supplying at least one of a dry air, a nitrogen gas, and an argon gas.

14. The method according to claim 1, further comprising manufacturing a semiconductor device using the laminated substrate.

15. The method according to claim 1, wherein the holding includes holding the holding section with a stage.

16. The method according to claim 1, further comprising moving the laminated substrate relative to the holding section while the laminated substrate is held by the first holder.

17. A method comprising:
    moving a laminated substrate relative to a first holder to separate the laminated substrate from the first holder;
    wherein the moving includes holding the laminated substrate with a holding section and abutting the one of the first holder and the laminated substrate with a lift member; and
    wherein the abutting includes passing the lift member through one of the first holder and the holding section.

18. A method comprising:
    moving a laminated substrate relative to a first holder to separate the laminated substrate from the first holder;
    wherein the moving includes holding the laminated substrate with a holding section;
    wherein the holding includes clamping the laminated substrate at a side surface of the laminated substrate with the holding section; and
    wherein the moving separates the laminated substrate from the first holder and a second holder simultaneously.

19. An apparatus comprising:
    a separating section operable to move a laminated substrate relative to a first holder to separate the laminated substrate from the first holder; and
    a holding section operable to hold the laminated substrate during separation of the laminated substrate from the first holder; the holding section including a substrate holding section operable to hold the laminated substrate in contact with the holding section, and the substrate holding section including a suction section operable to suction the laminated substrate to the holding section;
    a stress detecting section operable to detect a stress exerted on the laminated substrate; and
    a controller operable to stop the separating section from moving when the stress detected by the stress detecting section exceeds a set value.

20. The apparatus according to claim 19, wherein the suctioning section uses an electrostatic suction force.

21. The apparatus according to claim 19, wherein the suctioning section uses a vacuum suction force.

22. The apparatus according to claim 21, wherein the suctioning section includes a vacuum chuck that suctions the laminated substrate using a negative pressure.

23. The apparatus according to claim 19, wherein the separating section includes a lift member operable to abut against one of the laminated substrate and the first holder.

24. The apparatus according to claim 19, wherein the first holder includes a flow path operable to supply a pressurized operating fluid between the laminated substrate and the first holder, to separate the laminated substrate from the first holder.

25. The apparatus according to claim 24, wherein the operating fluid includes at least one of a dry air, a nitrogen gas, and an argon gas.

26. The apparatus according to claim 19, further comprising a load lock apparatus coupled with the separating section.

27. The apparatus according to claim 19, further comprising a substrate bonding apparatus coupled with the separating section.

28. The apparatus according to claim 19, wherein the holding section includes a second holder.

29. The apparatus according to claim 19, wherein the holding section includes a clamp operable to clamp the laminated substrate at a side surface of the laminated substrate.

30. The apparatus according to claim 19, wherein the separating section is operable to rotate the laminated substrate relative to the first holder to separate the laminated substrate from the first holder.

31. The apparatus according to claim 19, wherein the separating section includes a holder separator operable to rotate to separate the laminated substrate from the first holder.

32. An apparatus comprising:
a separating section operable to move a laminated substrate relative to a first holder to separate the laminated substrate from the first holder; and
a holding section operable to hold the laminated substrate during separation of the laminated substrate from the first holder;
wherein the separating section includes a lift member operable to abut against one of the laminated substrate and the first holder; and
wherein the lift member is operable to pass through one of the holding section and the first holder.

33. A method comprising:
moving a laminated substrate relative to a first holder to separate the laminated substrate from the first holder;
wherein the moving includes holding the laminated substrate with a holding section;
wherein the holding includes clamping the laminated substrate at a side surface of the laminated substrate with the holding section; and
wherein the moving includes pushing one of the first holder and the laminated substrate in a direction parallel to a contact surface between the first holder and the laminated substrate.

34. An apparatus comprising:
a separating section operable to move a laminated substrate relative to a first holder to separate the laminated substrate from the first holder; and
a holding section operable to hold the laminated substrate during separation of the laminated substrate from the first holder;
wherein the holding section includes a clamp operable to clamp the laminated substrate at a side surface of the laminated substrate; and
wherein the separating section includes a holder pusher operable to push one of the first holder and the laminated substrate in a direction parallel to a contact surface between the first holder and the laminated substrate.

35. An apparatus comprising:
a separating section operable to move a laminated substrate relative to a first holder to separate the laminated substrate from the first holder; and
a holding section operable to hold the laminated substrate during separation of the laminated substrate from the first holder;
wherein the separating section includes a lift member operable to abut against one of the laminated substrate and the first holder; and
wherein the lift member includes a plate operable to extend between the first holder and the holding section when the lift member is rotated.

36. An apparatus comprising:
a separating section operable to move a laminated substrate relative to a first holder to separate the laminated substrate from the first holder; and
a holding section operable to hold the laminated substrate during separation of the laminated substrate from the first holder;
wherein the separating section includes a lift member operable to abut against one of the laminated substrate and the first holder; and
wherein the lift member includes a substrate supporting section operable to separate the laminated substrate from a second holder after the laminated substrate is separated from the first holder, wherein the laminated substrate is separated from the first holder and the second holder by moving the lift member in a single direction.

37. A computer-readable medium having computer-readable instructions stored thereon which, when executed by at least one processor, cause the at least one processor to perform operations comprising:
moving a laminated substrate relative to a first holder to separate the laminated substrate from the first holder;
detecting a stress exerted on the laminated substrate; and
stopping the moving when the stress exceeds a set value;
wherein the moving includes holding the laminated substrate with a holding section, the holding including suctioning, using a suction section of the holding section, the laminated substrate to the holding section.

* * * * *